US012349376B1

(12) United States Patent
Takishita et al.

(10) Patent No.: US 12,349,376 B1
(45) Date of Patent: Jul. 1, 2025

(54) SEMICONDUCTOR DEVICE AND MANUFACTURING METHOD OF SEMICONDUCTOR DEVICE

(71) Applicant: FUJI ELECTRIC CO., LTD., Kanagawa (JP)

(72) Inventors: Hiroshi Takishita, Matsumoto (JP); Takashi Yoshimura, Matsumoto (JP); Misaki Meguro, Matsumoto (JP); Michio Nemoto, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 18/599,205

(22) Filed: Mar. 8, 2024

Related U.S. Application Data

(63) Continuation of application No. 17/235,954, filed on Apr. 21, 2021, now Pat. No. 11,935,945, which is a (Continued)

(30) Foreign Application Priority Data

May 16, 2019 (JP) .................................. 2019-093148

(51) Int. Cl.
*H10D 12/00* (2025.01)
*H01L 21/265* (2006.01)
(Continued)

(52) U.S. Cl.
CPC ..... *H10D 12/481* (2025.01); *H01L 21/26513* (2013.01); *H10D 62/106* (2025.01); *H10D 62/60* (2025.01)

(58) Field of Classification Search
CPC ........... H01L 21/26513; H01L 29/7397; H01L 29/0619; H01L 29/36; H10D 12/481; H10D 62/60; H10D 62/106
(Continued)

(56) References Cited

U.S. PATENT DOCUMENTS 6,507,058 B1 *   1/2003  Hall ............... H01L 29/66575
                                                        257/E21.147
11,935,945 B2 *  3/2024  Takishita ............. H01L 27/06
                        (Continued)

FOREIGN PATENT DOCUMENTS

CN      104321871 A    1/2015
JP     2005064429 A    3/2005
                (Continued)

OTHER PUBLICATIONS

International Search Report and (ISA/237) Written Opinion of the International Search Authority for International Patent Application No. PCT/JP2020/019546, mailed by the Japan Patent Office on Jul. 21, 2020.
(Continued)

*Primary Examiner* — Igwe U Anya

(57) ABSTRACT

Provided is a semiconductor device including a semiconductor substrate having an upper surface, a lower surface, and a center position equidistant from the upper surface and the lower surface in a depth direction of the semiconductor substrate. One or more N-type regions with an N-type conductivity are provided in the semiconductor substrate such that at least one N-type region among the one or more N-type regions includes the center position of the semiconductor substrate. An entire portion of the semiconductor substrate includes a bulk-acceptor having a bulk-acceptor concentration. A carrier concentration in all of the one or more N-type regions is higher than the bulk-acceptor concentration.

29 Claims, 39 Drawing Sheets

Related U.S. Application Data continuation of application No. PCT/JP2020/019546, filed on May 15, 2020.

(51) Int. Cl.
  *H10D 62/10* (2025.01)
  *H10D 62/60* (2025.01)

(58) Field of Classification Search
  USPC .......................................................... 257/140
  See application file for complete search history.

(56) References Cited

U.S. PATENT DOCUMENTS

| | | | |
|---|---|---|---|
| 2003/0111605 | A1 | 6/2003 | Sato |
| 2005/0253201 | A1* | 11/2005 | Inoue ................. H01L 29/7816 257/E21.375 |
| 2007/0290237 | A1 | 12/2007 | Nakagawa |
| 2008/0079108 | A1 | 4/2008 | Hsu |
| 2009/0203166 | A1* | 8/2009 | Kennedy ............... H01L 21/425 438/104 |
| 2011/0204438 | A1 | 8/2011 | Taniguchi |
| 2012/0228704 | A1* | 9/2012 | Ju ..................... H01L 29/66689 257/E29.256 |
| 2013/0249058 | A1 | 9/2013 | Neidhart |
| 2014/0217407 | A1 | 8/2014 | Mizushima |
| 2014/0284623 | A1 | 9/2014 | Ota |
| 2015/0048450 | A1 | 2/2015 | Naito |
| 2015/0050754 | A1 | 2/2015 | Ploss |
| 2015/0179441 | A1* | 6/2015 | Onozawa ............... H10D 62/53 257/109 |
| 2015/0214347 | A1 | 7/2015 | Falck |
| 2015/0270132 | A1 | 9/2015 | Laven |
| 2015/0311279 | A1 | 10/2015 | Onozawa |
| 2016/0141399 | A1 | 5/2016 | Jelinek |
| 2017/0018637 | A1 | 1/2017 | Kitamura |
| 2017/0062568 | A1 | 3/2017 | Caspary |
| 2017/0373141 | A1 | 12/2017 | Yoshida |
| 2018/0002826 | A1 | 1/2018 | Freund |
| 2018/0005831 | A1 | 1/2018 | Schulze |
| 2018/0122895 | A1 | 5/2018 | Jelinek |
| 2018/0261700 | A1 | 9/2018 | Tanaka |
| 2019/0252504 | A1 | 8/2019 | Eto |
| 2020/0359215 | A1* | 11/2020 | Akpinar ............. G01C 21/3438 |

FOREIGN PATENT DOCUMENTS

| | | |
|---|---|---|
| JP | 2006313773 A | 11/2006 |
| JP | 2007266233 A | 10/2007 |
| JP | 2012023327 A | 2/2012 |
| JP | 2017011000 A | 1/2017 |
| JP | 2017028250 A | 2/2017 |
| WO | 2013073623 A1 | 5/2013 |
| WO | 2014208404 A1 | 12/2014 |

OTHER PUBLICATIONS

Office Action issued for counterpart Japanese Application No. 2021-519510, issued by the Japan Patent Office on Jun. 14, 2022 (drafted on Jun. 7, 2022).

Canosis Co., Ltd., Silicon Wafer Standards Table, Internet, Search Date Jun. 3, 2022, Japan, p. 1,URL https://www.canosis.co.jp/pdf/si-wafer_std_SEMIvsJEITA. pdf.

Those references were submitted as IDS or found by the examiner over the earlier U.S. Appl. No. 17/235,954, filed Apr. 21, 2021.

Office Action issued for related Chinese Application 202080005857.6, issued by The State Intellectual Property Office of People's Republic of China on Jul. 2, 2024.

* cited by examiner

SEMICONDUCTOR DEVICE AND MANUFACTURING METHOD OF SEMICONDUCTOR DEVICE

CROSS-REFERENCE TO RELATED APPLICATIONS

This application is a continuation of U.S. patent application Ser. No. 17/235,954, filed on Apr. 21, 2021, the entire contents of which are explicitly incorporated herein by reference. The application also claims priority from the following Japanese patent applications, which are explicitly incorporated herein by reference:
No. 2019-093148 filed in JP on May 16, 2019, and
PCT/JP2020/019546 filed in WO on May 15, 2020.

BACKGROUND

1. Technical Field

The present invention relates to a semiconductor device and a manufacturing method of the semiconductor device.

2. Related Art

Conventionally, a semiconductor device such as an IGBT (insulated gate bipolar transistor) has been known (for example, refer to Patent Document 1). A semiconductor device has been known in which a P-type acceptor with a lower concentration than the original doping concentration of an N-type semiconductor substrate is diffusively introduced into a part of the N-type semiconductor substrate with a uniform doping concentration distribution, so that the resistivity of the surface side of the N-type semiconductor substrate is higher than that of the inside (for example, refer to Patent Document 2).
Patent Document 1: Japanese Patent Application Publication No. 2007-266233
Patent Document 2: Japanese Patent Application Publication No. 2005-064429

3. Technical Problem

It is preferable that a semiconductor device can be provided at a low cost.

GENERAL DISCLOSURE

In order to solve the above problem, a first aspect of the present invention provides a semiconductor device including a semiconductor substrate provided with an N-type region. The N-type region may be a region including a center position in a depth direction of the semiconductor substrate. The N-type region may include an acceptor with a concentration of 0.001 times or more, but less than 0.9 times of the carrier concentration at the center position.

The N-type region may include an acceptor with a concentration of less than 0.1 times of the carrier concentration at the center position.

The N-type region may include an acceptor with a concentration of from $1.0 \times 10^{11}/cm^3$ to $1.0 \times 10^{15}/cm^3$ at the center position.

The semiconductor substrate may include an acceptor with a concentration of 0.001 times or more, but less than 0.9 times of the carrier concentration in the entire N-type region.

The N-type region may have a length of 40% or more of the thickness of the semiconductor substrate in the depth direction.

The semiconductor substrate may have an active region in which at least one of a transistor portion and a diode portion is formed. The semiconductor substrate may have an edge termination structure portion provided to enclose the active region in a top view of the semiconductor substrate, with a plurality of P-type guard rings formed therein.

Between two of the guard rings, an N-type region including an acceptor with a concentration of 0.001 times or more, but less than 0.9 times of the carrier concentration may be provided.

The semiconductor substrate may have a trench portion provided on an upper surface and a P-type region in contact with a lower end of the trench portion.

The N-type region may be provided in the range that is not in contact with a side wall of the semiconductor substrate. In the N-type region, the ratio $\kappa$ of the actual bulk-acceptor concentration $N_{Are}$ to the specification value $N_{A0}$ of the bulk-acceptor concentration is $\kappa = N_{Are}/N_{A0}$, and the ratio $\theta$ of the actual donor concentration $N_{Fre}$ to the target value $N_{F0}$ of the final donor concentration is $\theta = N_{Fre}/N_{F0}$, where the upper limit value of $\theta$ is $\theta_+$, and the lower limit value of $\theta_-$, where $\theta_+$ is 1.15 and $\theta_-$ is 0.85, and the ratio $\kappa$ and the upper limit value $\theta_+$ and the lower limit value $\theta_-$ of $\theta$ satisfy the following expression.

$$(1-\theta_+)/\alpha'+1 \leq \kappa \leq (1-\theta_-)/\alpha'+1$$

However, $\alpha' = N_{A0}/N_{F0}$, $N_{F0}$ may be a target value of the donor concentration of the N-type region.

A second aspect of the present invention provides a manufacturing method of a semiconductor device, including a preparation step configured to prepare a P-type semiconductor substrate. The manufacturing method may include a first inverting step configured to form an N-type region including a center position in a depth direction of a semiconductor substrate by implanting a donor into the P-type semiconductor substrate and heat treatment.

The manufacturing method may include a thinning step configured to thin a P-type substrate for forming the P-type semiconductor substrate.

In the first inverting step, a hydrogen ion may be implanted into two depth positions, one on an upper surface side and another on a lower surface side of the P-type semiconductor substrate, and may be heat treated.

In the first inverting step, a donor may be implanted into a well region of the upper surface side of the P-type semiconductor substrate, a hydrogen ion may be implanted into the well region from the lower surface of the P-type semiconductor substrate, and may be heat treated.

In the first inverting step, sulfur or selenium may be implanted into the upper surface side of the P-type semiconductor substrate, and may be heat treated.

The manufacturing method may include a second inverting step configured to implant an acceptor into the N-type region and to form a P-type region.

The summary clause does not necessarily describe all necessary features of the embodiments of the present invention. Also, the present invention may also be a sub-combination of the features described above.

DESCRIPTION OF EXEMPLARY EMBODIMENTS

Figure 1:
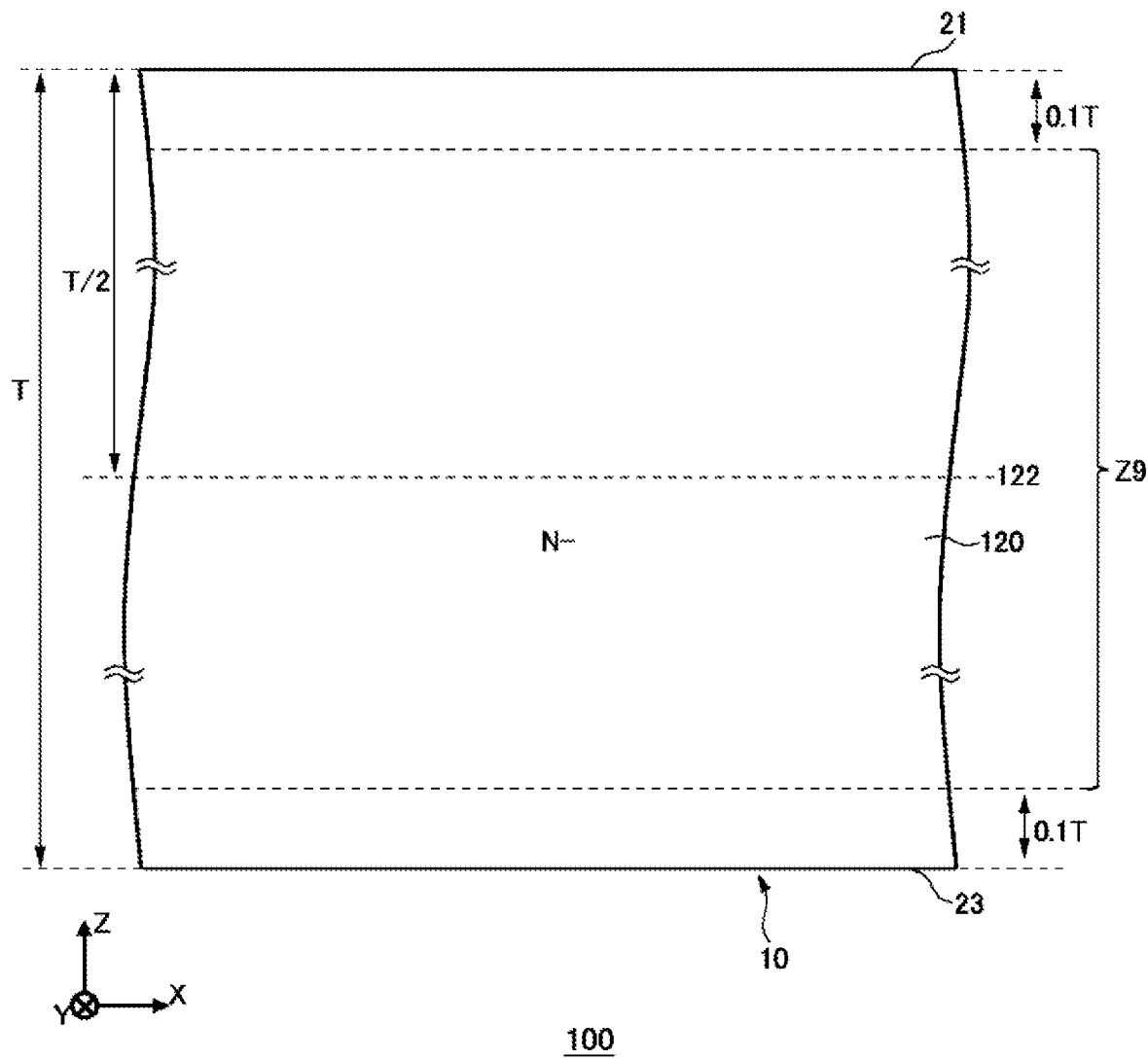
FIG. 1 illustrates a cross sectional view showing one example of a semiconductor device 100.

Hereinafter, the present invention will be described through embodiments of the invention. However, the following embodiments do not limit the invention defined in the claims. Also, all combinations of features described in the embodiments are not necessarily essential to solutions of the invention.

In the present specification, one side in a direction parallel to a depth direction of a semiconductor substrate is referred to as "upper", and the other side is referred to as "lower". One surface of two principal surfaces of a substrate, a layer or other member is referred to as an upper surface, and the other surface is referred to as a lower surface. The "upper" and "lower" directions are not limited to a direction of gravity, or a direction in which the semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not intended to be limited to indicate a height direction with respect to the ground. Note that a +Z axis direction and a −Z axis direction are directions opposite to each other. In a case where the Z axis direction is described without a description of positive and negative signs, the direction means a direction parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

In the present specification, a case where a term such as "same" or "equal" is mentioned may include a case where an error due to a variation in manufacturing or the like is included. The error is, for example, within 10%.

In the present specification, a conductivity-type of doping region where doping has been carried out with an impurity is described as a P-type or an N type. In the present specification, the impurity may particularly mean either a donor of the N-type or an acceptor of the P type, and may be described as a dopant. In the present specification, doping means introducing the donor or the acceptor into the semiconductor substrate and turning it into a semiconductor presenting a conductivity-type of the N type, or a semiconductor presenting a conductivity-type of the P type.

In the present specification, a doping concentration means a concentration of the donor or a concentration of the acceptor in a thermal equilibrium state. In the present specification, a net-doping concentration means a net concentration obtained by adding the donor concentration set as a positive ion concentration to the acceptor concentration set as a negative ion concentration, taking into account of polarities of charges. As one example, when the donor concentration is $N_D$, and the acceptor concentration is $N_A$, the net doping concentration at an arbitrary position becomes $N_D-N_A$.

The donor has a function of supplying electrons to the semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons.

In the present specification, a description of a P+ type or an N+ type means a higher doping concentration than that of the P-type or the N type, and a description of a P− type or an N− type means a lower doping concentration than that of the P-type or the N type. Further, in the present specification, a description of a P++ type or an N++ type means a higher doping concentration than that of the P+ type or the N+ type.

A chemical concentration in the present specification indicates an atomic density of an impurity measured regardless of an electrical activation state. The chemical concentration can be measured by, for example, secondary ion mass spectrometry (SIMS). The above-mentioned net-doping concentration can be measured by a voltage-capacity measurement method (CV method). Further, a carrier concentration measured by a spreading resistance profiling method (SRP method) may be set as the net-doping concentration. The carrier concentration measured by the CV method or the SRP method may be set as a value in a thermal equilibrium state. In addition, in the N-type region, since the donor concentration is sufficiently greater than the acceptor concentration, the carrier concentration in the region may be used as the donor concentration. Similarly, in the P-type region, the carrier concentration in the region may be used as the acceptor concentration.

Further, when a concentration distribution of the donor, acceptor or net doping has a peak in a region, a value of the peak may be set as the concentration of the donor, acceptor or net doping in the region. In a case where the concentration of the donor, acceptor or net doping is approximately uniform in a region, or the like, an average value of the concentration of the donor, acceptor or net doping in the region may be set as the concentration of the donor, acceptor or net doping.

The carrier concentration measured by the SRP method may be lower than the concentration of the donor or the acceptor. In a range where the current flows when measuring a spreading resistance, there may be a case where the carrier mobility of the semiconductor substrate is lower than the value of the crystalline state. The decrease in carrier mobility occurs by disorder of the crystalline structure caused by a lattice defect or the like to make the carrier scatter.

The concentration of the donor or the acceptor calculated from the carrier concentration measured by the CV method or the SRP method may be lower than a chemical concentration of an element indicating the donor or the acceptor. As an example, in a silicon semiconductor, a donor concentration of phosphorus or arsenic serving as a donor, or an acceptor concentration of boron (boron) serving as an acceptor is approximately 99% of chemical concentrations of these. On the other hand, the donor concentration of hydrogen as a donor in the silicon semiconductor is approximately 0.1% to 10% of the chemical concentration of hydrogen. In the present specification, a unit system is the SI base unit system unless otherwise noted. Although length units may be expressed in cm, μm and so on, various calculations may be performed after converting to meters (m).

FIG. 1 illustrates a cross sectional view showing one example of a semiconductor device 100. The semiconductor device 100 includes a semiconductor substrate 10. The semiconductor substrate 10 is a substrate formed of a semiconductor material. As one example, the semiconductor substrate 10 is a silicon substrate. The semiconductor substrate 10 has an upper surface 21 and a lower surface 23. Although an electrode, a dielectric film and so on are formed on the upper surface 21 and the lower surface 23, they are omitted in FIG. 1.

In the interior of the semiconductor substrate 10, an N-type region 120 of a conductivity-type of N-type (N− type in FIG. 1) is provided. In the interior of the semiconductor substrate 10, a region where doping has been carried out to become P-type or N-type according to the function of the semiconductor device 100 is provided, but a region other than the N-type region 120 is omitted in FIG. 1. For example, when the semiconductor device 100 is a diode, a P-type anode region and an N-type cathode region are provided in the semiconductor substrate 10. The N-type region 120 may be configured to function as a drift region between the anode region and the cathode region.

The semiconductor substrate 10 is a substrate that has at least a part of the region of a P-type substrate whose conductivity-type is the P-type made as the N type. The P-type substrate may be an entirely P-type substrate. The P-type substrate may be a wafer cut out from a semiconductor ingot, or may be a chip made from a singulated wafer. The semiconductor ingot may be produced by any of the Czochralski method (CZ method), the magnetic field applied Czochralski method (MCZ method), or the float zone method (FZ method). In this example, the wafer is cut out from an ingot produced by the MCZ method.

The semiconductor substrate 10 may be a substrate including the N-type region 120, which has been configured to invert the region that accounts for 40% or more of the volume of the P-type substrate to the N type. The N-type region 120 may be a region that accounts for a half or more of the volume of the P-type substrate, or may be a region that accounts for 80% or more of the volume of the P-type substrate, or may be a region that has the entire P-type substrate inverted to the N type.

The N-type region 120 may include a substantially uniform donor concentration distribution throughout the horizontal direction of the semiconductor substrate 10. The N-type region 120 may be a region that accounts for 40% or more of the thickness of the P-type substrate in a depth direction of the upper surface 21 or the lower surface 23. Further, the N-type region 120 may be a region that accounts for a half or more of the thickness of the P-type substrate, or may be a region that accounts for 80% or more of the thickness of the P-type substrate, or may be a region that has the entire P-type substrate inverted to the N type. A P-type substrate is easier to be obtained at a lower cost than an N-type substrate. For example, a P-type substrate is used more often in an integrated circuit, and the P-type substrate can be prepared at a relatively low cost.

The semiconductor substrate 10 is a substrate where the N-type region 120 is formed by implanting an N-type impurity (donor) into a P-type substrate. Therefore, a P-type impurity (acceptor) existed in the P-type substrate is included in a predetermined concentration in the N-type region 120. In the present specification, the acceptor included in the entire P-type substrate may be referred to as a bulk-acceptor. Also, even when being merely referred to as an acceptor, the acceptor included in a region where an acceptor is not locally implanted is a bulk-acceptor. For example, the bulk-acceptor is an element such as boron and aluminum. The concentration of a bulk-acceptor included in the N-type region 120 may be higher than the concentration of the donor included in the P-type substrate. The magnitude of the resistivity of the N-type region 120 of the semiconductor substrate 10 may be less than the magnitude of the resistivity of the P-type substrate. In other words, the donor concentration of the N-type region 120 of the semiconductor substrate 10 is higher than the bulk-acceptor concentration of the P-type substrate.

The N-type region 120 may be a region including a center position 122 in the depth direction (Z axis direction) of the semiconductor substrate 10. The center position 122 may be a position with a distance of T/2 in the Z axis direction from the upper surface 21 when the thickness of the semiconductor substrate 10 has been set as T. The N-type region 120 in this example includes a P-type acceptor in a concentration lower than the N-type carrier concentration at the center position 122. The P-type acceptor concentration may be 0.001 times or more, but less than 0.9 times of the N-type carrier concentration. The carrier concentration is corresponding to a concentration difference of the donor and acceptor, and can be measured by, for example, the SRP method. In the N-type region 120, the N-type carrier concentration may be the same value as the donor concentration or less. The N-type carrier concentration of the N-type region 120 may be 0.001 times or more, or may be less than or equal to 1 times, or less than 1 times of the donor concentration. The N-type region 120 in this example may include an acceptor in a concentration lower than the donor concentration at the center position 122. The acceptor concentration at the center position 122 may be 0.001 times or more, or may be less than 1 times or less than or equal to 0.9 times of the donor concentration. The concentrations of the acceptor and donor may use the above-mentioned chemical concentration. The chemical concentration can be measured by the above-mentioned SIMS method. When the semiconductor substrate 10 is a silicon substrate, the acceptor is an element of, for example, boron, aluminum or the like.

By forming the semiconductor substrate 10 from the P-type substrate, the bulk-acceptor included in the P-type substrate also remains in the N-type region 120. The bulk-acceptor concentration in the N-type region 120 is lower than the carrier concentration of electrons (electron concentration). For example, the acceptor concentration at the center position 122 becomes 0.001 times or more of the N-type carrier concentration at the center position 122. The acceptor concentration may also be 0.01 times or more of the N-type carrier concentration.

Also, the concentration of the acceptor in the N-type region 120 is lower than the donor concentration. For example, the acceptor concentration at the center position 122 becomes 0.001 times or more of the donor concentration at the center position 122. The acceptor concentration may also be 0.01 times or more of the donor concentration. Since the acceptor concentration at the center position 122 is less than 1 times of the N-type carrier concentration or the donor concentration, the N-type region 120 can be easily formed by inverting a part of the region of the P-type substrate to the N type. At the center position 122, the acceptor concentration may be less than 0.1 times, or may be less than 0.05 times of the carrier concentration.

The N-type region 120 may include the acceptor with a concentration from $1.0 \times 10^{11}/cm^3$ to $1.0 \times 10^{15}/cm^3$ at the center position 122. The acceptor concentration at the center position 122 may also be $1.0 \times 10^{14}/cm^3$ or more.

The concentration of the acceptor included in the semiconductor substrate 10 may have a substantially uniform concentration distribution along the depth direction of the semiconductor substrate 10. In the present specification, a depth region from the depth positioned on the lower surface 23 side only with a distance of 0.1 T from the upper surface 21, to a depth positioned on the upper surface 21 side only with a distance of 0.1 T from the lower surface 23 of the semiconductor substrate 10, is referred to as a region Z9. The thickness of the depth direction of the region Z9 is 0.8 T. The acceptor included in the semiconductor substrate 10 may be distributed continuously in the depth direction at least in the region Z9. If the maximum value of the concentration of the continuously distributed acceptor is 10 times or less than the minimum value, it may be set as substantially uniform, or 3 times or less as substantially uniform, or 2 times or less as substantially uniform, or 1.5 times or less as substantially uniform, or 1.2 times or less as substantially uniform. Further, the minimum value of the donor concentration of the N-type region 120 may be greater than the maximum value of the acceptor concentration, which is distributed in a substantially uniform manner, and may be 10 times or more greater. By making the acceptor concentration substantially uniform in this way, the net-doping concentration of the N-type region 120 can reduce the effect of fluctuations in the depth direction of the acceptor concentration distribution. This enables the reduction of the variation of electrical characteristics such as breakdown voltage of the semiconductor device 100.

Note that the depth of the depth position of the upper surface 21 side from the upper surface 21 of the region Z9 may not be a depth of 0.1 T. For example, it may be a depth of 0.2 T, or may be a depth of 0.05 T from the upper surface 21, or may be in line with the upper surface 21. Similarly, the depth position of the lower surface 23 side of the region Z9 may be a depth of 0.2 T, or may be a depth of 0.05 T from the lower surface 23, or may be in line with the lower surface 23.

For another example, the concentration of the acceptor included in the semiconductor substrate 10 may not have a uniform concentration distribution. In this case, the maximum value of the acceptor concentration continuously distributed in the region Z9 may be 1% or less, or may be 0.1% or less, or may be 0.01% or less of the minimum value of the donor concentration in the N-type region 120. By making the maximum value of the acceptor concentration sufficiently smaller than the donor concentration in the N-type region 120, electrical characteristics such as the breakdown voltage of the semiconductor device 100 are not affected by fluctuations in the acceptor concentration distribution in the depth direction.

In this example, the semiconductor substrate 10 has the above-mentioned acceptor concentration throughout the N-type region 120. For example, at each position of the N-type region 120, the acceptor concentration satisfies the above-mentioned condition with respect to the carrier concentration at the position. The N-type region 120 may refer to the entire N-type region included in the semiconductor substrate 10. In another example, the N-type region 120 may include the center position 122, and may refer to a continuously formed region. That is, the N-type region 120 may refer to an N-type region that is not separated from the center position 122 by the P-type region or the dielectric film.

There may be N-type regions other than the N-type region 120 in the semiconductor substrate 10. That is, in a part of the N-type region in the semiconductor substrate 10, the acceptor concentration may not be 0.001 times or more, but less than 0.9 times of the carrier concentration. As one example, in the N-type region, in a part in contact with the P-type region, the acceptor concentration may not be in the above-mentioned range.

The N-type region 120 may have a length of 40% or more of the thickness T of the semiconductor substrate 10 in the depth direction. The N-type region 120 may have a length of a half or more of the thickness T of the semiconductor substrate 10, or may have a length of 80% or more of the thickness T, or may have a same length as the thickness T in the depth direction.

There is a P-type region in the semiconductor substrate 10. The P-type region may be formed by further implanting an acceptor locally after inverting the entire P-type substrate to an N-type region. In another example, at least a part of the P-type region may be a region with a part of the P-type substrate remained not to be inverted to an N-type region.

Figure 2A:
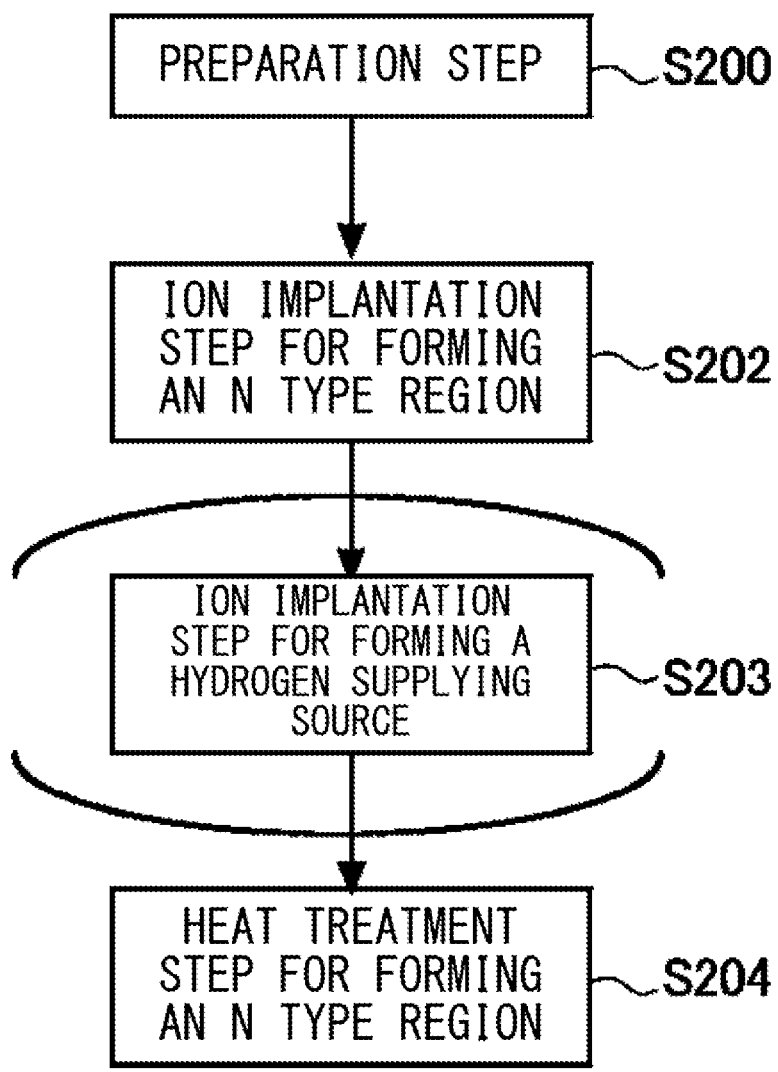
FIG. 2A illustrates a figure describing some steps of a manufacturing method of the semiconductor device 100.

FIG. 2A illustrates a figure describing some steps of a manufacturing method of the semiconductor device 100. In FIG. 2A, a step configured to form an N-type region 120 in the semiconductor substrate 10 is shown. The manufacturing method in this example includes a preparation step S200, an ion implantation step S202 for forming an N-type region, and a heat treatment step S204 for forming the N-type region. As shown in parentheses in FIG. 2A, the ion implantation step S203 for forming the hydrogen supplying source may be provided between the ion implantation step S202 for forming an N-type region and the heat treatment step S204 for forming the N-type region. The ion implantation step S203 for forming the hydrogen supplying source may be a step following the ion implantation step S202 for forming an N-type region.

Figure 2B:
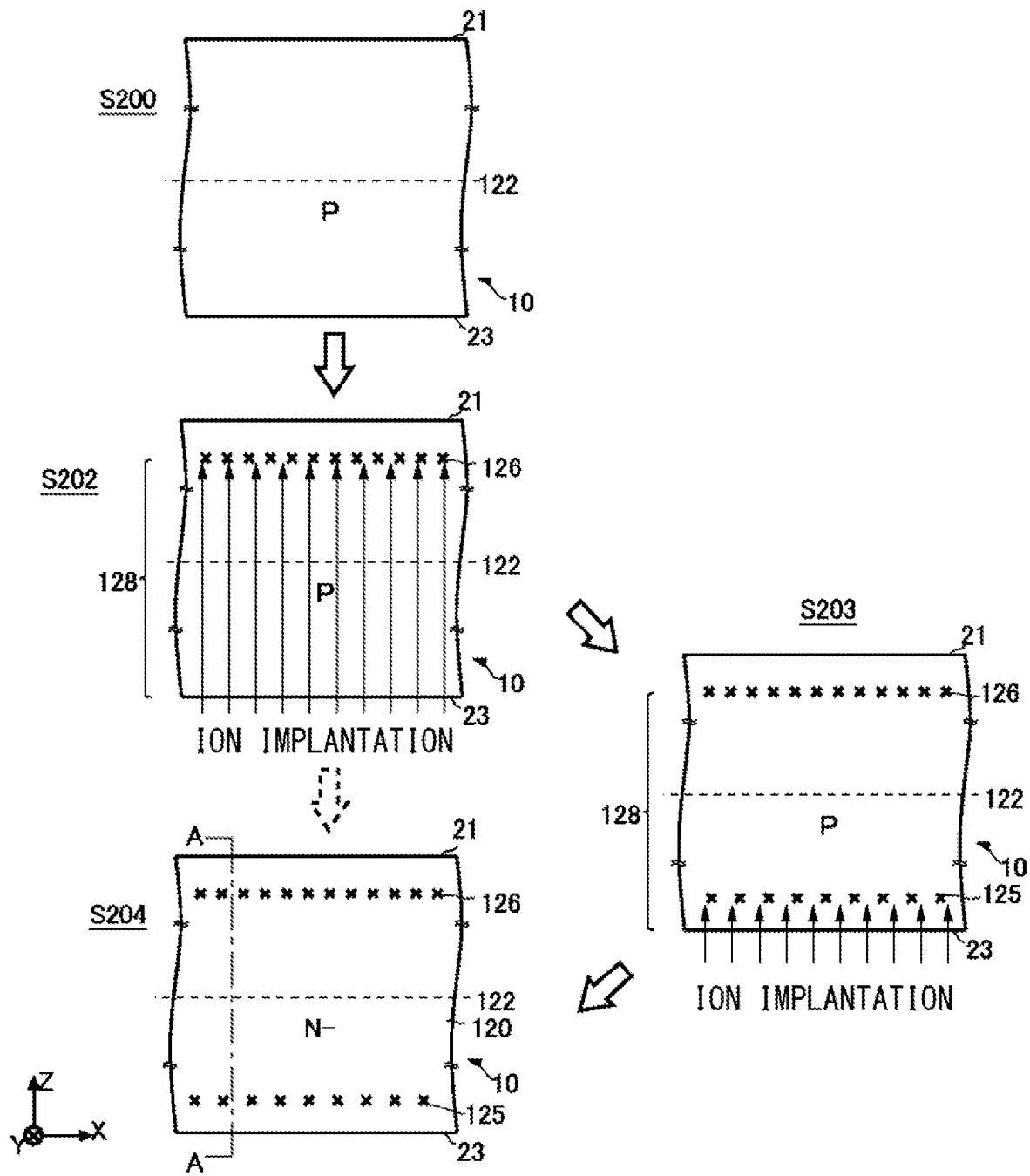
FIG. 2B illustrates a figure describing each step shown in FIG. 2A.

FIG. 2B illustrates a figure describing each step shown in FIG. 2A. First, in the preparation step S200, a P-type semiconductor substrate 10 is prepared. In the preparation step S200, on the upper surface 21 of the semiconductor substrate 10, a part of the device structure of a semiconductor device such as a transistor or a diode may be formed. For example, in the preparation step S200, a P-type diffusion layer, a MOS gate, a metal layer for the main electrode, an edge termination region and so on, which are configured to function as the channel of the transistor, may be formed. Further, the semiconductor substrate 10 may also be thinned by a process such as back grind. The lower surface 23 may be a ground surface of the back grind and so on.

Then in the implantation step S202, a donor is implanted into the P-type semiconductor substrate 10. The donor may be implanted from the lower surface 23 of the semiconductor substrate 10 to the upper surface 21 side of the semiconductor substrate 10. The upper surface 21 side is a region from the center position 122 to the upper surface 21 of the semiconductor substrate 10. The donor is an ion of hydrogen, phosphorus, selenium, antimony, arsenic and so on.

In the implantation step S202, the donor is implanted into an implantation position 126, which is a predetermined distance away from the lower surface 23. In the implantation step S202, the donor may be implanted into a plurality of implantation positions 126 at different positions in the depth direction. In this case, some implantation positions 126 may be arranged on the lower surface 23 side of the semiconductor substrate 10. The lower surface 23 side is a region from the center position 122 to the lower surface 23 of the semiconductor substrate 10. By implanting the donor to the plurality of implantation positions 126, it becomes easier to form an N-type region over a wide region. After the implantation step S202, there may be an implantation step S203 for forming the hydrogen supplying source. In the implantation step S203, a hydrogen ion is implanted into the implantation position 125. The implantation position 125 of the implantation step S203 may be positioned on the lower surface 23 side rather than the implantation position 126. The implantation position 125 may be arranged on the lower surface 23 side of the semiconductor substrate 10. The distance between the implantation position 125 and the implantation position 126 in the Z axis direction may be a half or more of the thickness of the semiconductor substrate 10.

Then, in the heat treatment step S204, heat treatment is performed on the semiconductor substrate 10. As described in FIG. 2A, before the heat treatment step S204, both of the implantation step S202 and the implantation step S203 may be performed, or only the implantation step S202 may be performed. In FIG. 2B, a case where both of the implantation step 202 and the implantation step S203 have been performed is shown as an example. In the heat treatment step S204, heat treatment is performed on the semiconductor substrate 10 by the donor diffused from the implantation position 126 by at least the temperature and the time of inverting the center position 122 to an N-type region. In the heat treatment step S204, hydrogen may be diffused from the implantation position 125. In the heat treatment step S204, heat treatment may be performed on by the temperature and time of inverting the region in contact with the lower surface 23 to an N-type region. In the example of FIG. 2B, the entire semiconductor substrate 10 is inverted to the N-type region 120.

In the implantation step S202, in a pass-through region 128 where the donor ion has passed through, a lattice defect mainly consisting of a vacancy, such as a monatomic vacancy (V), a diatomic vacancy (VV) with a Dangling bond is formed. Although a lattice defect includes an interstitial atom, a dislocation or the like, and in a broad sense can also include a donor or an acceptor, in the present specification, a lattice defect mainly consisting of a vacancy may be referred to as a vacancy-type defect or simply a lattice defect. Also, by the ion implantation into a semiconductor substrate, a number of lattice defects are to be formed, thereby the crystallinity of the semiconductor substrate may be strongly disrupted. In the present specification, the disorder in crystalline may be referred to as disorder. When the donor is a hydrogen ion such as a proton, the hydrogen implanted into the implantation position 126 diffuses to combine hydrogen (H) with the vacancy (V) and oxygen (O) existing in the pass-through region 128, forming a VOH defect. The hydrogen implanted into the implantation position 125 may also diffuse to combine hydrogen (H) with the vacancy (V) and oxygen (O) existing in the pass-through region 128, forming a VOH defect. The diffused hydrogen terminates the dangling bond. The VOH defect functions as a donor that supplies an electron. This allows the donor concentration in the pass-through region 128 to be higher than the bulk-acceptor concentration during manufacturing the semiconductor ingot that is the basis of the semiconductor substrate 10. Therefore, by using hydrogen as a donor, the N-type region 120 can be easily formed. In the present specification, a VOH defect may be simply referred to as a hydrogen donor.

When a hydrogen ion is implanted in the implantation step S202, the hydrogen ion may be implanted into the semiconductor substrate 10 so that the center position 122 is included in the pass-through region 128. Hydrogen becomes easily to diffuse into the region where a vacancy-type defect is formed by the passage of the implanted ions. Therefore, even if a hydrogen ion is implanted at a deep position, the hydrogen diffuses easily in the pass-through region 128. This enables the formation of the N-type region 120 over a wide range with a simple process.

Figure 3A:
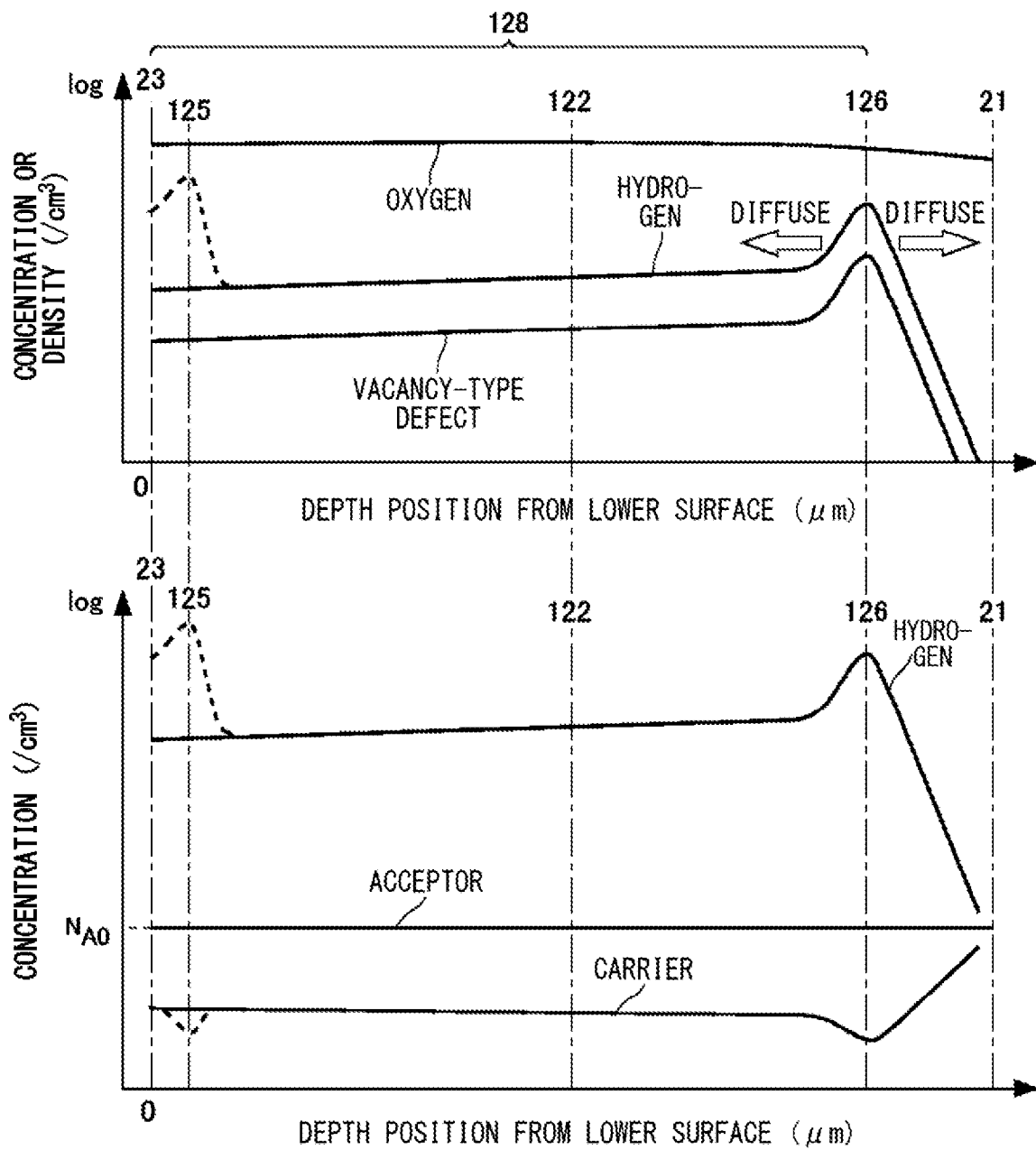
FIG. 3A illustrates one example of hydrogen chemical concentration distribution, oxygen chemical concentration distribution, vacancy-type defect density distribution, carrier concentration distribution and acceptor concentration distribution on a line A-A of FIG. 2B.

FIG. 3A illustrates one example of a hydrogen chemical concentration distribution, an oxygen chemical concentration distribution, a vacancy-type defect density distribution, a carrier concentration distribution and an acceptor concentration distribution on a line A-A of FIG. 2B. FIG. 3A illustrates the respective distributions after the implantation step S202 or S203 and before the heat treatment step S204. The graph of the upper section of FIG. 3A illustrates a hydrogen chemical concentration distribution, an oxygen chemical concentration distribution and a vacancy-type defect density distribution. The vertical axis is the concentration or density on the normal logarithmic scale. The unit is, as one example, /cm³. The horizontal axis is the depth position from the origin at the lower surface 23 toward the upper surface 21. The unit is, as one example, μm.

In this example, proton in a predetermined dose volume is implanted from the lower surface 23 at the implantation position 126. Further, proton in a predetermined dose volume may be implanted from the lower surface 23 at the implantation position 125. Therefore, a peak in the hydrogen chemical concentration distribution is shown at the implantation position 126. As shown by dashed lines in FIG. 3A, a peak in the hydrogen chemical concentration distribution may be shown at the implantation position 125. The hydrogen chemical concentration decreases steeply on the upper surface 21 side above the implantation position 126. Also, since proton is implanted from the lower surface 23, the hydrogen chemical concentration on the lower surface 23 side below the implantation position 126 decreases more slowly than the hydrogen chemical concentration on the upper surface 21 side. Also, the hydrogen chemical concentration on the lower surface 23 side below the implantation position 125 may decrease more slowly than the hydrogen chemical concentration on the upper surface 21 side.

Also, the vacancy-type defect is formed not only in the vicinity of the implantation position 126, but also in the proton pass-through region 128. The vacancy-type defect density may be distributed in a manner similar to the hydrogen chemical concentration. For example, the positions of inflection points such as local maximum, local minimum, and kinks in the respective distributions may be arranged at approximately the same depth position. An approximately identical depth position may have an error smaller than the full width at half maximum of the peak of the hydrogen chemical concentration, for example. The vacancy-type defect density may be higher or lower than the hydrogen chemical concentration.

The oxygen chemical concentration may be distributed in a substantially uniform manner in the depth direction of the semiconductor substrate in the step after the ingot is sliced and polished. In the step S202 shown in FIG. 2B, the oxygen chemical concentration may have a portion that decreases toward the upper surface 21 side as shown in FIG. 3A. This is due to the fact that oxygen diffuses from the upper surface 21 side to the outside of the semiconductor substrate 10 in the process prior to the implantation step S202.

The graph of the lower section in FIG. 3A illustrates an example of a hydrogen chemical concentration distribution, a carrier concentration distribution, and an acceptor concentration distribution. The hydrogen chemical concentration distribution is the same as the distribution in the upper section. The region between the lower surface 23 and the implantation position 126 is a hydrogen ion pass-through region. In most of the pass-through region, the mobility of the carrier is lower than the value in the crystalline state (that is, before hydrogen ion implantation) due to disorder. In the peak region, the mobility of the carrier decreases in the same manner. Therefore, the carrier concentration is low.

Figure 3B:
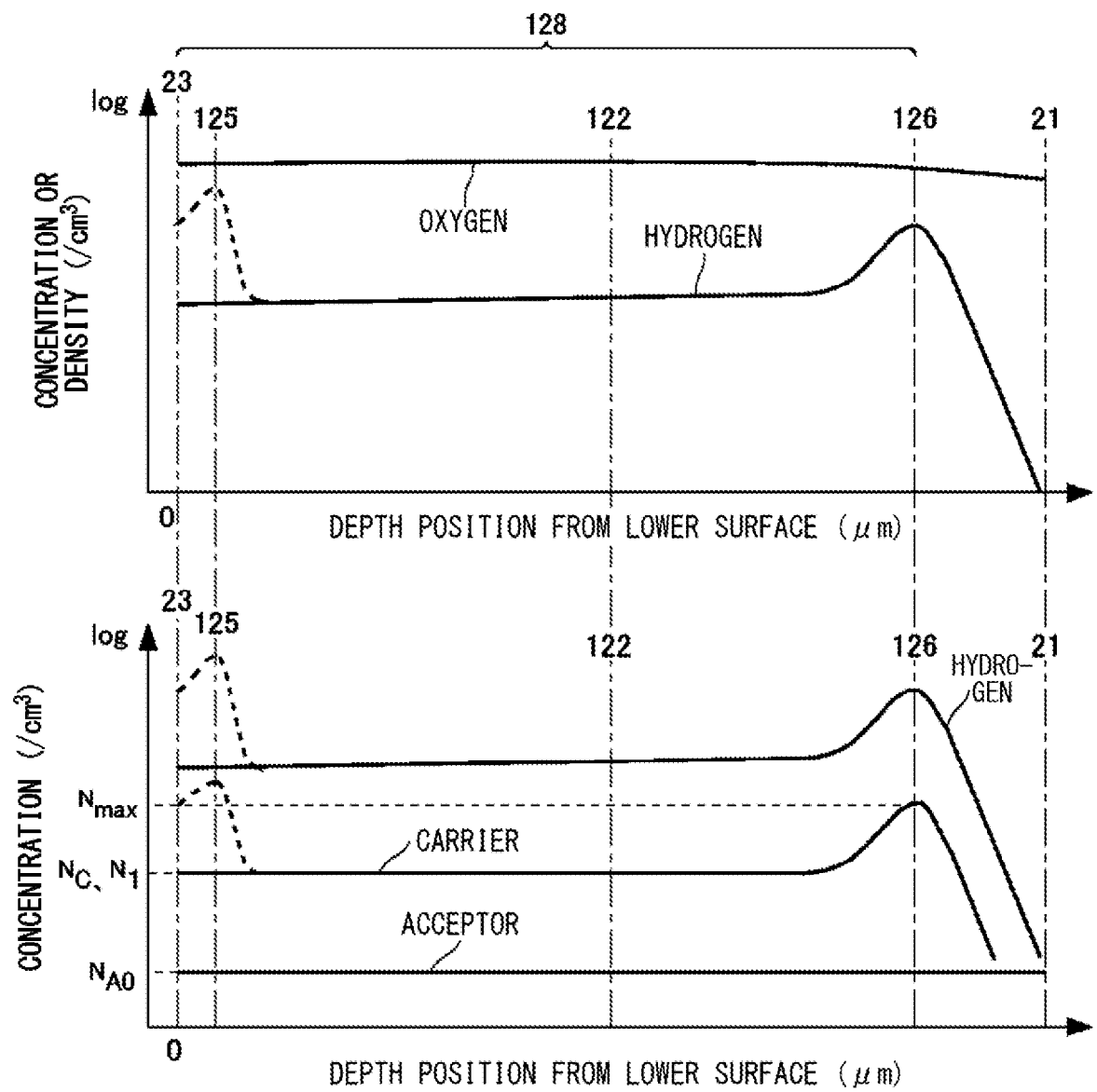
FIG. 3B illustrates an example of hydrogen chemical concentration distribution, oxygen chemical concentration distribution, carrier concentration distribution and acceptor concentration distribution after performing heat treatment in a heat treatment step S204 on a semiconductor substrate 10 shown in FIG. 3A.

FIG. 3B illustrates an example of a hydrogen chemical concentration distribution, an oxygen chemical concentration distribution, a carrier concentration distribution and an acceptor concentration distribution after performing the heat treatment in the heat treatment step S204 on the semiconductor substrate 10 shown in FIG. 3A. The graph of the upper section of FIG. 3B illustrates the hydrogen chemical concentration distribution and the oxygen chemical concentration distribution after performing the heat treatment on the semiconductor substrate 10 in the heat treatment step S204. When the heat treatment is performed on the semiconductor substrate 10, the hydrogen implanted at the implantation position 126 diffuses inside the semiconductor substrate 10. Hydrogen implanted at the implantation position 125 may also diffuse inside the semiconductor substrate 10. The vacancy-type defect shown in FIG. 3A combines with hydrogen and oxygen to become a donor, a hydrogen donor (VOH defect).

The graph of the lower section of FIG. 3B illustrates the hydrogen chemical concentration distribution and the carrier concentration distribution after the heat treatment. The hydrogen chemical concentration distribution is the same as the hydrogen chemical concentration distribution in the upper section in FIG. 3B. Note that the net-doping concentration distribution is approximately the same as the carrier concentration distribution.

If the hydrogen chemical concentration and the oxygen chemical concentration are sufficiently large relative to the vacancy-type defect concentration in the hydrogen ion pass-through region, the distribution of the VOH defect concentration that functions as a donor is considered to be rate-limiting to the vacancy-type defect concentration distribution in S200 before the heat treatment. This may result in a substantially uniform donor concentration in the pass-through region. A vacancy-type defect in the semiconductor substrate 10 combines with hydrogen and oxygen to generate a VOH defect, which increase the donor concentration above the acceptor concentration and allow the formation of the N-type region 120. In this example, the N-type region 120 is formed in the entire depth direction of the semiconductor substrate 10 by the heat treatment step S204.

The semiconductor substrate 10 in this example includes an acceptor in a constant concentration $N_{A0}$. The concentration $N_{A0}$ corresponds to the concentration of a bulk-acceptor included in the semiconductor ingot, for example. Note that the constant may have an error within ±10%. As mentioned above, the acceptor concentration $N_{A0}$ at the center position 122 is 0.001 times or more, but less than 0.9 times of the carrier concentration $N_C$ at the center position 122.

As shown in FIG. 3A, in the N-type region 120, there is a region where the vacancy-type defect concentration distribution is approximately flat and the acceptor concentration distribution is also approximately flat. In the region, the carrier concentration distribution is also approximately flat. In the carrier concentration distribution, a region of constant concentration $N_1$ may be provided over a range of 20% or more of the thickness T, or may be provided over a range of 50% or more of the thickness T of the semiconductor substrate 10. A concentration of $0.9 \times N_1$ or more, but $1.1 \times N_1$ or less, may be used as the constant concentration $N_1$. The concentration $N_1$ may be a concentration $N_c$ at the center position 122.

Note that if the oxygen chemical concentration included in each position of the semiconductor substrate 10 is sufficiently high, the shape of the carrier concentration distribution depends on the shape of the vacancy-type defect density distribution and the shape of the hydrogen chemical concentration distribution after diffusion. For example, the carrier concentration distribution may show a local maximum value $N_{max}$ at the same position as the vacancy-type defect density distribution. That is, the carrier concentration distribution may have a peak at the implantation position 126. When any of the distributions has a peak at the implantation position 126, it may refer to a state where the implantation position 126 is included within a range of the full width at half maximum of the peak of the distribution. Since the hydrogen chemical concentration decreases as being away from the implantation position 126, the carrier concentration distribution on the lower surface 23 side below the implantation position 126 of the N-type region 120 may vary with a gradient. The carrier concentration distribution in the depth direction of the N-type region 120 may vary with a gradient over a range of 20% or more of the thickness T, or may vary with a gradient over a range of 50% or more of the thickness T of the semiconductor substrate 10. As shown by the dashed lines, the carrier concentration distribution may also have a peak at the implantation position 125.

Figure 4A:
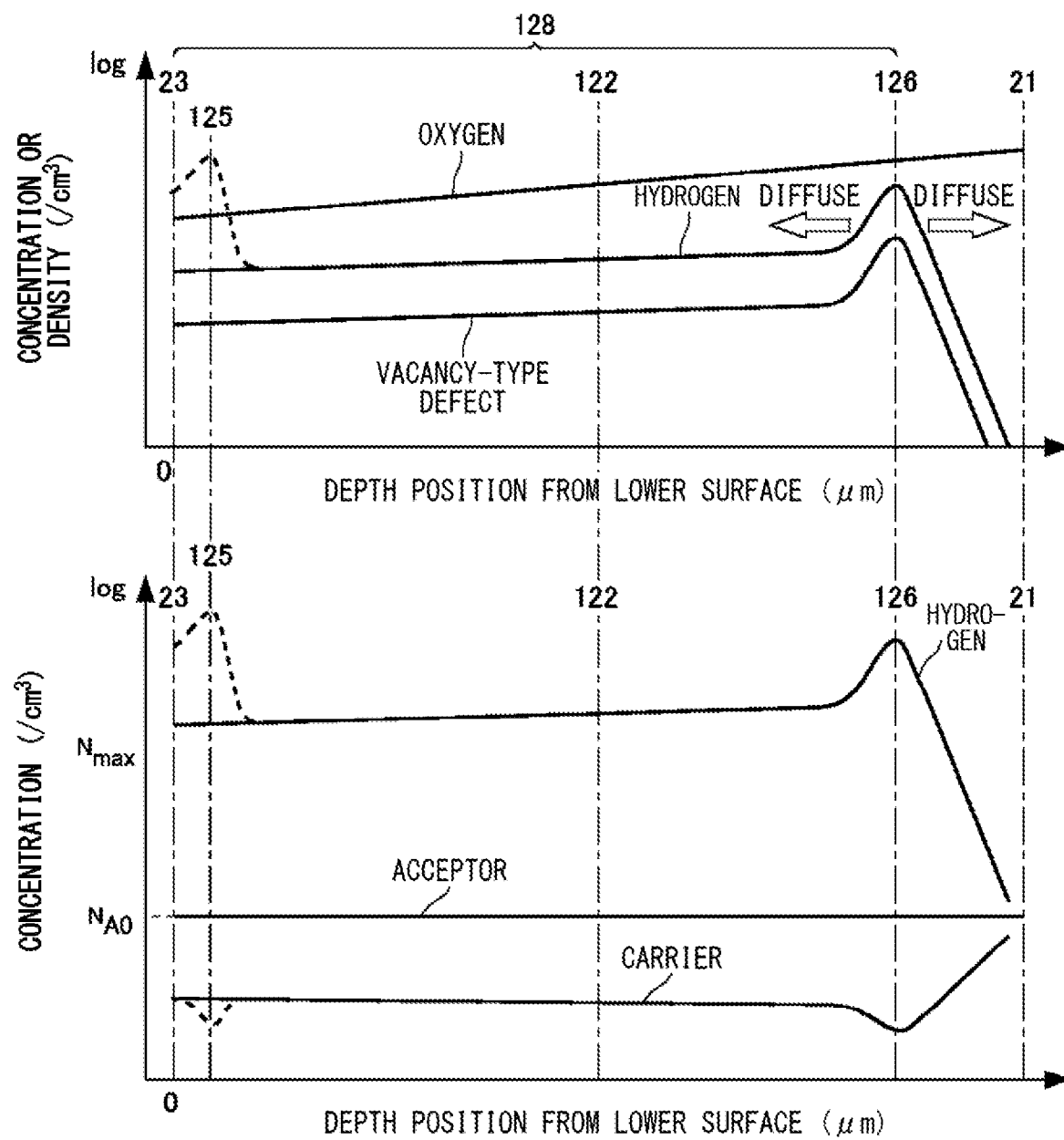
FIG. 4A illustrates another example of hydrogen chemical concentration distribution, oxygen chemical concentration distribution, vacancy-type defect density distribution, carrier concentration distribution and acceptor concentration distribution on the line A-A of FIG. 2B.

FIG. 4A illustrates another example of the hydrogen chemical concentration distribution, the oxygen chemical concentration distribution, the vacancy-type defect density distribution, the carrier concentration distribution, and the acceptor concentration distribution on the line A-A of FIG. 2B. FIG. 4A illustrates the respective distributions after the ion implantation step S202 and before the heat treatment step S204.

FIG. 4A illustrates the upper section and lower section, which are of the same type of distribution as the upper section and lower section in FIG. 3A. In the example of FIG. 4A, the oxygen chemical concentration distribution increases from the lower surface 23 toward the upper surface 21. For example, the oxygen chemical concentration distribution has an approximately constant gradient over the entire range from the lower surface 23 to the upper surface 21. The respective distributions other than the oxygen chemical concentration distribution in FIG. 4A are the same as the respective distributions in FIG. 3A.

Figure 4B:
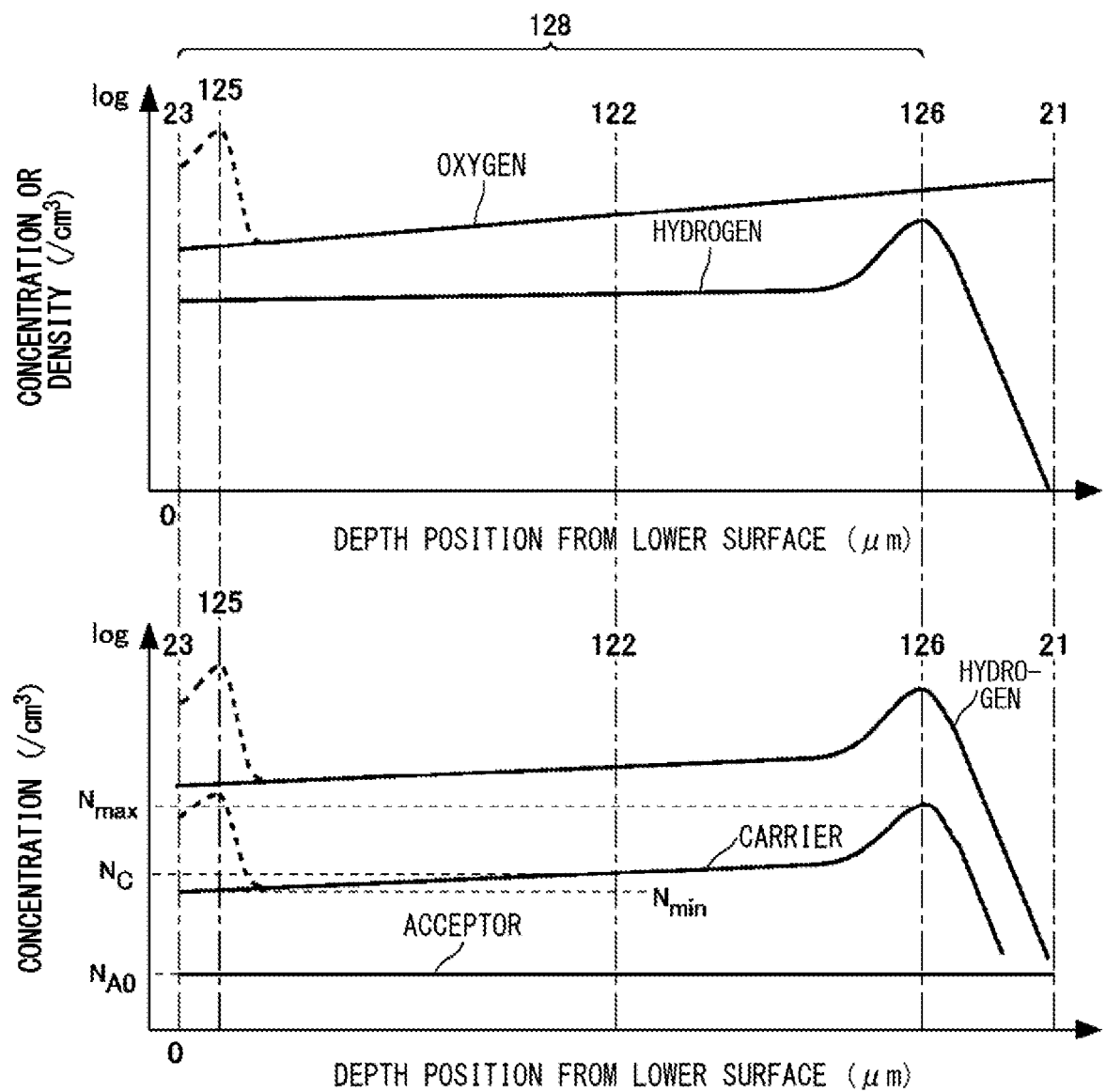
FIG. 4B illustrates an example of hydrogen chemical concentration distribution, oxygen chemical concentration distribution, carrier concentration distribution and acceptor concentration distribution after performing heat treatment in the heat treatment step S204 on the semiconductor substrate 10 shown in FIG. 4A.

FIG. 4B illustrates an example of the hydrogen chemical concentration distribution, the oxygen chemical concentration distribution, the carrier concentration distribution and the acceptor concentration distribution after the heat treatment has been performed in the heat treatment step S204 on the semiconductor substrate 10 shown in FIG. 4A. The graph of the upper section in FIG. 4B illustrates the hydrogen chemical concentration distribution and the oxygen chemical concentration distribution after the heat treatment. Similar to the example in FIG. 3B, after the heat treatment on the semiconductor substrate 10, hydrogen implanted at the implantation position 126 diffuses inside the semiconductor substrate 10. The vacancy-type defect shown in FIG. 4A combines with hydrogen and oxygen to become a donor, a hydrogen donor (VOH defect).

The graph of the lower section of FIG. 4B illustrates the hydrogen chemical concentration distribution and the carrier concentration distribution after the heat treatment. The hydrogen chemical concentration distribution is the same as the hydrogen chemical concentration distribution in the upper section in FIG. 4B. Note that the net-doping concentration distribution is approximately the same as the carrier concentration distribution.

If the oxygen chemical concentration included in each position of the semiconductor substrate 10 is relatively low, the density of the formed VOH defect may be rate-limiting to the oxygen chemical concentration. For example, if the oxygen included in the semiconductor ingot is little, by introducing oxygen inside the semiconductor substrate 10 in the thermal oxidation process, the oxygen chemical concentration is increased on the upper surface 21 side of the semiconductor substrate 10. In this case, as shown in FIG. 4A and FIG. 4B, the oxygen chemical concentration decreases toward the lower surface 23. Therefore, the carrier concentration distribution has a portion decreasing toward the lower surface 23. Note that in the vicinity of the implantation position 126, since the hydrogen chemical concentration and the vacancy-type defect density vary steeply, the carrier concentration is rate-limiting to the hydrogen chemical concentration and the vacancy-type defect density. In this way, the carrier concentration distribution in this example has a peak in the vicinity of the implantation position 126 and decreases from the peak toward the lower surface 23 side. The carrier concentration distribution may have a peak in the vicinity of the implantation position 125 and may decrease from the peak toward the lower surface 23 side.

For example, in the example in FIG. 4A and FIG. 4B, the average value of the oxygen chemical concentration included in the semiconductor substrate 10 is $1 \times 10^{16}$/cm$^3$ or less. Also, in the example in FIG. 3A and FIG. 3B, the average value of the oxygen chemical concentration included in the semiconductor substrate 10 is $1 \times 10^{16}$/cm$^3$ or more, $1 \times 10^{18}$/cm$^3$ or less, and may be $5 \times 10^{16}$/cm$^3$ or more, $7 \times 10^{17}$/cm$^3$ or less, or may be $1 \times 10^{17}$/cm$^3$ or more, $5 \times 10^{17}$/cm$^3$ or less.

As shown in FIG. 3A to FIG. 4B, in the pass-through region 128, there is a region where at least one of the carrier concentration, the hydrogen chemical concentration, and the vacancy-type defect concentration is flat, monotonically increasing, or monotonically decreasing. This region may be the region from the implantation position 125 to the implantation position 126, excluding a portion of the region where each concentration is locally changing at the implantation position 125 and the implantation position 126.

A distribution in which the concentrations at both ends of a predetermined region are connected by a straight line may be used as a linear approximation distribution. The linear approximation distribution may be a straight line fitted of the concentration in a predetermined region with a linear function. Also, the linear approximation distribution may be a straight line fitted of the distribution excluding a local peak of each concentration distribution with a linear function. Also, a range in a belt shape, which is centered on the linear approximation distribution and has a width of 30% of the value of the linear approximation distribution, is referred to as a belt-shaped range. A monotonically increasing or decreasing concentration distribution in a predetermined region refers to a state where the concentration values at both ends of a predetermined region are different and the concentration distribution is included in the above-mentioned belt-shaped range. The belt-shaped range may have a width of 20%, or may have a width of 10% of the value of the linear approximation distribution.

Figure 4C:
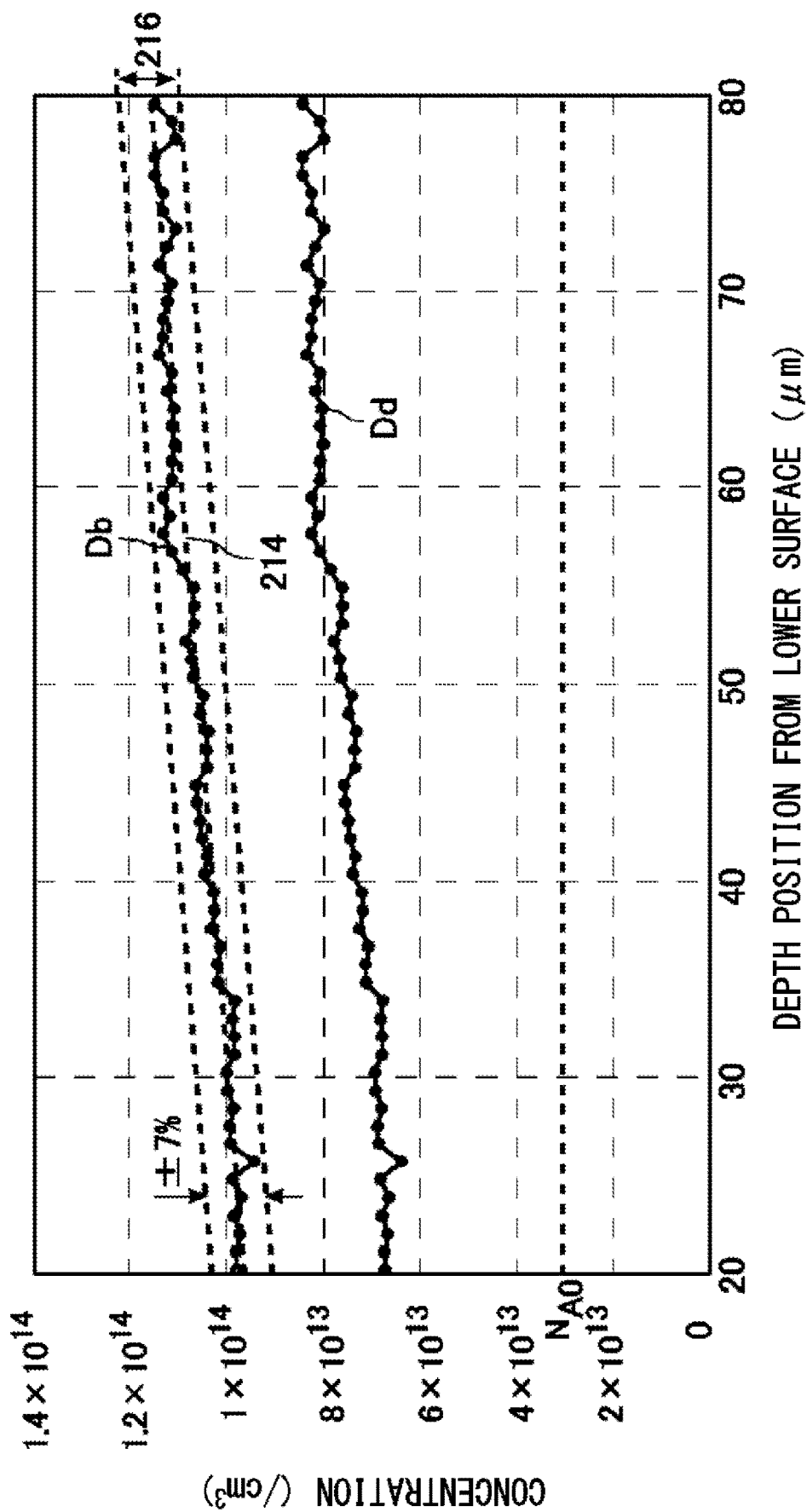
FIG. 4C illustrates an example of distribution of a bulk-acceptor concentration $N_{A0}$, a termination dangling-bond concentration Db and a donor concentration Dd.

FIG. 4C illustrates an example of distributions of the bulk-acceptor concentration $N_{AO}$, the termination dangling-bond concentration Db, and the donor concentration Dd. The termination dangling-bond is a hydrogen terminated dangling bond. The termination dangling-bond concentration Db corresponds to the concentration of the hydrogen terminated vacancy-type defect among the vacancy-type defects in FIG. 3A or FIG. 4A. Also, the donor concentration Dd corresponds to the carrier concentration shown in FIG. 3A to FIG. 4B. In this example, the thickness of the semiconductor substrate 10 is 120 μm. The vertical axis in this figure is the linear scale. A region from a predetermined position on the upper surface 21 side above the implantation position 125 to a predetermined position on the lower surface 23 side below the implantation position 126 is referred to as a predetermined region. For example, a region from a depth of 20 μm to a depth of 80 μm from the hydrogen ion implantation surface (lower surface 23 in this example) is referred to as a predetermined region. The predetermined region is a region penetrated by a hydrogen ion and there is no local peak in the donor concentration Dd. The thickness of the predetermined region in this example is 50% of the thickness of the semiconductor substrate 10. In this example, the bulk-acceptor concentration $N_{AO}$ is $3.1 \times 10^{13}/cm^3$.

The linear approximation distribution 214 of the donor concentration Dd is a distribution in which the concentration increases as the distance from the implantation surface increases. In this example, in a predetermined region penetrated by a hydrogen ion, the donor concentration Dd varies by a value of approximately ±7% with respect to the linear approximation distribution 214. The variation in the donor concentration Dd is referred to as the belt-shaped range 216. That is, in this example, the width of the belt-shaped range 216 has a width of ±7% of the value of the linear approximation distribution 214. If the distribution of the donor concentration Db exists within the range of the belt-shaped range 216 in a predetermined region with a thickness of 30% or more of the thickness of the semiconductor substrate 10, the distribution of the donor concentration Db may be referred to as a flat distribution. This predetermined region may be set as a flat region with H-terminated dangling-bond.

Figure 4D:
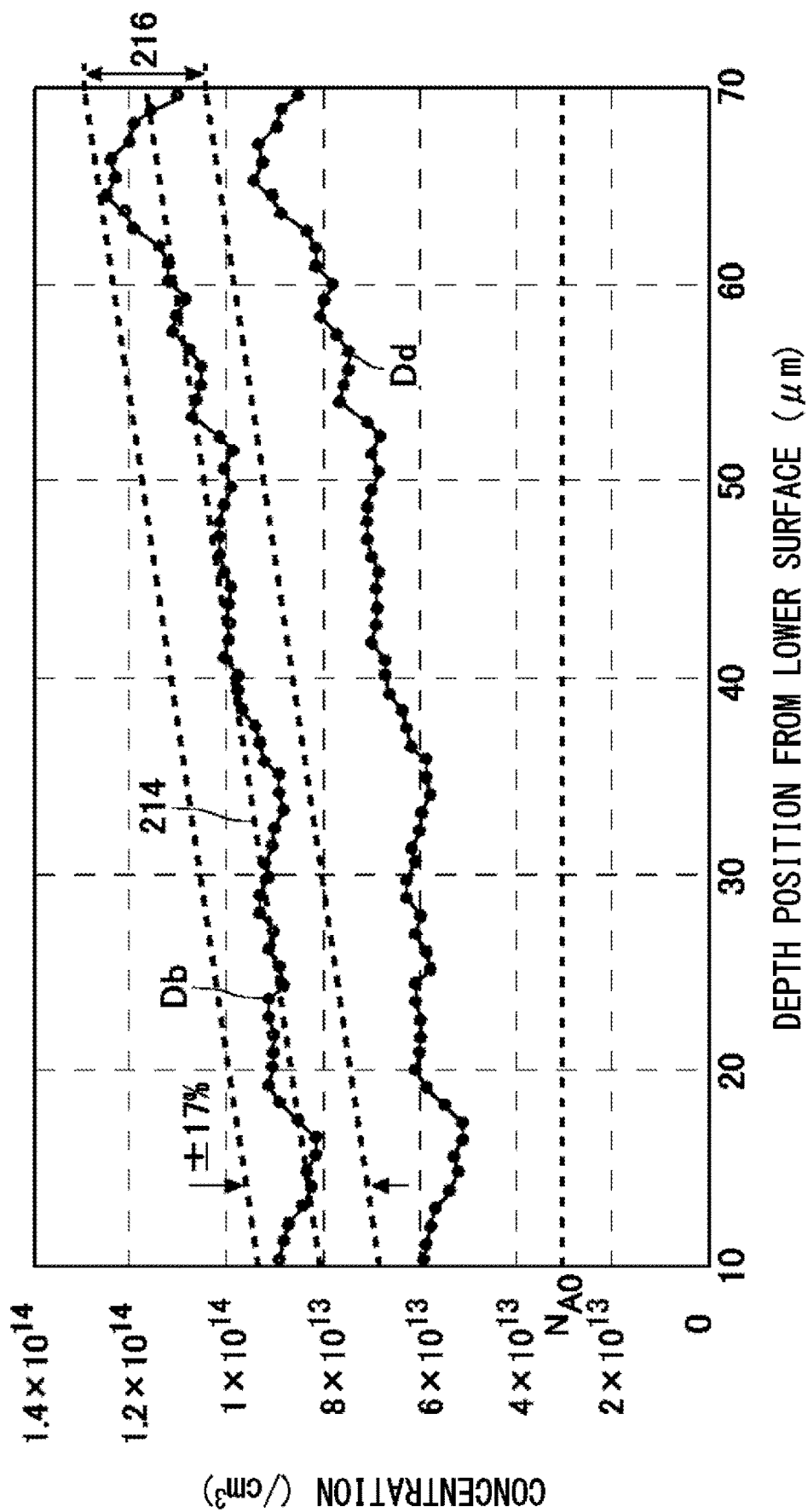
FIG. 4D illustrates another example of distribution of the bulk-acceptor concentration $N_{A0}$, the termination dangling-bond concentration Db and the donor concentration Dd.

FIG. 4D illustrates another example of the distribution of the bulk-acceptor concentration $N_{AO}$, the termination dangling-bond concentration Db and the donor concentration Dd. In this example, with respect to FIG. 4C, the depth position of the predetermined region, the distribution of the termination dangling-bond concentration Db, and the distribution of the donor concentration Dd are different. In this example, a region from a depth of 10 μm to a depth of 70 μm from the implantation surface of a hydrogen ion is referred to as a predetermined region. In this example, the thickness of the predetermined region is 50% with respect to the thickness of the semiconductor substrate 10 (120 μm), the same as the example in FIG. 4C.

The linear approximation distribution 214 of the donor concentration Dd is a distribution in which the concentration increases as the distance from the implantation surface increases. However, in this example, the linear approximation distribution 214 has a larger slope of increase than the linear approximation distribution 214 in FIG. 4C. Also, in a predetermined region, the donor concentration Dd varies by a value of approximately ±17% with respect to the linear approximation distribution 214. The variation in the donor concentration Dd is referred to as the belt-shaped range 216. The width of the belt-shaped range 216 has a width of ±17% of the value of the linear approximation distribution 214. Accordingly, if the distribution of the donor concentration Db exists within the range of the belt-shaped range 216 in a predetermined region with a thickness of 30% or more of the thickness of the semiconductor substrate 10, the distribution of the donor concentration Db may be referred to as a flat distribution. This predetermined region may be set as a flat region with H-terminated dangling-bond.

The flat region with H-terminated dangling-bond may be provided in a range from 20% to 80% of the thickness of the semiconductor substrate 10. The absolute value of the slope of the linear approximation distribution 214 in the flat region with H-terminated dangling-bond may be, with respect to the depth (μm), from $0/(cm^3 \cdot \mu m)$ to $2 \times 10^{12}/(cm^3 \cdot \mu m)$, or may be greater than $0/(cm^3 \cdot \mu m)$ and equal to or less than $1 \times 10^{12}/(cm^3 \cdot \mu m)$. Further, the absolute value of the slope of the linear approximation distribution 214 in the flat region with H-terminated dangling-bond may be, with respect to the depth (μm), from $1 \times 10^{10}/(cm^3 \cdot \mu m)$ to $1 \times 10^{12}/(cm^3 \cdot \mu m)$, or may be from $1 \times 10^{10}/(cm^3 \cdot \mu m)$ to $5 \times 10^{11}/(cm^3 \cdot \mu m)$. Herein, $5 \times 10^{11}/(cm^3 \cdot \mu m)$ and $5 \times 10^{15}/cm^4$ are the same slope (equivalent).

As another index of the slope of the linear approximation distribution 214, the semilog slope may be used. In the predetermined region, the position on one end is referred to as x1 (cm), and the position of the other end is referred to as x2 (cm). The concentration at x1 is referred to as N1 $(/cm^3)$, and the concentration at x2 is referred to as N2 $(/cm^3)$. The semilog slope η(/cm) in the predetermined region is defined as $\eta = (\log_{10}(N2) - \log_{10}(N1))/(x2 - x1)$. The absolute value of the semilog slope η of the linear approximation distribution 214 in the flat region with H-terminated dangling-bond may be from 0/cm to 50/cm, or may be from 0/cm to 30/cm. Further, the absolute value of the semilog slope η of the linear approximation distribution 214 in the flat region with H-terminated dangling-bond may be from 0/cm to 20/cm, or may be from 0/cm to 10/cm.

It is considered that a vacancy (V, VV and so on) generated by the passage of hydrogen is distributed in an approximately uniform concentration in the depth direction, in a region among the pass-through regions 128 through which a hydrogen ion have passed, excluding the vicinity of the implantation position 125 and the vicinity of the implantation position 126. Also, it is considered that oxygen (O) implanted during manufacturing the semiconductor substrate 10 or other is uniformly distributed in the depth direction. On the other hand, in the manufacturing process of the semiconductor device 100, oxygen may diffuse from the upper surface 21 or the lower surface 23 of the semiconductor substrate 10 to the outside of the semiconductor substrate 10 in the process of performing high temperature processing at 1100° C. or higher. As a result, the oxygen chemical concentration may decrease toward the upper surface 21 or the lower surface 23 of the semiconductor substrate 10.

In this example, among the pass-through regions 128, hydrogen is approximately uniformly distributed in a region other than the implantation position 125 and the implantation position 126. Therefore, the termination dangling-bond (that is, the VOH defect) is approximately uniformly distributed in the region. Between the lower surface 23 or implantation position 125 and the implantation position 126, a flat region with H-terminated dangling-bond, in which the concentration of the termination dangling-bond is flat, monotonically increasing, or monotonically decreasing, may be provided. The definition of flat, monotonically increasing or monotonically decreasing in the termination dangling-bond concentration distribution is identical to the example for the hydrogen chemical concentration distribution. Also, the region, in which the hydrogen chemical concentration is greater than 100 times of the bulk-acceptor concentration, and both of the hydrogen chemical concentration distribution and the donor concentration distribution are flat, monotonically increasing or monotonically decreasing, may be used as the flat region with H-terminated dangling-bond.

In the region from the implantation position 125 to the implantation position 126, which is a region where a hydrogen ion is implanted locally, such as the buffer region described below, the termination dangling-bond concentration may also have a local peak. A region other than the region where a hydrogen ion is implanted locally may be a flat region with H-terminated dangling-bond. In the semiconductor substrate 10, a flat region with H-terminated dangling-bond may be continuously provided over a range from 30% to 80% of the thickness of the semiconductor substrate 10 in the depth direction. The flat region with H-terminated dangling-bond may be provided over 50% or more, or may be provided over 60% or more, or may be provided over 70% or more of the thickness of the semiconductor substrate 10.

The concentration of the termination dangling-bond can be controlled in high precision according to the dose volume of a hydrogen ion. This allows precise control of the donor concentration throughout the semiconductor substrate 10. The donor concentration in the semiconductor substrate 10 is higher than the bulk-acceptor concentration over the entire region from the lower surface 23 to the implantation position 126.

Hydrogen as a supplying source of hydrogen implanted at the implantation position 125 has a higher hydrogen chemical concentration than the hydrogen chemical concentration of the linear approximation distribution 214 in the flat region with H-terminated dangling-bond. The maximum value of the hydrogen chemical concentration at the implantation position 125 may be 10 times of or greater than, or may be 100 times of or greater than the hydrogen chemical concentration of the linear approximation distribution 214. The hydrogen chemical concentration at the implantation position 125 may be $1\times10^{16}/cm^3$ or more, or may be $1\times10^{17}/cm^3$ or more, or may be $1\times10^{18}/cm^3$ or more.

Figure 5:
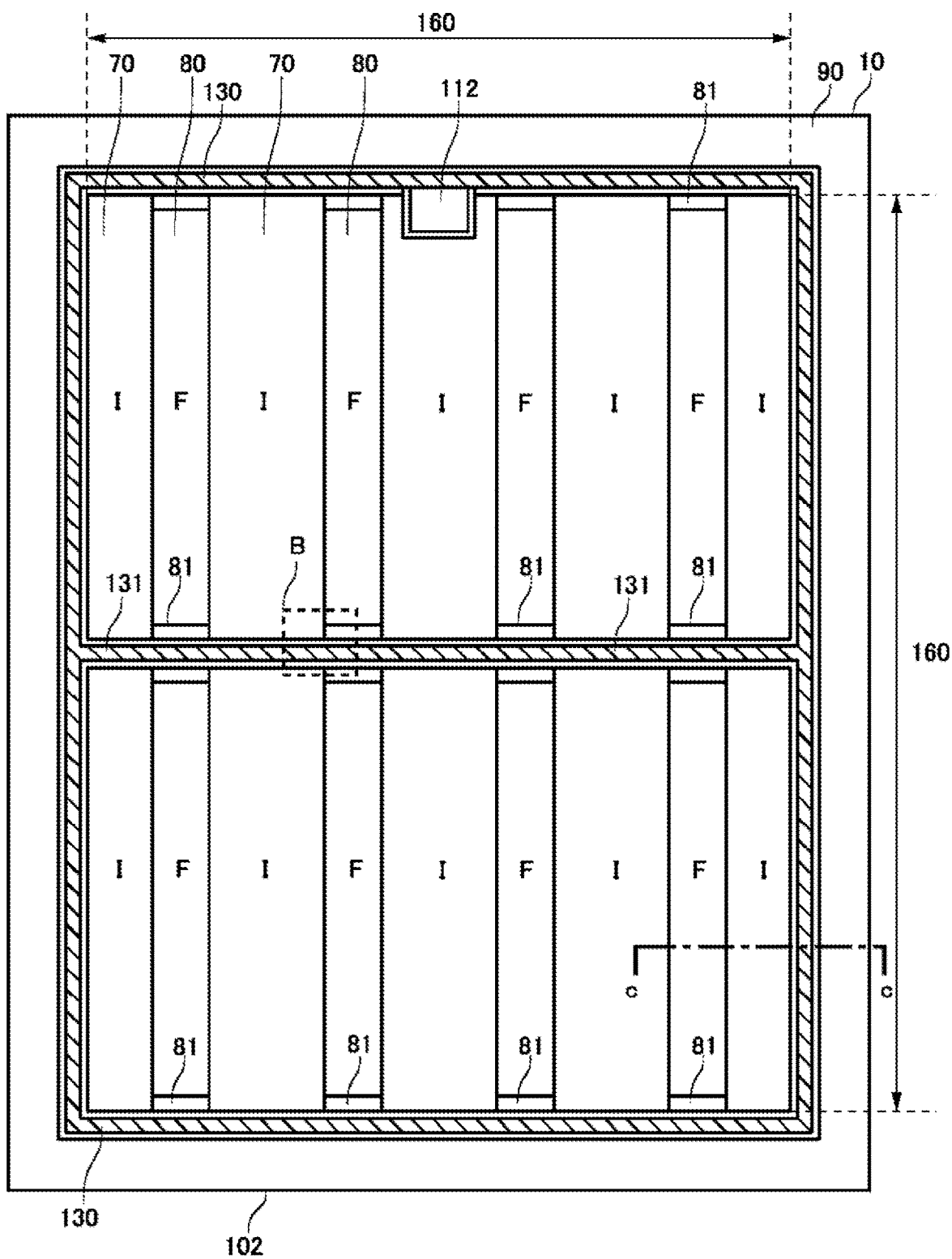
FIG. 5 illustrates a top view showing one example of the semiconductor device 100 according to one embodiment of the present invention.

FIG. 5 illustrates a top view showing one example of the semiconductor device 100 according to one embodiment of the present invention. FIG. 5 illustrates positions obtained by projecting all the members onto the upper surface of the semiconductor substrate 10. In FIG. 5, only some members of the semiconductor device 100 are shown, and some members are omitted.

The semiconductor device 100 includes a semiconductor substrate 10. The semiconductor substrate 10 has an edge side 102 in a top view. When merely referred to as the top view in the present specification, it means that the semiconductor substrate 10 is viewed from an upper surface side. In this example, the semiconductor substrate 10 has two sets of edge sides 102 opposite to each other in a top view. In FIG. 1, the X axis and the Y axis are parallel to any of the edge sides 102. In addition, the Z axis is perpendicular to the upper surface of the semiconductor substrate 10.

The semiconductor substrate 10 is provided with an active portion 160. The active portion 160 is a region where a main current flows in the depth direction between the upper surface and the lower surface of the semiconductor substrate 10 when the semiconductor device 100 operates. An emitter electrode is provided above the active portion 160, but is omitted in FIG. 5.

The active portion 160 is provided with at least one of a transistor portion 70 including a transistor element such as an IGBT, and a diode portion 80 including a diode element such as a freewheeling diode (FWD). In the example of FIG. 5, the transistor portion 70 and the diode portion 80 are alternately arranged along a predetermined array direction (the X axis direction in this example) on the upper surface of the semiconductor substrate 10. The active portion 160 in another example may be provided with only one of the transistor portion 70 and the diode portion 80.

In FIG. 5, a symbol "I" is attached to the region where the transistor portion 70 is arranged, and a symbol "F" is attached to the region where the diode portion 80 is arranged. In the present specification, a direction perpendicular to the array direction in a top view may be referred to as an extension direction (the Y axis direction in FIG. 5). Each of the transistor portion 70 and the diode portion 80 may have a longitudinal length in the extension direction. That is, the length in the Y axis direction of the transistor portion 70 is larger than the width in the X axis direction. Similarly, the length in the Y axis direction of the diode portion 80 is larger than the width in the X axis direction. The extension direction of the transistor portion 70 and the diode portion 80 may be the same as the longitudinal direction of each trench portion described below.

The diode portion 80 includes an N+ type cathode region in a region in contact with the lower surface of the semiconductor substrate 10. In the present specification, the region where the cathode region is provided is referred to as the diode portion 80. That is, the diode portion 80 is a region overlapping with the cathode region in a top view. On the lower surface of the semiconductor substrate 10, a P+ type collector region may be provided in a region other than the cathode region. In the present specification, an extension region 81 extending from the diode portion 80 to a gate runner described below in the Y axis direction may also be included in the diode portion 80. The collector region is provided on a lower surface of the extension region 81.

The transistor portion 70 includes a P+ type collector region in a region in contact with the lower surface of the semiconductor substrate 10. Further, in the transistor portion 70, an N-type emitter region, a P-type base region, and a gate structure having a gate conductive portion and a gate dielectric film are periodically arranged on the upper surface side of the semiconductor substrate 10.

The semiconductor device 100 may have one or more pads above the semiconductor substrate 10. In this example, the semiconductor device 100 has a gate pad 112. The semiconductor device 100 may also include a pad such as an anode pad, a cathode pad, and a current sensing pad. Each pad is arranged in the vicinity of the edge side 102. The vicinity of the edge side 102 refers to a region between the edge side 102 and the emitter electrode in a top view. During implementing the semiconductor device 100, each pad may be connected to an external circuit via wiring such as a wire.

A gate potential is applied to the gate pad 112. The gate pad 112 is electrically connected to a conductive portion of a gate trench portion of the active portion 160. The semiconductor device 100 includes a gate runner that connects the gate pad 112 and the gate trench portion. In FIG. 5, the gate runner is hatched with diagonal lines.

In this example, the gate runner has an outer circumferential gate runner 130 and an active region side gate runner 131. The outer circumferential gate runner 130 is arranged between the active portion 160 and the edge side 102 of the semiconductor substrate 10 in a top view. In this example, the outer circumferential gate runner 130 is configured to enclose the active portion 160 in a top view. A region enclosed by the outer circumferential gate runner 130 in a top view may be used as the active portion 160. Further, the outer circumferential gate runner 130 is connected to the gate pad 112. The outer circumferential gate runner 130 is arranged above the semiconductor substrate 10. The outer circumferential gate runner 130 may be a metal wiring including aluminum or other.

The active region side gate runner 131 is provided in the active portion 160. By providing the active region side gate runner 131 in the active portion 160, a variation in runner length from the gate pad 112 can be reduced for each region of the semiconductor substrate 10.

The active region side gate runner 131 is connected to the gate trench portion of the active portion 160. The active region side gate runner 131 is arranged above the semiconductor substrate 10. The active region side gate runner 131 may be a wiring formed of a semiconductor such as polysilicon doped with an impurity.

The active region side gate runner 131 may be connected to the outer circumferential gate runner 130. In this example, the active region side gate runner 131 is provided extending in the X axis direction so as to cross the active portion 160 from one outer circumferential gate runner 130 to the other outer circumferential gate runner 130 substantially at the center of the Y axis direction. In a case where the active portion 160 is divided by the active region side gate runner 131, the transistor portion 70 and the diode portion 80 may be alternately arranged in the X axis direction in each divided region.

Further, the semiconductor device 100 may include a temperature sensing portion (not shown) that is a PN junction diode formed of polysilicon or the like, and a current sensing portion (not shown) that simulates an operation of the transistor portion provided in the active portion 160.

In this example, the semiconductor device 100 includes an edge termination structure portion 90 between the outer circumferential gate runner 130 and the edge side 102. The edge termination structure portion 90 is configured to reduce an electric field concentration on the upper surface side of the semiconductor substrate 10. The edge termination structure portion 90 is structured by, for example, a guard ring provided in an annular shape enclosing the active portion 160, a field plate, a RESURF, and a combination thereof.

The N-type region 120 described in FIG. 1 to FIG. 4B may be provided in the active portion 160. The N-type region 120 may be provided throughout the active portion 160 in a top view. The N-type region 120 may be provided in the edge termination structure portion 90. The N-type region 120 may be provided throughout the edge termination structure portion 90 in a top view. The N-type region 120 may be provided throughout the semiconductor substrate 10 in a top view.

Figure 6:
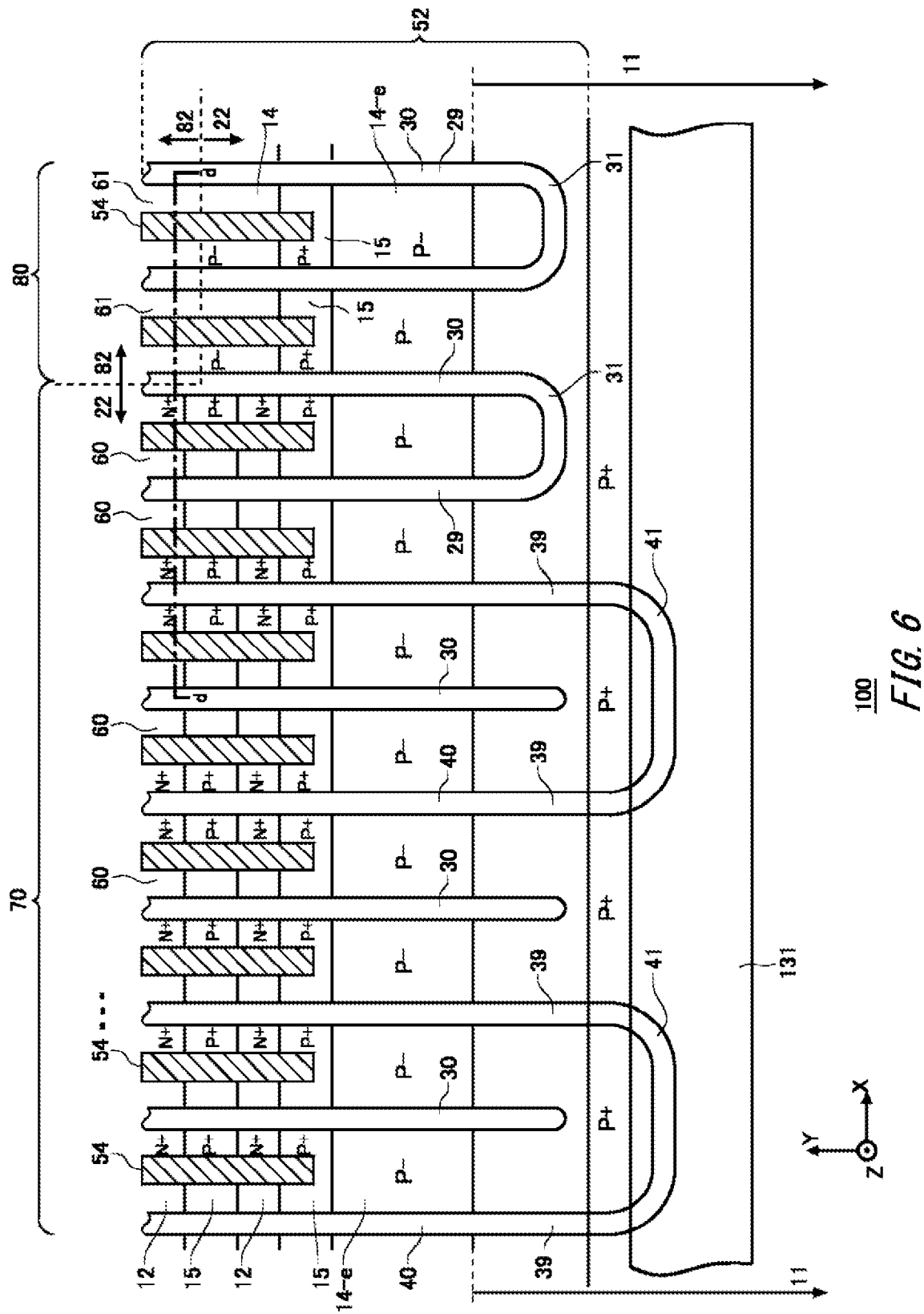
FIG. 6 illustrates an enlarged view of a region B in FIG. 5.

FIG. 6 illustrates an enlarged view of the region B in FIG. 5. Region B is a region including a transistor portion 70, a diode portion 80 and an active region side gate runner 131. In this example, the semiconductor device 100 includes a gate trench portion 40, a dummy trench portion 30, a well region 11, an emitter region 12, a base region 14 and a contact region 15 provided in the interior of the upper surface side of the semiconductor substrate 10. Each of the gate trench portion 40 and the dummy trench portion 30 is one example of the trench portion. Further, in this example, the semiconductor device 100 includes an emitter electrode 52 and the active region side gate runner 131 that are provided above the upper surface of the semiconductor substrate 10. The emitter electrode 52 and the active region side gate runner 131 are provided to be separated from each other.

An interlayer dielectric film is provided between the emitter electrode 52 and the active region side gate runner 131, and the upper surface of the semiconductor substrate 10, but the interlayer dielectric film is omitted in FIG. 6. In the interlayer dielectric film, in this example, a contact hole 54 is provided penetrating the interlayer dielectric film. In FIG. 6, each contact hole 54 is hatched with diagonal lines.

The emitter electrode 52 is provided above the gate trench portion 40, the dummy trench portion 30, the well region 11, the emitter region 12, the base region 14 and the contact region 15. The emitter electrode 52 is in contact with the emitter region 12, the contact region 15, and the base region 14 on the upper surface of the semiconductor substrate 10, through the contact hole 54. Further, the emitter electrode 52 is connected to a dummy conductive portion within the dummy trench portion 30 through the contact hole provided in the interlayer dielectric film. The emitter electrode 52 may be connected to the dummy conductive portion of the dummy trench portion 30 at an edge of the dummy trench portion 30 in the Y axis direction.

The active region side gate runner 131 is connected to the gate trench portion 40 through the contact hole provided in the interlayer dielectric film. The active region side gate runner 131 may be connected to a gate conductive portion of the gate trench portion 40 at an edge portion 41 of the gate trench portion 40 in the Y axis direction. The active region side gate runner 131 is not connected to the dummy conductive portion within the dummy trench portion 30.

The emitter electrode 52 is formed of a material including a metal. FIG. 6 illustrates a range where the emitter electrode 52 is provided. For example, at least a part of a region of the emitter electrode 52 is formed of aluminum or an aluminum-silicon alloy. The emitter electrode 52 may have a barrier metal formed of titanium, a titanium compound, or the like below a region formed of aluminum or the like. Further, a plug, which is formed by embedding tungsten or the like so as to be in contact with the barrier metal and aluminum or the like, may be included in the contact hole.

The well region 11 is provided overlapping with the active region side gate runner 131. The well region 11 is provided so as to extend with a predetermined width even in a range not overlapping with the active region side gate runner 131. In this example, the well region 11 is provided away from an end of the contact hole 54 in the Y axis direction toward the active region side gate runner 131. The well region 11 is a second conductivity type region in which the doping concentration is higher than the base region 14. In this example, the base region 14 is of a P– type, and the well region 11 is of a P+ type.

Each of the transistor portion 70 and the diode portion 80 includes a plurality of trench portions arranged in the array direction. In the transistor portion 70, in this example, one or more gate trench portions 40 and one or more dummy trench portions 30 are alternately provided along the array direction. In the diode portion 80, in this example, the plurality of dummy trench portions 30 are provided along the array direction. In the diode portion 80, in this example, the gate trench portion 40 is not provided.

The gate trench portion 40, in this example may have two linear portions 39 extending along the extension direction perpendicular to the array direction (portions of a trench that are linear along the extension direction), and the edge portion 41 connecting the two linear portions 39. The extension direction in FIG. 6 is the Y axis direction.

At least a part of the edge portion 41 is desirably provided in a curved shape when viewed in a top view. By connecting between end portions of the two linear portions 39 in the Y axis direction by the edge portion 41, it is possible to reduce the electric field concentration at the end portions of the linear portions 39.

In the transistor portion 70, the dummy trench portions 30 are provided between the respective linear portions 39 of the gate trench portions 40. Between the respective linear portions 39, one dummy trench portion 30 may be provided or a plurality of dummy trench portions 30 may be provided. The dummy trench portions 30 may have a linear shape extending in the extension direction, or may have linear portions 29 and an edge portion 31 similar to the gate trench portion 40. The semiconductor device 100 shown in FIG. 6 includes both of the linear shaped dummy trench portion 30 having no edge portion 31 and the dummy trench portion 30 having the edge portion 31.

A diffusion depth of the well region 11 may be deeper than depths of the gate trench portion 40 and the dummy trench portion 30. The end portions of the gate trench portion 40 and the dummy trench portion 30 in the Y axis direction are provided in the well region 11 in a top view. That is, in the end portion of each trench portion in the Y axis direction, the bottom portion of each trench portion in the depth direction is covered by the well region 11. In this way, the electric field concentration in the bottom portion of each trench portion can be reduced.

A mesa portion is provided between the respective trench portions in the array direction. The mesa portion refers to a region interposed between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion, in this example is provided extending in the extension direction (the Y axis direction) along the trench, on the upper surface of the semiconductor substrate 10. In this example, a mesa portion 60 is provided in the transistor portion 70, and a mesa portion 61 is provided in the diode portion 80. In the present specification, when simply referring to the mesa portion, it indicates each of the mesa portion 60 and the mesa portion 61.

Each mesa portion is provided with the base region 14. In the mesa portion, a region arranged closest to the active region side gate runner 131, in the base region 14 exposed on the upper surface of the semiconductor substrate 10, is referred to as a base region 14-$e$. In FIG. 6, the base region 14-$e$ arranged in one end portion in the extension direction of each mesa portion is illustrated, but the base region 14-$e$ is arranged even in the other end portion of each mesa portion. Each mesa portion may be provided with at least one of a first conductivity-type of emitter region 12, and a second conductivity type of contact region 15 in a region interposed between the base regions 14-$e$ in a top view. The emitter region 12, in this example, is of an N+ type, and the contact region 15 is of a P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. The mesa portion 60 in contact with the gate trench portion 40 may be provided with the contact region 15 exposed on the upper surface of the semiconductor substrate 10.

Each of the contact region 15 and the emitter region 12 in the mesa portion 60 is provided from one trench portion to the other trench portion in the X axis direction. As an example, the contact region 15 and the emitter region 12 in the mesa portion 60 are alternately arranged along the extension direction of the trench portion (the Y axis direction).

In another example, the contact region 15 and the emitter region 12 in the mesa portion 60 may be provided in a stripe shape along the extension direction of the trench portion (the Y axis direction). For example, the emitter region 12 is provided in a region in contact with the trench portion, and the contact region 15 is provided in a region interposed between the emitter regions 12.

The mesa portion 61 of the diode portion 80 is not provided with the emitter region 12. The base region 14 and the contact region 15 may be provided on an upper surface of the mesa portion 61. In the region interposed between the base regions 14-$e$ on the upper surface of the mesa portion 61, the contact region 15 may be provided in contact with each base region 14-$e$. The base region 14 may be provided in a region interposed between the contact regions 15 on the upper surface of the mesa portion 61. The base region 14 may be disposed in the entire region arranged interposed between the contact regions 15.

The contact hole 54 is provided above each mesa portion. The contact hole 54 is arranged in the region interposed between the base regions 14-$e$. The contact hole 54, in this example, is provided above respective regions of the contact region 15, the base region 14, and the emitter region 12. The contact hole 54 is not provided in regions corresponding to the base region 14-$e$ and the well region 11. The contact hole 54 may be arranged at the center of the mesa portion 60 in the array direction (the X axis direction).

In the diode portion 80, an N+ type cathode region 82 is provided in a region in direct contact with the lower surface of the semiconductor substrate 10. On the lower surface of the semiconductor substrate 10, a P+ type collector region 22 may be provided in a region where the cathode region 82 is not provided. In FIG. 6, a boundary between the cathode region 82 and the collector region 22 is indicated by a dotted line.

The cathode region 82 is arranged separately from the well region 11 in the Y axis direction. With this configuration, the distance between the P-type region (the well region 11) having a relatively high doping concentration and formed up to the deep position, and the cathode region 82 is secured, so that the breakdown voltage can be improved. The end portion in the Y axis direction of the cathode region 82, in this example, is arranged farther away from the well region 11 than the end portion in the Y axis direction of the contact hole 54. In another example, the end portion in the Y axis direction of the cathode region 82 may be arranged between the well region 11 and the contact hole 54.

Figure 7:
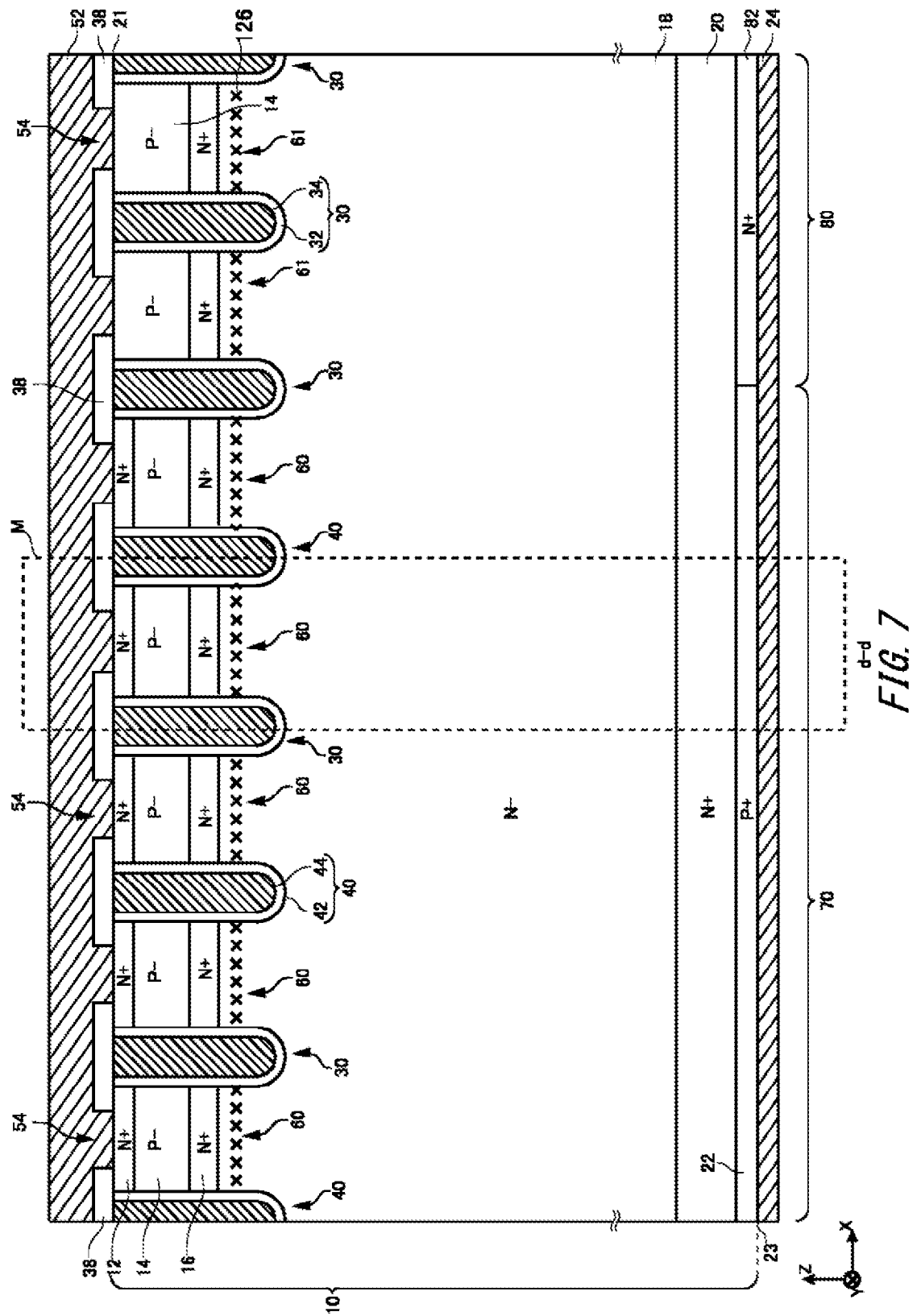
FIG. 7 illustrates one example of a cross-section d-d in FIG. 6.

FIG. 7 illustrates one example of a cross-section d-d in FIG. 6. The cross-section d-d is an XZ plane passing through the emitter region 12 and the cathode region 82. The semiconductor device 100, in this example, includes the semiconductor substrate 10, an interlayer dielectric film 38, the emitter electrode 52, and a collector electrode 24 in the corresponding cross-section. The interlayer dielectric film 38 is provided on the upper surface of the semiconductor substrate 10. The interlayer dielectric film 38 is a film including at least one layer of a dielectric film such as silicate glass to which an impurity such as boron or phosphorus is added, a thermal oxide film, and the other dielectric film. The interlayer dielectric film 38 is provided with the contact hole 54 described in FIG. 6.

The emitter electrode 52 is provided above the interlayer dielectric film 38. The emitter electrode 52 is in contact with an upper surface 21 of the semiconductor substrate 10 through the contact hole 54 of the interlayer dielectric film 38. The collector electrode 24 is provided in a lower surface 23 of the semiconductor substrate 10. The emitter electrode 52 and the collector electrode 24 are formed of a metal material such as aluminum. In the present specification, the direction in which the emitter electrode 52 is connected to the collector electrode 24 (the Z axis direction) is referred to as a depth direction.

The semiconductor substrate 10 has an N− type drift region 18. The drift region 18 is provided in each of the transistor portion 70 and the diode portion 80.

In the mesa portion 60 of the transistor portion 70, an N+ type emitter region 12 and a P− type base region 14 are provided in order from an upper surface 21 side of the semiconductor substrate 10. The drift region 18 is provided below the base region 14. The mesa portion 60 may be provided with an N+ type of accumulation region 16. The accumulation region 16 is arranged between the base region 14 and the drift region 18.

The emitter region 12 is exposed on the upper surface 21 of the semiconductor substrate 10 and is provided in contact with gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14, in this example, is provided in contact with the emitter region 12. The base region 14 may be in contact with the trench portions on both sides of the mesa portion 60.

The accumulation region 16 is provided below the base region 14. The accumulation region 16 is an N+ type region having a doping concentration higher than that of the drift region 18. By providing the accumulation region 16 having the high concentration between the drift region 18 and the base region 14, it is possible to improve a carrier injection-enhancement effect (IE effect) and reduce an on-voltage. The accumulation region 16 may be provided to cover an entire lower surface of the base region 14 in each mesa portion 60.

The mesa portion 61 of the diode portion 80 is provided with the P− type base region 14 in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, an N+ type buffer region 20 may be provided below the drift region 18. The doping concentration of the buffer region 20 has a doping concentration higher than the drift region 18. The buffer region 20 has one or more donor concentration peaks that are higher than the donor concentration of the drift region 18. The plurality of donor concentration peaks are arranged at different positions in the depth direction of the semiconductor substrate 10. The donor concentration peak in the buffer region 20 may be, for example, a hydrogen (proton) or phosphorus concentration peak. The buffer region 20 may function as a field stop layer which prevents a depletion layer widening from a lower end of the base region 14 from reaching the P+ type collector region 22 and the N+ type cathode region 82.

In the transistor portion 70, the P+ type collector region 22 is provided below the buffer region 20. An acceptor concentration of the collector region 22 is higher than an acceptor concentration of the base region 14. The collector region 22 may include an acceptor which is the same as or may include different from an acceptor of the base region 14. The acceptor of the collector region 22 is, for example, boron.

Below the buffer region 20 in the diode portion 80, the N+ type cathode region 82 is provided. A donor concentration of the cathode region 82 is higher than a donor concentration of the drift region 18. A donor of the cathode region 82 is, for example, hydrogen or phosphorus. Note that an element serving as a donor and an acceptor in each region is not limited to the above described example. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion passes through the base region 14 from the upper surface 21 of the semiconductor substrate 10, and reaches the drift region 18. In a region where at least any of the emitter region 12, the contact region 15, and the accumulation region 16 is provided, each trench portion also penetrates the doping regions of these to reach the drift region 18. The configuration that the trench portion passes through the doping region is not limited to a manufacturing procedure that the doping region is formed and then the trench portion is formed. The configuration of the trench portion penetrating the doping region includes a configuration of the doping region being formed between the trench portions after forming the trench portion.

As described above, the transistor portion 70 is provided with the gate trench portion 40 and the dummy trench portion 30. In the diode portion 80, the dummy trench portion 30 is provided, and the gate trench portion 40 is not provided. The boundary in the X axis direction between the diode portion 80 and the transistor portion 70 in this example is the boundary between the cathode region 82 and the collector region 22.

The gate trench portion 40 has a gate trench, a gate insulating film 42 and a gate conductive portion 44 provided on the upper surface 21 of the semiconductor substrate 10. The gate insulating film 42 is provided to cover the inner wall of the gate trench. The gate insulating film 42 may be formed by oxidizing or nitriding a semiconductor on the inner wall of the gate trench. The gate conductive portion 44 is provided inside from the gate insulating film 42 inside the gate trench. In other words, the gate dielectric film 42 insulates the gate conductive portion 44 from the semiconductor substrate 10. The gate conductive portion 44 is formed of a conductive material such as polysilicon.

The gate conductive portion 44 may be provided to extend deeper than the base region 14 in the depth direction. The gate trench portion 40 in the cross-section is covered by the interlayer dielectric film 38 on the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross-section. The dummy trench portion 30 has a dummy trench, a dummy insulating film 32 and a dummy conductive portion 34 provided on the upper surface 21 of the semiconductor substrate 10. The dummy conductive portion 34 is electrically connected to the emitter electrode 52. The dummy dielectric film 32 is provided covering an inner wall of the dummy trench. The dummy conductive portion 34 is provided inside the dummy trench, and is provided on an inner side relative to the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30, in this example, are covered with the interlayer dielectric film 38 on the upper surface 21 of the semiconductor substrate 10. Note that bottom portions of the dummy trench portion 30 and the gate trench portion 40 may each have a downwardly convex curved shape (a curved shape in a cross section).

In this example, the donor is implanted into the implantation position 126 in the transistor portion 70 and diode portion 80. The implantation position 126 is provided on the upper surface 21 side of the semiconductor substrate 10. In FIG. 7, the implantation position 126 is schematically shown with an X mark. The drift region 18 in this example is the N-type region 120 formed by the diffusion of the donor implanted at the implantation position 126. The implantation position 126 may be arranged in the drift region 18.

The implantation position 126 may be arranged between the lower end of the trench portion and the upper surface 21 of the semiconductor substrate 10. The implantation position 126 may be arranged to overlap with the accumulation region 16. In this case, the region that is the peak in the carrier concentration distribution shown in FIG. 3B or FIG. 4B may function as the accumulation region 16. Also, the implantation position 126 may be arranged below the lower end of the trench portion.

Figure 8A:
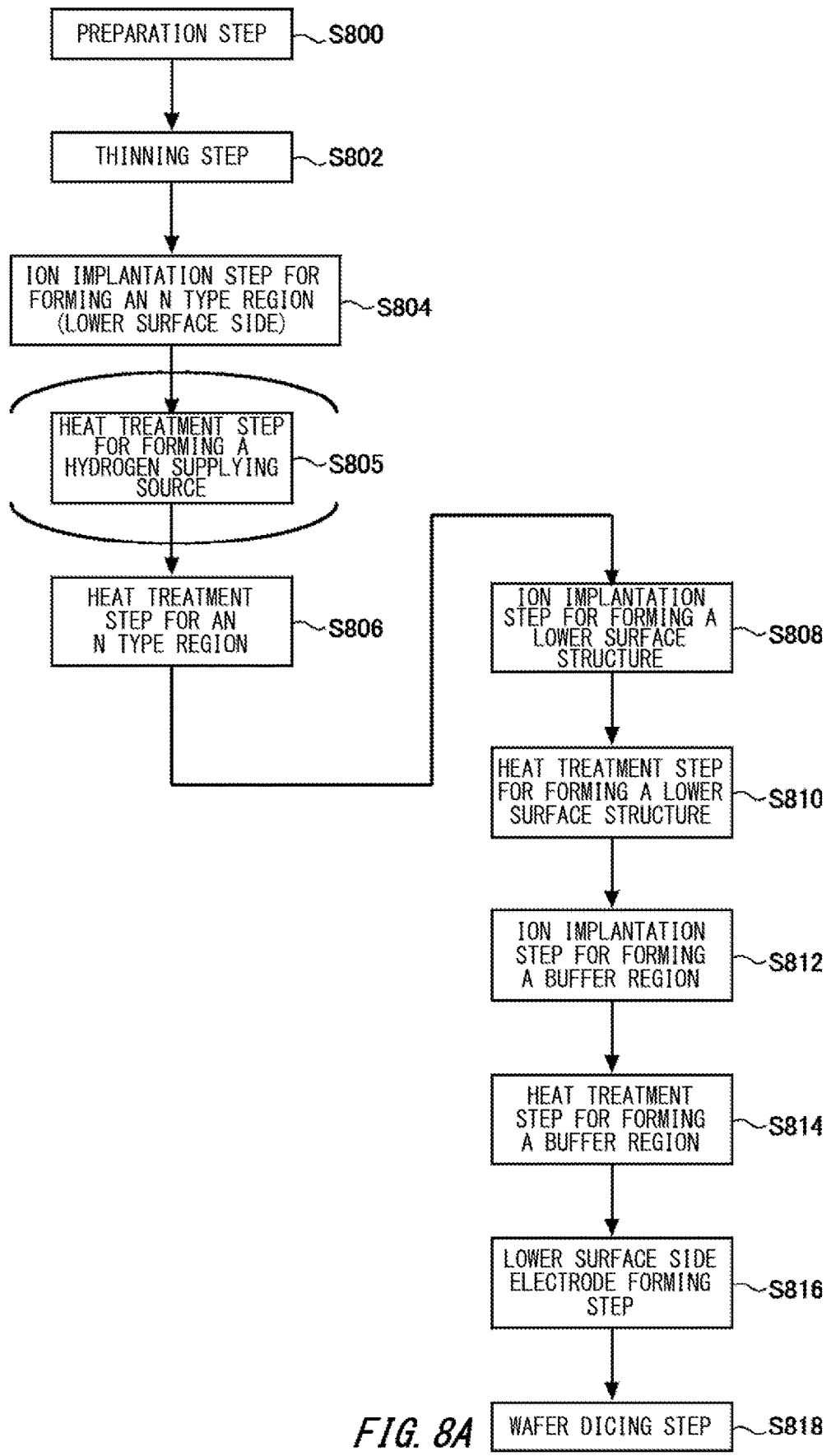
FIG. 8A illustrates another example of the manufacturing method of the semiconductor device 100.

FIG. 8A illustrates another example of the manufacturing method of the semiconductor device 100. The manufacturing method in this example includes a preparation step S800 to a wafer dicing step S818. However, it is not required to include all the steps. Each step can be omitted or changed depending on the structure of the semiconductor device 100.

Figure 8B:
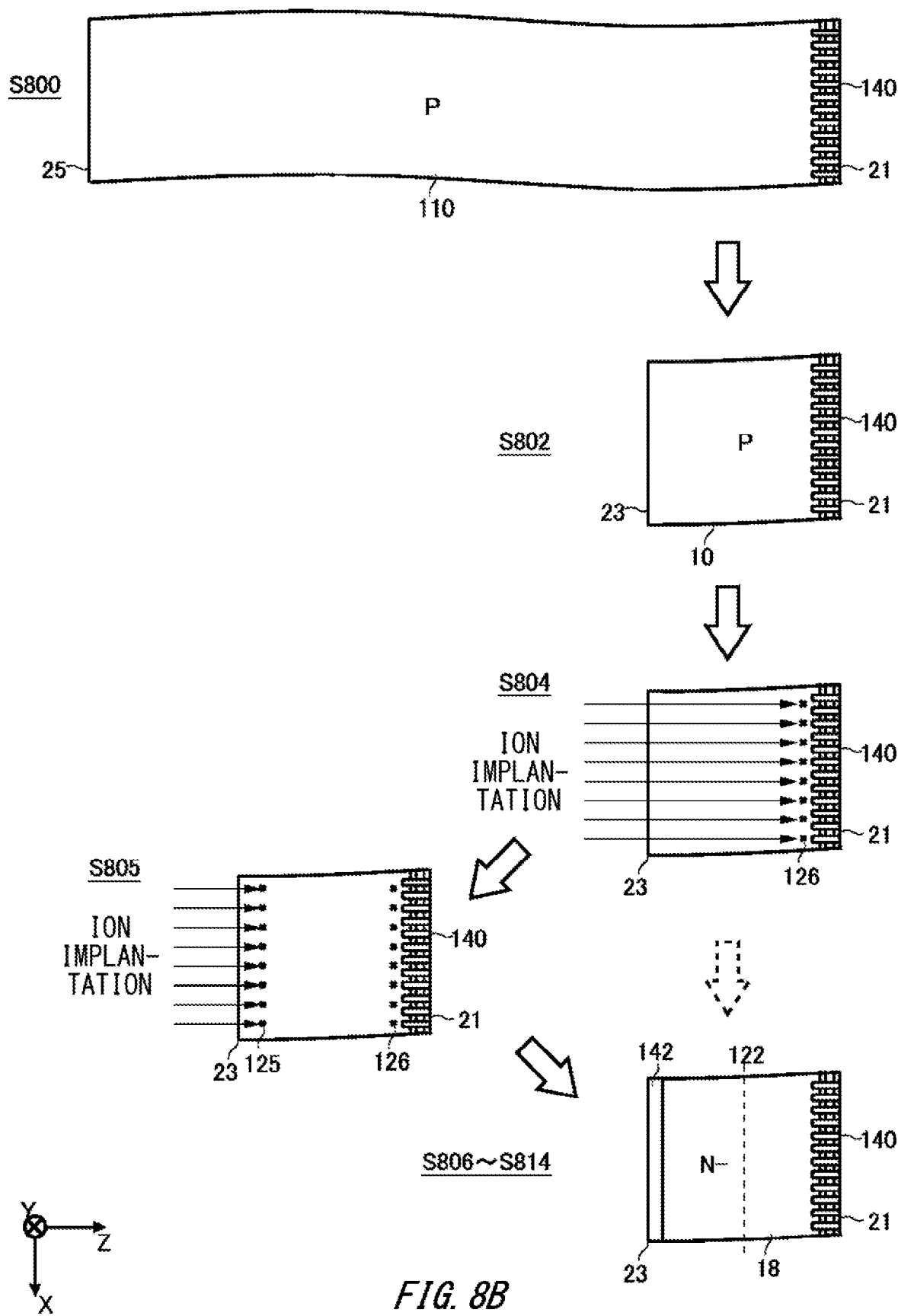
FIG. 8B illustrates a figure describing each step from a preparation step S800 to a heat treatment step S814 for forming a buffer region as shown in FIG. 8A.

FIG. 8B illustrates a figure describing each step from the preparation step S800 to the heat treatment step S814 for forming a buffer region as shown in FIG. 8A. S800 to S814 is described with reference to FIG. 8A and FIG. 8B, and steps after S816 is described with reference to FIG. 8A.

The manufacturing method in this example includes a preparation step S800 for preparing a P-type substrate 110. The P-type substrate 110 in this example is a chip singulated from a wafer. In the preparation step S800, an upper surface structure 140 may be formed on the upper surface 21 side of the P-type substrate 110. The upper surface structure 140 includes at least one of an emitter electrode 52, a trench portion, a well region 11, a base region 14, an emitter region 12 and an accumulation region 16 shown in FIG. 7 and so on.

The manufacturing method in this example includes a thinning step S802 for thinning the P-type substrate 110 to form a semiconductor substrate 10. In the thinning step S802, the P-type substrate 110 may be thinned by grinding the lower surface 25 of the P-type substrate 110 by back grinding, CMP method or the like.

Then, in the implantation step S804, a donor such as a hydrogen ion is implanted at the implantation position 126 from the lower surface 23 of the P-type semiconductor substrate 10. The implantation step S804 is the same step as the implantation step S202 in FIG. 2A and FIG. 2B. Also, after the implantation step S804, the implantation step S805 may be performed. The implantation step S805 is the same step as the implantation step S203 in FIG. 2A and FIG. 2B.

Then, in the heat treatment step S806, the heat treatment is performed on the semiconductor substrate 10, and an N-type region 120 (a drift region 18 in this example) is formed in a region including the center position 122. In the heat treatment step S806, the semiconductor substrate 10 may be housed in an annealing furnace, and the heat treatment may be performed on the entire semiconductor substrate 10. The implantation step S804 and the heat treatment step S806 are an example of the first inverting step. After the N-type region 120 being formed, a lower surface structure 142 is formed on the lower surface 23 side of the semiconductor substrate 10. The lower surface structure 142 includes at least one of a collector electrode 24, a collector region 22, a cathode region 82, and a buffer region 20 shown in FIG. 7. Such a process enables the manufacture of the semiconductor device 100.

When the lower surface structure 142 includes a collector region 22, an acceptor is implanted into the N-type region 120, and a P-type region is formed. In this case, the collector region 22 has the same degree of donor concentration as the drift region 18. The collector region 22 may have a donor in a concentration from 0.5 times to 2 times of the donor concentration in the drift region 18. The process for forming the lower surface structure 142 is one example of the second inverting step.

In the example in FIG. 8A, in an ion implantation step S808 for forming a lower surface structure, an acceptor such as boron is implanted from the lower surface 23 into the region for forming the collector region 22, and a donor such as phosphorus is implanted into the region for forming the cathode region 82. Any of the acceptor implantation and the donor implantation may be performed first. Then, in the heat treatment step S810 for forming the lower surface structure, the heat treatment is performed on the semiconductor substrate 10 to activate the dopant in the cathode region 82 and the collector region 22. In the heat treatment step S810, the cathode region 82 and the collector region 22 may be laser annealed locally.

Then, in the ion implantation step S812 for forming a buffer region, a donor such as proton is implanted into a region for forming a buffer region 20 from the lower surface 23. As mentioned above, the proton may be implanted at different depth positions of the buffer region 20. In this case, the proton may be implanted at different depth positions by sequentially changing the acceleration energy of the proton, thereby sequentially changing the range of the proton. Note that in the implantation step S805, the implanted donor may function as a part of the buffer region 20. Then in the heat treatment step S814 for forming a buffer region, the heat treatment is performed on the semiconductor substrate 10 to activate the donor of the buffer region 20. In the heat treatment step S814, the semiconductor substrate 10 may be housed in an annealing furnace, and the heat treatment may be performed on the entire semiconductor substrate 10.

Then, in the lower surface side electrode forming step S816, a lower surface side electrode is formed on the lower surface 23 of the semiconductor substrate 10. The lower surface side electrode in this example is a collector electrode 24. As mentioned above, the collector electrode 24 may be formed of metal materials including aluminum.

Then, in the wafer dicing step S818, the semiconductor substrate 10 is made as a chip. The wafer dicing step S818 may include a process for singulating the semiconductor substrate 10 in a wafer state, or may include a process for forming a protective film such as polyimide on the surface of the semiconductor substrate 10.

Figure 9A:
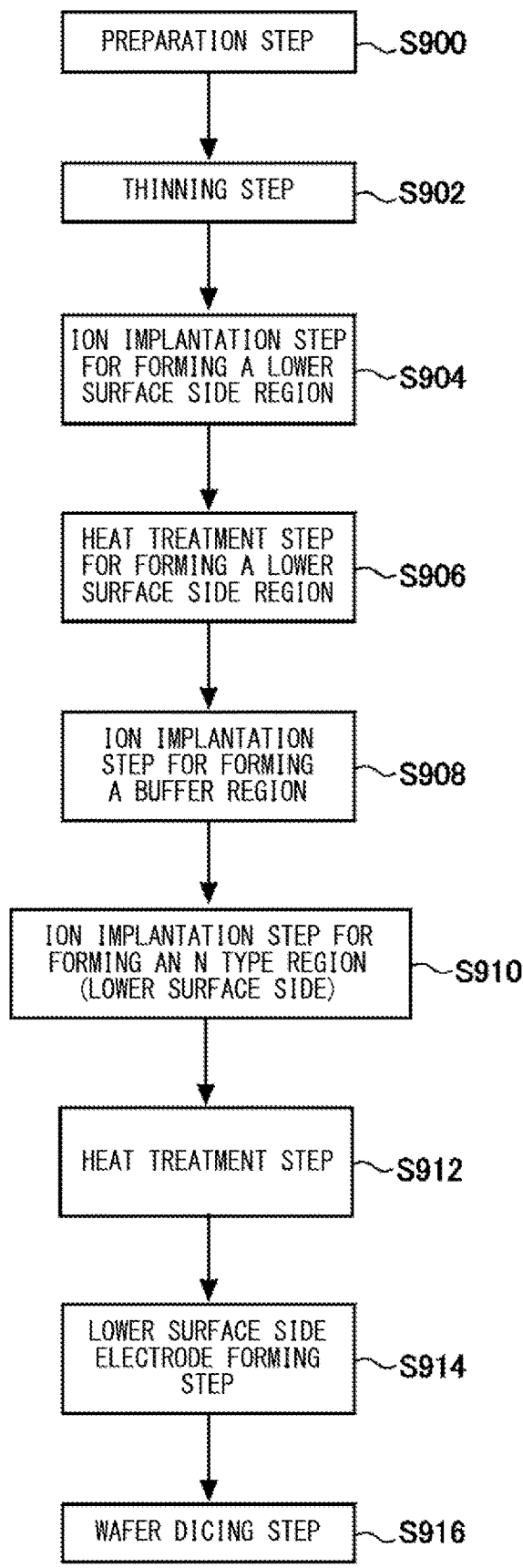
FIG. 9A illustrates another example of the manufacturing method of the semiconductor device 100.

FIG. 9A illustrates another example of a manufacturing method of the semiconductor device 100. The manufacturing method in this example includes a preparation step S900 to a wafer dicing step S916. However, it is not required to include all the steps. According to the structure of the semiconductor device 100, each step can be omitted or changed. The manufacturing method in this example is different from the manufacturing method described in FIG. 8A and FIG. 8B in a point of performing the ion implantation step S910 for forming an N-type region after the ion implantation step S908 for forming a buffer region, and a point of activating the dopant of the N-type region 120 and the buffer region 20 in the heat treatment step S912. The other processes are the same as the processes described in FIG. 8A and FIG. 8B.

In the preparation step S900 and the thinning step S902 in this example, the same processes are performed as the preparation step S800 and the thinning step S802 in FIG. 8A. Then, in an ion implantation step S904 for forming a lower surface side region and a heat treatment step S906 for forming a lower surface side region, a collector region 22 and a cathode region 82 are formed. The ion implantation step S904 and the heat treatment step S906 are the same as the ion implantation step S808 and the heat treatment step S810 in FIG. 8A.

Then, in an ion implantation step S908 for forming a buffer region, a donor is implanted into a region for forming a buffer region 20. The ion implantation step S908 is the same as the ion implantation step S812 in FIG. 8A.

Then, in an ion implantation step S910 for forming an N-type region, a donor such as proton is implanted at the implantation position 126. The implantation step S910 is the same step as the implantation step S804 in FIG. 8A. Then, in the heat treatment step S912, the heat treatment is performed on the semiconductor substrate 10. This enables the activation of the donor of the N-type region 120 and the buffer region 20.

Then, a lower surface side electrode is formed in the lower surface side electrode forming step S914, and the semiconductor substrate 10 is made as a chip in the wafer dicing step S916. The lower surface side electrode forming step S914 and the wafer dicing step S916 are the same as the lower surface side electrode forming step S816 and the wafer dicing step S818 in FIG. 8A. According to this example, the activation of the donor in the buffer region 20 and the activation of the donor in the N-type region 120 are performed in the common heat treatment step S912. Therefore, the manufacturing cost can be reduced.

Figure 9B:
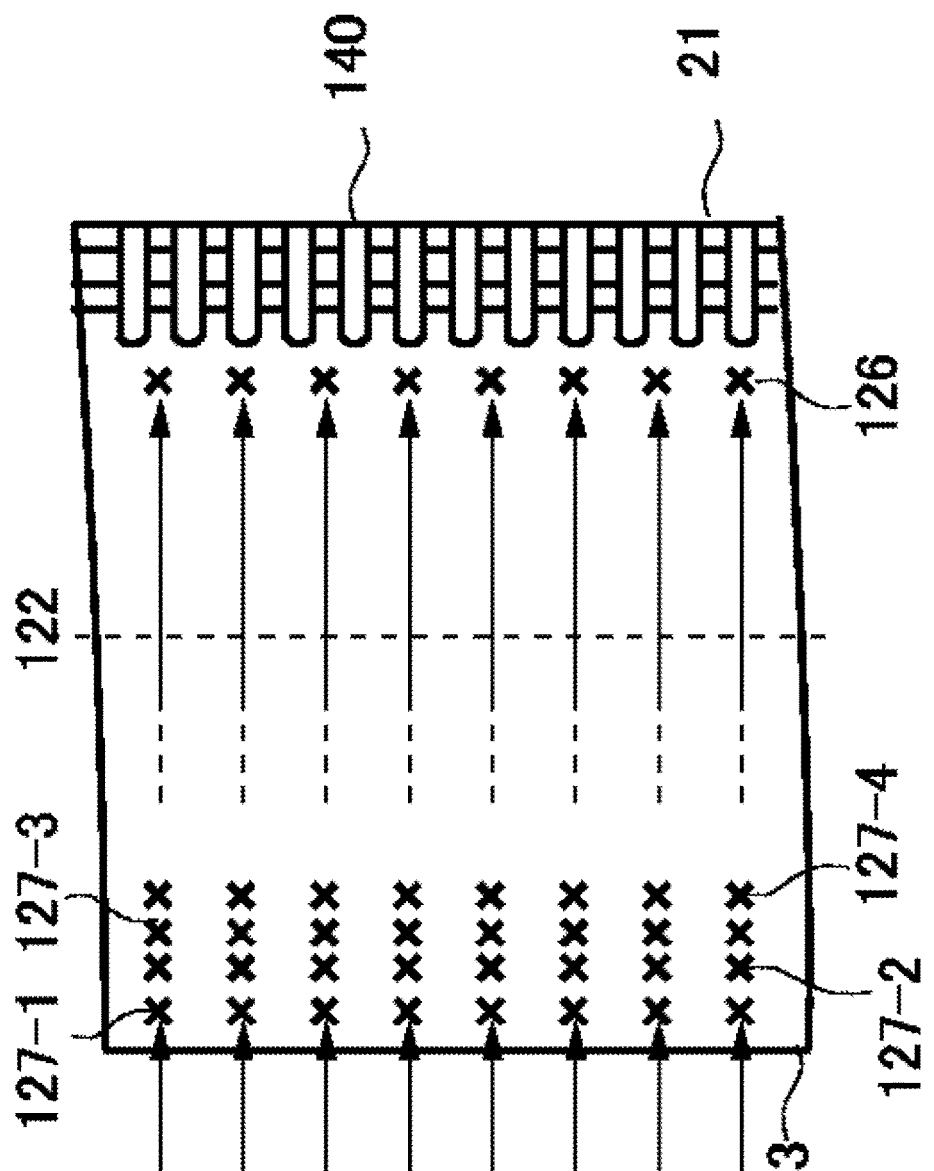
FIG. 9B illustrates an implantation step S908 and an implantation step S910 in FIG. 9A.

FIG. 9B illustrates the implantation step S908 and the implantation step S910 in FIG. 9A. In this example, a hydrogen ion is implanted at the implantation position 126 of the upper surface 21 side of the P-type semiconductor substrate 10 in the implantation step S910, and a hydrogen ion is implanted at the implantation position 127 of the lower surface 23 side in the implantation step S908. The implantation position 127 corresponds to the buffer region 20. On the lower surface 23 side, a plurality of implantation positions 127 may be provided. In this example, on the lower surface 23 side, a hydrogen ion is implanted at each of the four implantation positions 127-1 to 127-4. A hydrogen ion may be implanted from the lower surface 23 of the semiconductor substrate 10 with respect to each of the implantation position 126 and the implantation position 127.

After implanting a hydrogen ion at the implantation position 126 and the implantation position 127, the heat treatment is performed on the semiconductor substrate 10 and hydrogen is diffused in the heat treatment step S912. Since hydrogen diffuses from both of the implantation position 126 and the implantation position 127, the region between the implantation position 126 and the implantation position 127 can be easily inverted to the N type. The implantation position 127 in this example corresponds to the implantation position 125 described in FIG. 2B and so on. Therefore, although the thickness of the semiconductor substrate 10 is large, an N-type region 120 can be easily formed up to the center position 122 of the semiconductor substrate 10. In this example, although there is one implantation position 126 on the upper surface 21 side, a plurality of implantation positions 126 may be arranged on the upper surface 21 side. Each implantation position may be arranged at an equal interval or may be arranged at an unequal interval in the depth direction.

The implantation position 127 in this example has been arranged in a region for forming a buffer region 20. This enables the process for forming a buffer region 20 and the process for forming an N-type region 120 to be at least partially common. Therefore, the semiconductor device 100 can be easily manufactured. In another example, the implantation position 127 may also be positioned differently from the buffer region 20.

Figure 10:
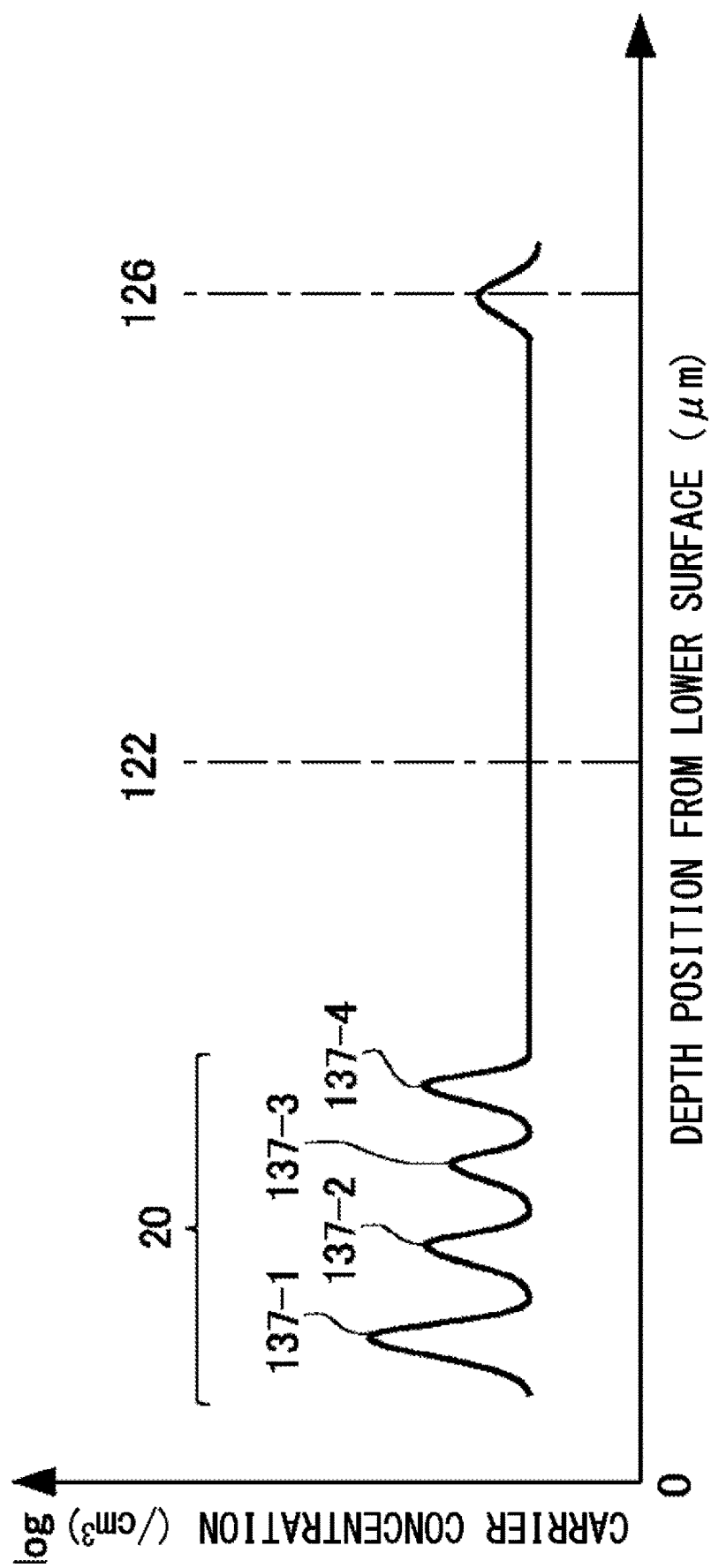
FIG. 10 illustrates one example of carrier concentration distribution in a depth direction from a buffer region 20 to an implantation position 126.

FIG. 10 illustrates one example of the carrier concentration distribution in the depth direction from the buffer region 20 to the implantation position 126. The buffer region 20 in this example has a plurality of carrier concentration peaks 137 in the depth direction. In the example in FIG. 10, the buffer region 20 has four carrier concentration peaks 137-1 to 137-4.

Each of the carrier concentration peaks 137 corresponds to each of the implantation position 127 as shown in FIG. 9B. That is, a hydrogen concentration peak is arranged at the same depth position as each of the carrier concentration peaks 137. As mentioned above, since hydrogen diffuses from both of the implantation position 126 and the implantation position 127, the region between the implantation position 126 and the implantation position 127 can be easily made as the N type. Also, the carrier concentration of the drift region 18 between the implantation position 126 and the implantation position 127 can be made as flat.

In the buffer region 20, the concentration of at least one of the plurality (four in this example) of carrier concentration peaks 137-1 to 137-4 may be set as $1 \times 10^{16}/cm^3$ or more. Alternatively, for at least one of the plurality (four in this example) of carrier concentration peaks 137-1 to 137-4, the dose volume in the ion implantation of a hydrogen ion may be set as $1 \times 10^{15}/cm^2$ or more. As one example, the carrier concentration peak closest to the lower surface 23 is $1 \times 10^{16}/cm^3$ or more, or the dose volume in the ion implantation of a hydrogen ion is $1 \times 10^{15}/cm^2$ or more. In this way, the amount of hydrogen diffusing in the heat treatment step S912 increases, and the region between the implantation position 126 and the implantation position 127 can be further easily inverted to the N type. Therefore, although the thickness of the semiconductor substrate 10 is large, an N-type region 120 can be easily formed up to the center position 122 of the semiconductor substrate 10.

Figure 11A:
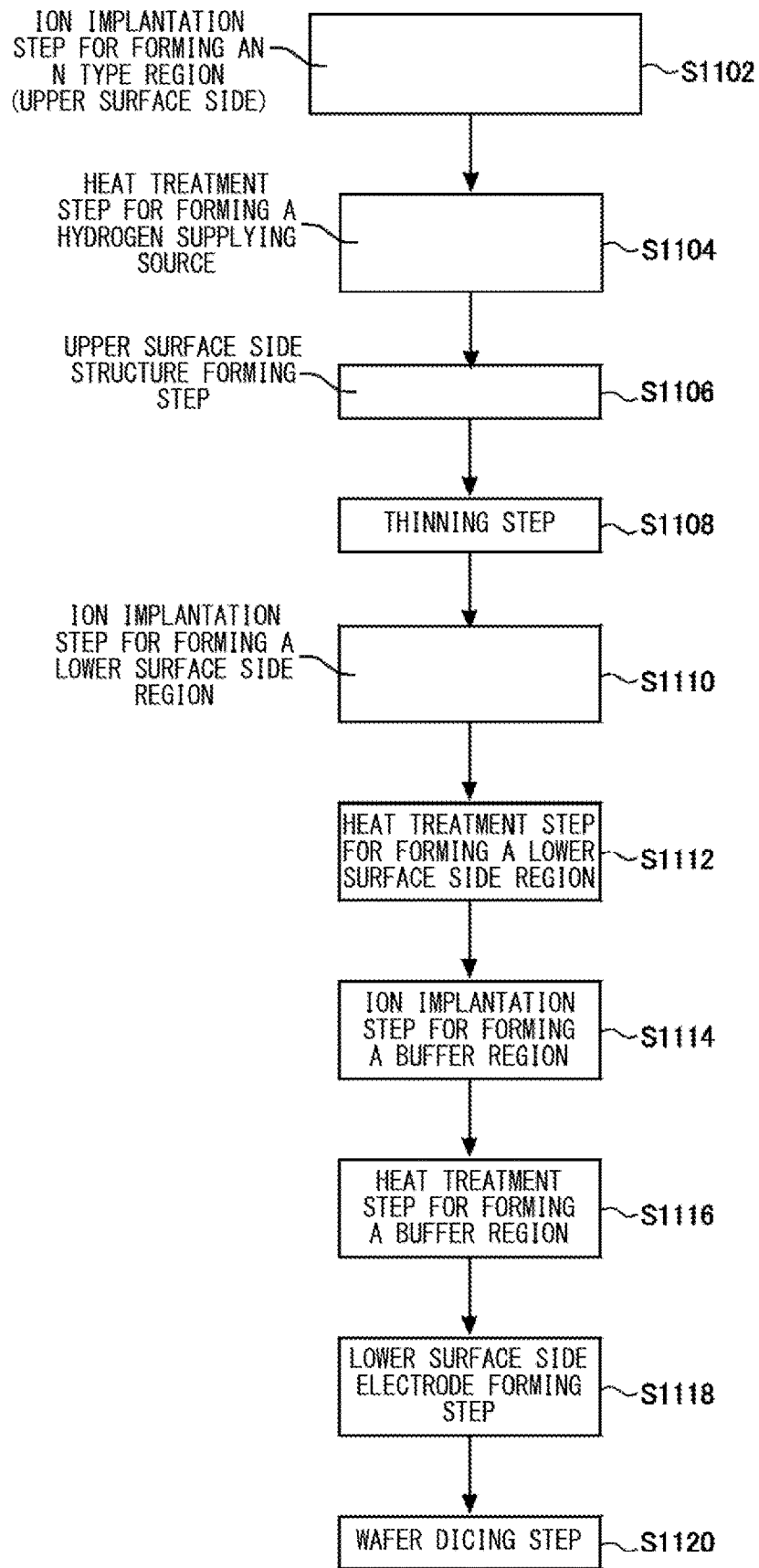
FIG. 11A illustrates another example of the manufacturing method of the semiconductor device 100.

FIG. 11A illustrates another example of the manufacturing method of the semiconductor device 100. The manufacturing method in this example includes an ion implantation step S1102 for forming an N-type region to a wafer dicing step S1120. However, it is not required to include all the steps. According to the structure of the semiconductor device 100, each step can be omitted or changed.

The manufacturing method in this example is different form the manufacturing method described in FIG. 8A and FIG. 8B in a point of forming an N-type region 120 by the ion implantation step S1102 and the heat treatment step S1104 for forming the N-type region before the thinning step S1108. That is, in this example, after forming an N-type region 120 on the P-type substrate 110, a P-type substrate 110 is thinned and a semiconductor substrate 10 is formed. Also, in the ion implantation step S1102, an upper surface structure 140 including an emitter electrode 52 is not formed. The other processes are the same as the processes described in FIG. 8A and FIG. 8B.

Figure 11B:
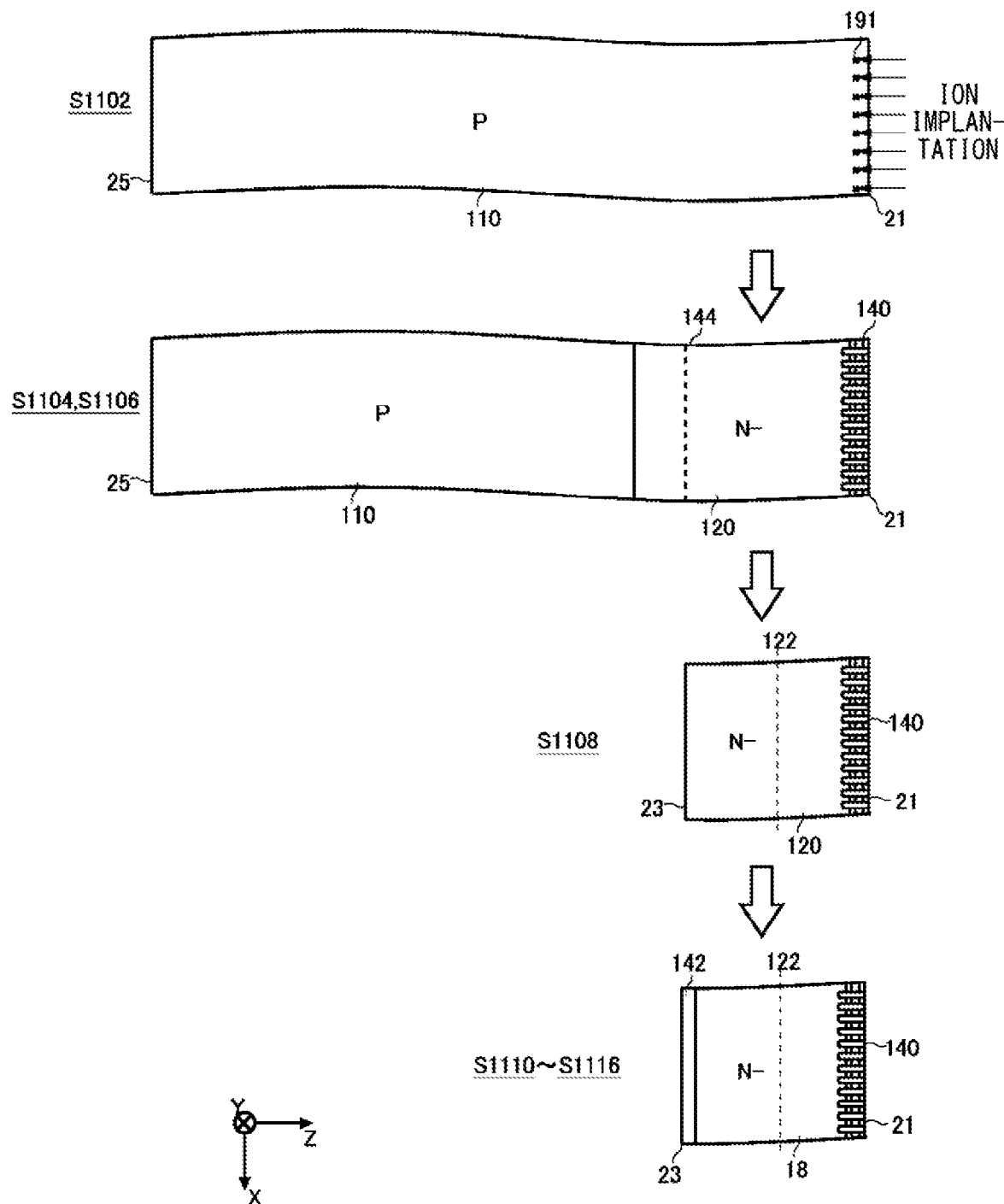
FIG. 11B illustrates a figure describing each step from an ion implantation step S1102 to a heat treatment step S1116 for forming a lower surface side region as shown in FIG. 11A.

FIG. 11B illustrates a figure describing each step from the ion implantation step S1102 for forming a lower surface side region to the heat treatment step S1116 as shown in FIG. 11A. S1102 to S1116 are described with reference to FIG. 11A and FIG. 11B, and steps after S1118 is described with reference to FIG. 11A.

Firstly in the implantation step S1102, a donor is implanted at the implantation position 191 from the upper surface 21 of the P-type substrate 110. The implantation step S1102 may be performed before the formation of the upper surface structure 140, or may be performed after the formation, or may be performed during the formation of the upper surface structure 140. In the example in FIG. 11A and FIG. 11B, the upper surface structure 140 is formed after the implantation step S1102.

In the implantation step S1102, an ion of, for example, sulfur or selenium, is implanted from the upper surface 21. In this case, the implantation position 191 is in the vicinity of the upper surface 21. For example, the implantation position 191 may be arranged in a depth range within 10 μm from the upper surface 21. The implantation position 191 may overlap with the well region 11, or may overlap with the base region 14.

Then, in the heat treatment step S1104, the heat treatment is performed on the P-type substrate 110. In the heat treatment step S1104, the P-type substrate 110 may be housed in an annealing furnace, and the heat treatment may be performed on the entire P-type substrate 110. In this way, an N-type region 120 is formed on the upper surface 21 side of the P-type substrate 110. In the heat treatment step S1104, the heat treatment is performed on the P-type substrate 110 under conditions that allow sulfur or selenium to diffuse sufficiently deep. In the heat treatment step S1104, it is preferable to form the N-type region 120 deeper than the depth position 144 corresponding to the lower surface 23 of the semiconductor substrate 10. For example, in the heat treatment step S1104, the heat treatment for 1 hour or more is performed at a temperature of not lower than 900° C. The heat treatment time may be 10 hours or more, or may be 20 hours or more.

After the heat treatment step S1104, in the upper surface side structure forming step S1106, an upper surface structure 140 is formed. The upper surface structure 140 includes at least one of an emitter electrode 52, a trench portion, a well region 11, a base region 14, an emitter region 12 and an accumulation region 16 as shown in FIG. 7 and so on.

Then, in the thinning step S1108, the P-type substrate 110 is thinned and a semiconductor substrate 10 is formed. In the thinning step S1108, the lower surface 25 of the P-type substrate 110 may be ground until the N-type region 120 is exposed on the lower surface 23 of the semiconductor substrate 10.

Then, in a process from the ion implantation step S1110 for forming a lower surface side region to the heat treatment step S1116 for forming a buffer region, a lower surface structure 142 is formed. The ion implantation step S1110 and the heat treatment step S1112 for forming a lower surface side region are the same as the ion implantation step S808 for forming a lower surface side region and the heat treatment step S810 in FIG. 8A. The ion implantation step S1114 and the heat treatment step S1116 for forming a buffer region are the same as the ion implantation step S812 for forming a buffer region and the heat treatment step S814 in FIG. 8A.

Then, a lower surface side electrode is formed in the lower surface side electrode forming step S1118, and the semiconductor substrate 10 is made as a chip in the wafer dicing step S1120. The lower surface side electrode forming step S1118 and the wafer dicing step S1120 are the same as the lower surface side electrode forming step S816 and the wafer dicing step S818 in FIG. 8A.

This enables the formation of the semiconductor device 100. Note that in S1102, a hydrogen ion may be implanted. A hydrogen ion can be implanted easily to a deeper position than sulfur or selenium. In the implantation step S1102, a hydrogen ion may be implanted to a deeper position than the depth position 144 from the upper surface 21 of the P-type substrate 110. This allows an N-type region 120 deeper than the depth position 144 to be easily formed.

Figure 11C:
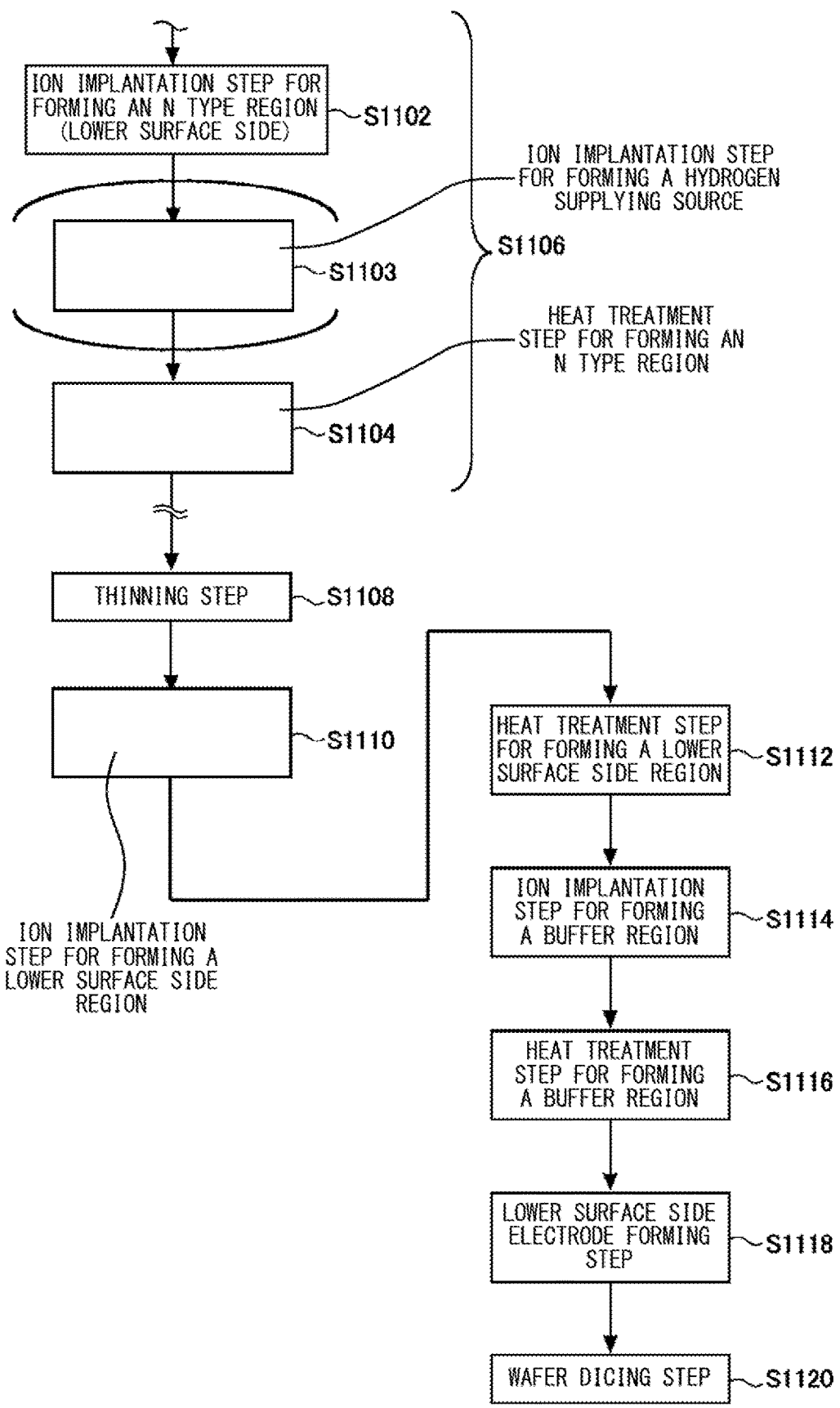
FIG. 11C illustrates another example of the manufacturing method of the semiconductor device 100.

FIG. 11C illustrates another example of the manufacturing method of the semiconductor device 100. It is different from the example in FIG. 11A in a point of performing the ion implantation step S1102 and the heat treatment step S1104 for forming an N-type region during the upper surface side structure forming step S1106. The process after the thinning step S1108 is the same as the example in FIG. 11A.

Figure 11D:
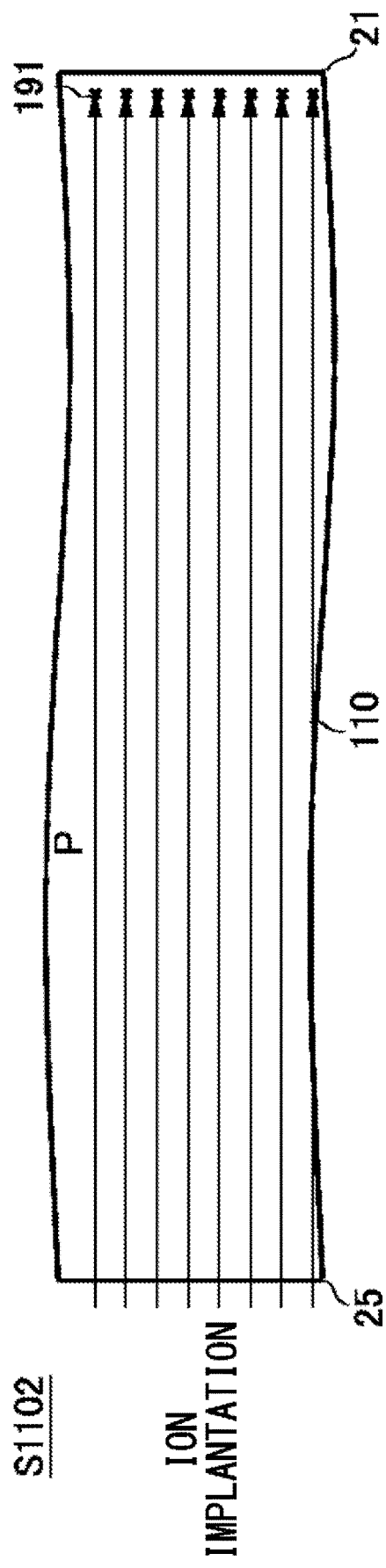
FIG. 11D illustrates a figure describing the ion implantation step S1102 shown in FIG. 11C.

FIG. 11D illustrates a figure describing the ion implantation step S1102 as shown in FIG. 11C. In this example, during the upper surface side structure forming step S1106, a hydrogen ion such as proton are implanted at the implantation position 191 from the lower surface 25 of the P-type substrate 110. In FIG. 11D, the upper surface structure 140 is omitted. The implantation position 191 is in the vicinity of the upper surface 21. The implantation position 191 may be positioned corresponding to the well region 11. After the ion implantation step S1102, in the heat treatment step S1104, the heat treatment may be performed on the P-type substrate 110. In this way, the N-type region 120 is formed. After the upper surface side structure forming step S1106, the process after the thinning step S1108 is performed. After the ion implantation step S1102, before the heat treatment step S1104, there may be an implantation step S1103 for implanting a hydrogen ion for a hydrogen supplying source from the lower surface 25 on the lower surface 25 side below the implantation position 191. In the implantation step S1103, a hydrogen ion may be implanted into the region ground by the thinning step S1108, or a hydrogen ion may be implanted into the region that remains not to be ground by the thinning step S1108.

In the heat treatment step S1104, a doping region other than the N-type region 120, which is included in the upper surface structure 140, may be activated. By activating the plurality of regions in the heat treatment step S1104, the manufacturing process can be simplified.

Figure 12A:
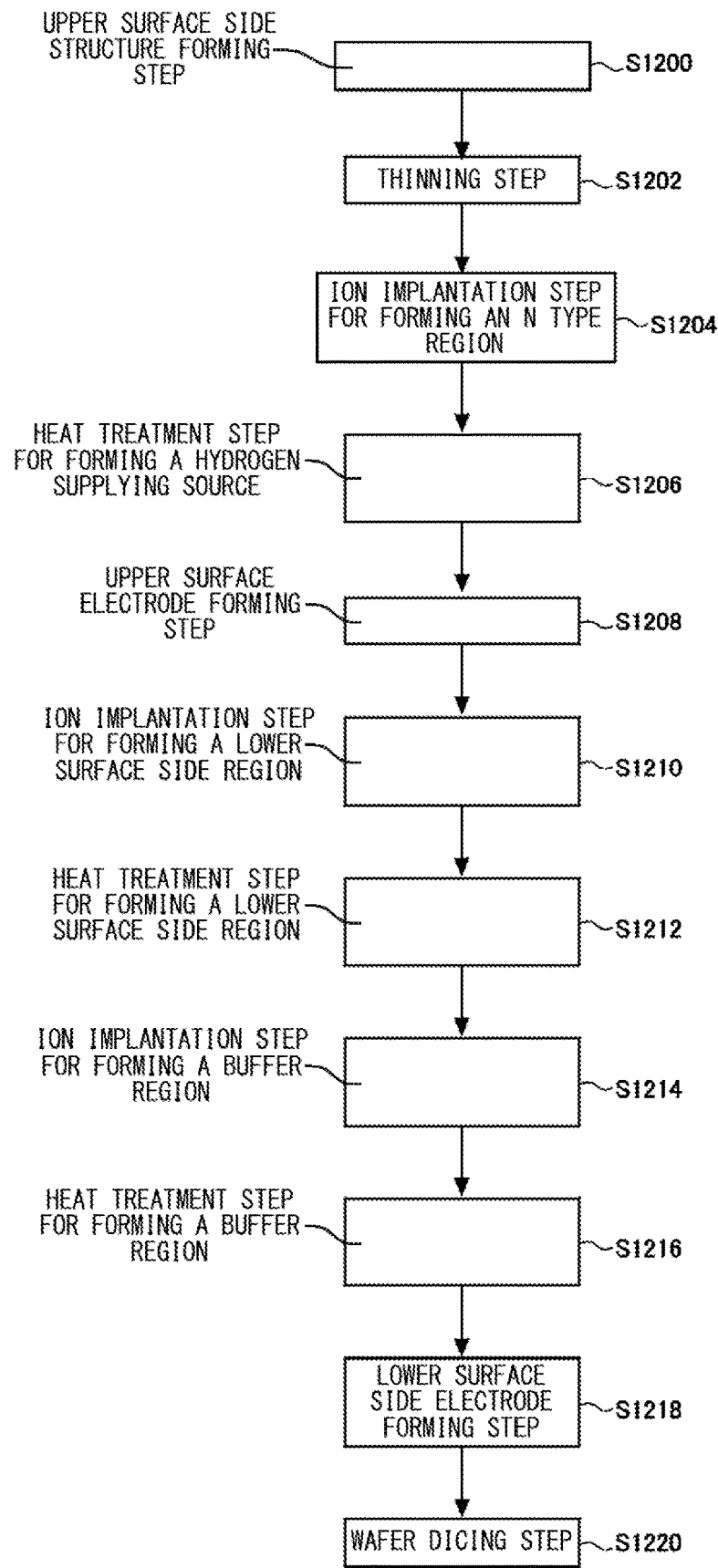
FIG. 12A illustrates another example of the manufacturing method of the semiconductor device 100.

FIG. 12A illustrates another example of the manufacturing method of the semiconductor device 100. The manufacturing method in this example includes a upper surface side structure forming step S1200 to a wafer dicing step S1220. However, it is not required to include all the steps. According to the structure of the semiconductor device 100, each step can be omitted or changed.

Figure 12B:
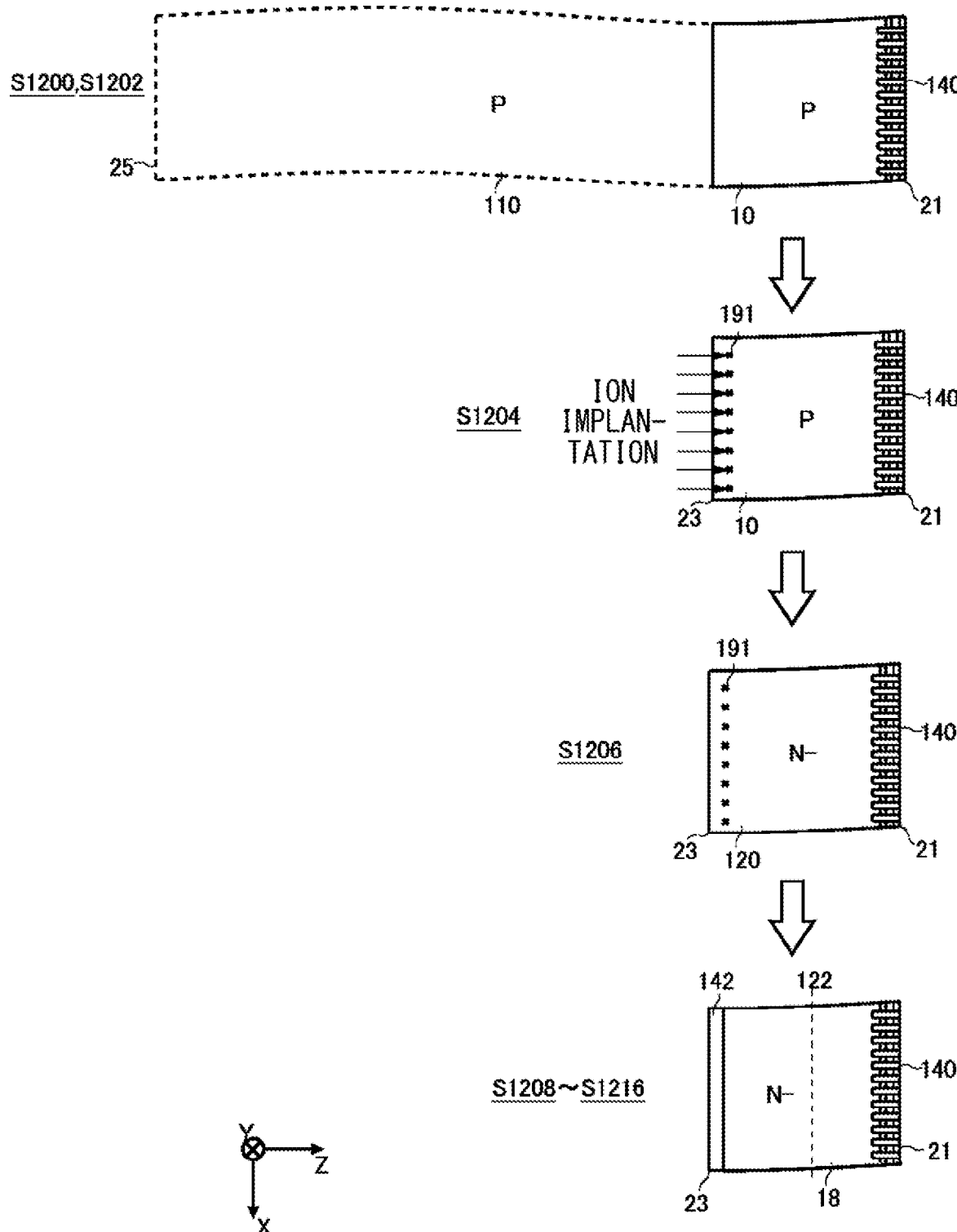
FIG. 12B illustrates a figure describing each step from a thinning step S1202 to a heat treatment step S1216 for forming a buffer region as shown in FIG. 12A.

FIG. 12B illustrates a figure describing each step from the upper surface side structure forming step S1200 to the heat treatment step configured to form a buffer region S1216 as shown in FIG. 12A. S1200 to S1216 are described with reference to FIG. 12A and FIG. 12B, and steps after S1218 are described with reference to FIG. 12A.

In the manufacturing method in this example, the P-type substrate 110 is thinned from the lower surface 23 of the semiconductor substrate 10 before the formation of the upper surface electrode of the upper surface structure 140. Subsequently, a heavier element than phosphorus such as sulfur or selenium is implanted from the lower surface 23 of the semiconductor substrate 10, and the heat treatment is performed, then an N-type region 120 is formed. After the formation of the N-type region 120, the upper surface electrode is formed. After the formation of the upper surface electrode, the process after the ion implantation step S1210 for forming a lower surface structure is performed. The process after the ion implantation step S1210 is the same as the process after the ion implantation step S1110 in FIG. 11A.

Firstly, in the upper surface side structure forming step S1200, an upper surface structure 140 other than the upper surface electrode is formed on the upper surface 21 of the P-type substrate 110. Then, in the thinning step S1202, the lower surface 25 of the P-type substrate 110 is ground, and a thinned semiconductor substrate 10 is formed. Then, in the ion implantation step S1204, an ion or a donor such as selenium is implanted from the lower surface 23 of the semiconductor substrate 10 to the implantation position 191.

The implantation position 191 in this example is arranged on the lower surface 23 side of the semiconductor substrate 10. The implantation position 191 is in the vicinity of the lower surface 23. For example, the implantation position 191 may be arranged in a depth range within 10 μm from the lower surface 23. The implantation position 191 may also be arranged within 1 μm, or may be arranged within 0.5 μm from the lower surface 23.

Then, in the heat treatment step S1206, the heat treatment is performed on the semiconductor substrate 10, and sulfur or selenium diffuses, then an N-type region 120 is formed. In the heat treatment step S1206, the semiconductor substrate 10 may be housed in an annealing furnace, and the heat treatment may be performed on the entire semiconductor substrate 10. In the heat treatment step S1206, the heat treatment is performed on the semiconductor substrate 10 under conditions that allow sulfur or selenium to diffuse sufficiently deep. In the heat treatment step S1206, the N-type region 120 is formed deeper than the center position 122 of the semiconductor substrate 10. For example, in the heat treatment step S1206, the heat treatment for 1 hour or more is performed at a temperature of not lower than 900° C. The heat treatment time may be 10 hours or more, or may be 20 hours or more.

After the formation of the N-type region 120, the upper surface electrode of the emitter electrode 52 and so on is formed in the upper surface electrode forming step S1208. In FIG. 12B, the upper surface electrode is omitted. Also, after the upper surface electrode forming step S1208, the process after the ion implantation step S1210 for forming a lower surface structure is performed, and a semiconductor device 100 is manufactured. According to this example, since an N-type region 120 is formed on the thinned semiconductor substrate 10, a heavy element such as sulfur or selenium is used, thereby the N-type region 120 can be easily formed. Also, since the N-type region 120 is formed before the upper surface electrode and the lower surface structure 142, the thermal history can be less than the upper surface electrode and the lower surface structure 142.

Figure 13:
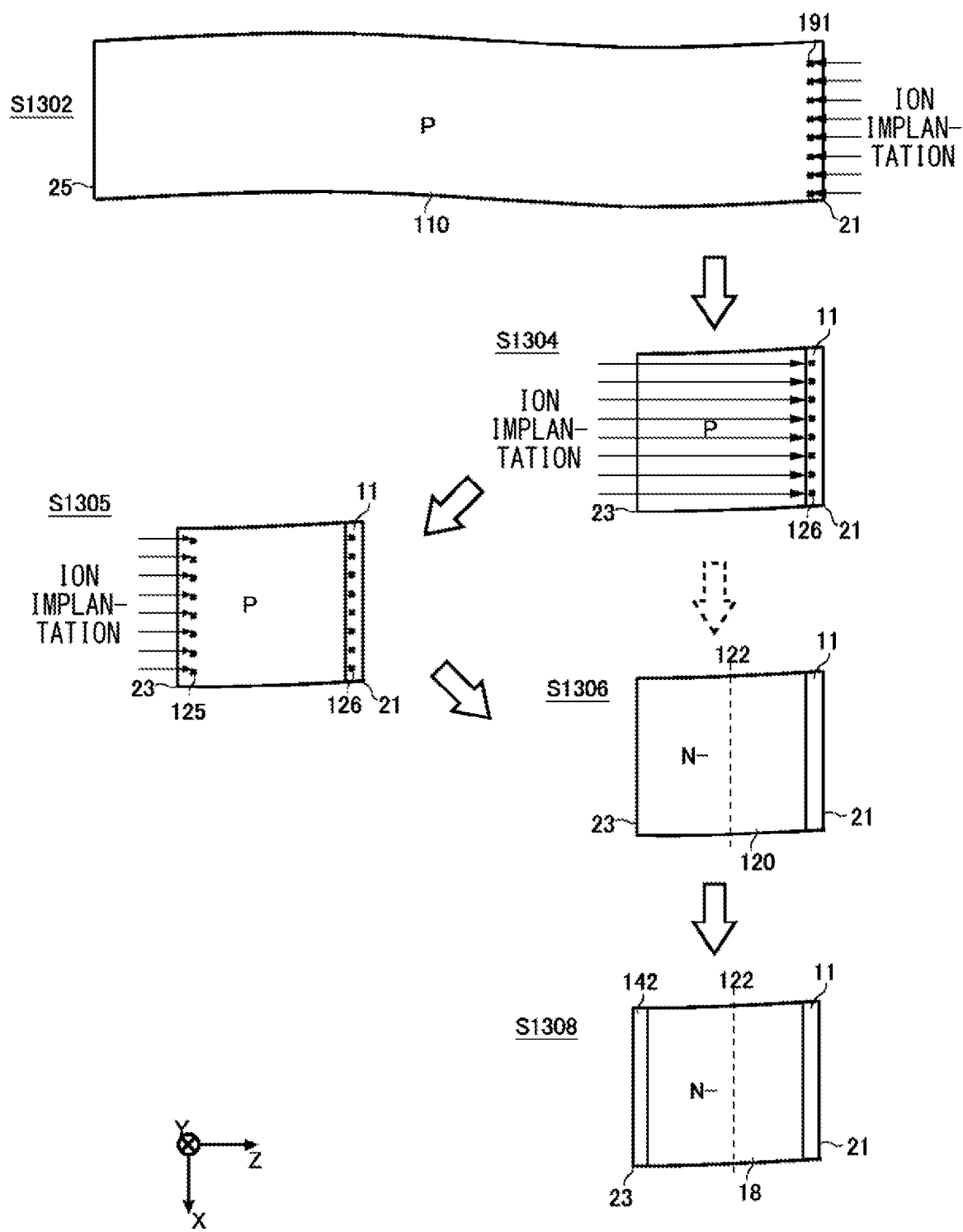
FIG. 13 illustrates another example of a method for forming an N-type region 120.

FIG. 13 illustrates another example of a method for forming an N-type region 120. In this example, a donor is implanted at an approximately the same depth position from both of the upper surface 21 side and the lower surface 23 side of the semiconductor substrate 10. The forming method in this example may be applied to the manufacturing method shown in FIG. 8A or FIG. 9A. The processes other than the ion implantation step and the heat treatment step configured to form the N-type region 120 are the same as the processes described in FIG. 8A or FIG. 9A.

Firstly, in the first implantation step S1302, a donor is implanted at the implantation position 191 from the upper surface 21 of the P-type substrate 110. The first implantation step S1302 may be performed before the formation of the upper surface structure 140, or may be performed after the formation, or may be performed during the formation of the upper surface structure 140. When the forming method in this example is applied to the manufacturing method in FIG. 8A or FIG. 9A, the first implantation step S1302 may be performed in the preparation step S800 or S900. The implantation position 191 may be positioned corresponding to the well region 11.

In the first implantation step S1302, an ion of, for example, sulfur or selenium, is implanted from the upper surface 21. In this case, the implantation position 191 is in the vicinity of the upper surface 21. For example, the implantation position 191 may be arranged in a depth range within 10 μm from the upper surface 21. The implantation position 191 in this example is configured to overlap with the well region 11. By the heat treatment after implanting the donor, a well region 11 is formed. The heat treatment for forming the well region 11 may be performed in the preparation step S800 or S900 for forming the upper surface structure 140. In FIG. 13, the upper surface structure 140 other than the well region 11 is omitted.

After the upper surface structure 140 including the well region 11 have been formed, the P-type substrate 110 is thinned, and the semiconductor substrate 10 is formed. Note that the first implantation step S1302 may be performed after the P-type substrate 110 have been thinned. Then, in the second implantation step S1304, a hydrogen ion is implanted at the implantation position 126 from the lower surface 23 side of the semiconductor substrate 10. The second implantation step S1304 corresponds to the ion implantation step S804 or S910 for forming an N-type region in FIG. 8A or FIG. 9A. The implantation position 126 is arranged in the well region 11. The implantation position 126 may be arranged in a range of the full width at half maximum at the peak of the carrier concentration distribution in the depth direction of the well region 11.

Similar to the example in FIG. 2A or FIG. 8A, hydrogen ion implantation step S1305 for forming the hydrogen supplying source may be performed before the heat treatment step S1306. In S1305, a hydrogen ion is implanted at the implantation position 125 of the lower surface 23 side of the semiconductor substrate 10.

Then, in the heat treatment step S1306, the heat treatment is performed on the P-type substrate 110. In this way, an N-type region 120 (including the well region 11 in this example) can be formed from the lower surface 23 to the upper surface 21 of the semiconductor substrate 10. Then, in the lower surface forming step S1308, a lower surface structure 142 is formed. The lower surface forming step S1308 includes an ion implantation step and a heat treatment step configured to form a lower surface side region, and an ion implantation step and a heat treatment step configured to form a buffer region in FIG. 8A or FIG. 9A. After the lower surface forming step S1308, the lower surface side electrode forming step S816 described in FIG. 8A and the wafer dicing step S818 are performed. This enables the formation of the semiconductor device 100.

In each example of FIG. 8A to FIG. 13, a vacancy-type defect may be generated by implanting a hydrogen ion. In contrast, a vacancy-type defect may be generated by irradiating charged particles other than a hydrogen ion, such as helium ions and electron beams, onto the semiconductor substrate 10. In this case, a hydrogen ion is also implanted into the semiconductor substrate 10. However, a hydrogen ion may also be implanted in the vicinity of the irradiated surface, such as the lower surface 23. In this case, the hydrogen ion may be implanted at the implantation position 125. By using electron beams, the vacancy-type defect density distribution inside the semiconductor substrate 10 can be made uniform.

Figure 14:
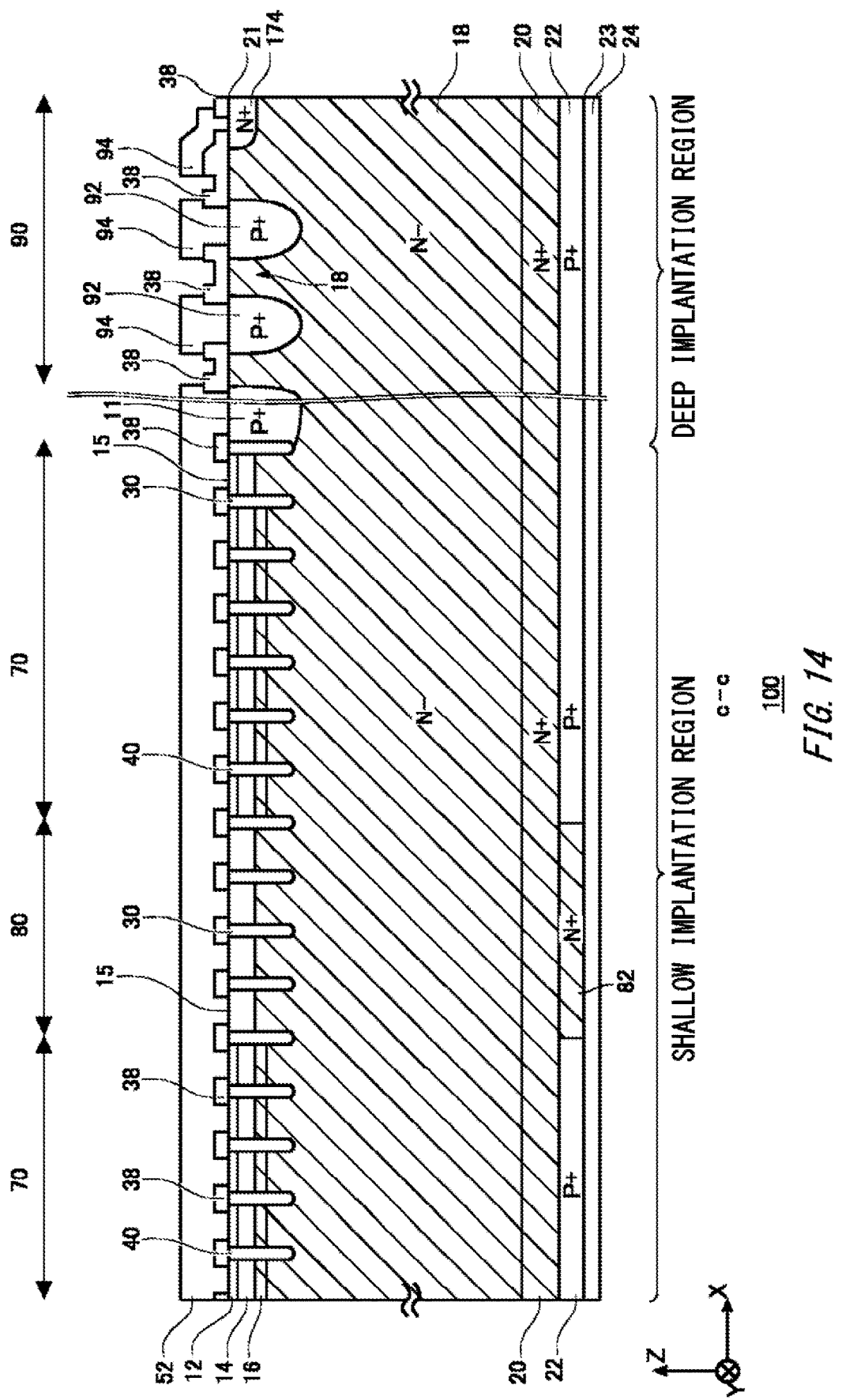
FIG. 14 illustrates one example of a cross-section C-C in FIG. 5.

FIG. 14 illustrates one example of the cross-section C-C in FIG. 5. The cross-section c-c is the XZ plane that passes through the edge termination structure portion 90, the transistor portion 70 and the diode portion 80. Note that an outer circumferential gate runner 130 is arranged between the edge termination structure portion 90 and the transistor portion 70, but it is omitted in FIG. 14. The structures of the transistor portion 70 and the diode portion 80 are the same as the semiconductor device 100 described in FIG. 1 to FIG. 13.

The semiconductor device 100 in this example has regions that are different from each other in the range of the depth direction in which the N-type region 120 is provided. For example, in some regions, the N-type region 120 is provided up to the position where it is in contact with the upper surface 21, while in other regions, the N-type region 120 is provided up to the position where it is away from the upper surface 21. In FIG. 14, the region where the N-type region 120 is provided is hatched with diagonal lines. The N-type region 120 in this example is a drift region 18. For example, the ranges of the depth direction, in which the N-type region 120 is provided, in the edge termination structure portion 90 and the active portion 160, may be different. That is, the depth positions for implanting the donor in the edge termination structure portion 90 and the active portion 160 may be different.

The edge termination structure portion 90 is provided with a plurality of guard rings 92, a plurality of field plates 94 and a channel stopper 174. In the edge termination structure portion 90, in a region in contact with the lower surface 23, the collector region 22 may be provided. Each guard ring 92 may be provided to enclose the active portion 160 on the upper surface 21. The plurality of guard rings 92 may have a function of extending the depletion layer generated in the active portion 160 to an outside of the semiconductor substrate 10. This makes it possible to prevent the electric field concentration inside the semiconductor substrate 10 and possible to improve the breakdown voltage of the semiconductor device 100.

The guard ring 92, in this example, is a P+ type semiconductor region formed by the ion implantation in the vicinity of the upper surface 21. A depth of a bottom portion of the guard ring 92 may be deeper than depths of bottom portions of the gate trench portion 40 and the dummy trench portion 30.

An upper surface of the guard ring 92 is covered with the interlayer dielectric film 38. The field plate 94 is formed of a conductive material such as metal or polysilicon. The field plate 94 may be formed of the same material as the gate metal layer 50 or the emitter electrode 52. The field plate 94 is provided on the interlayer dielectric film 38. The field plate 94 is connected to the guard ring 92 through a through hole provided in the interlayer dielectric film 38.

The channel stopper 174 is provided to expose on the upper surface 21 and the side wall in the vicinity of the edge side 102 of the semiconductor substrate 10. The channel stopper 174 is an N-type region whose doping concentration is higher than the drift region 18. The channel stopper 174 has a function of terminating the depletion layer generated in the active portion 160 in the vicinity of the edge side 102 of the semiconductor substrate 10.

In this example, between the guard rings 92, an N-type region 120 (a drift region 18 in this example) including an acceptor with a concentration of 0.001 times or more, but less than 0.9 times of the carrier concentration may be provided. That is, the region between the guard rings 92 is the region where the P-type region on the P-type substrate is inverted to the N-type by the donor. That is, in at least some regions of the edge termination structure portion 90, the N-type region 120 (drift region 18) is provided up to the position where it is in contact with the upper surface 21. For example, the edge termination structure portion 90 is a deep implantation region where the N-type region 120 is formed by diffusing hydrogen implanted from the lower surface 23 to the vicinity of the upper surface 21.

On the other hand, the N-type region 120 (drift region 18, accumulation region 16, buffer region 20 and cathode region 82 in this example) of the active portion 160 in this example are formed at a separated position from the upper surface 21. Specifically, the N-type region 120 of the active portion 160 is provided below the base region 14. For example, the active portion 160 is a shallow implantation region where the N-type region 120 is formed by diffusing hydrogen implanted from the lower surface 23 to a shallower position than the deep implantation region. In this way, by controlling the depth position at which the donor is implanted, the depth range at which the N-type region 120 is formed can be easily controlled. At least a part of the base region 14 may be the region where the P-type region remains in the P-type substrate.

Figure 15:
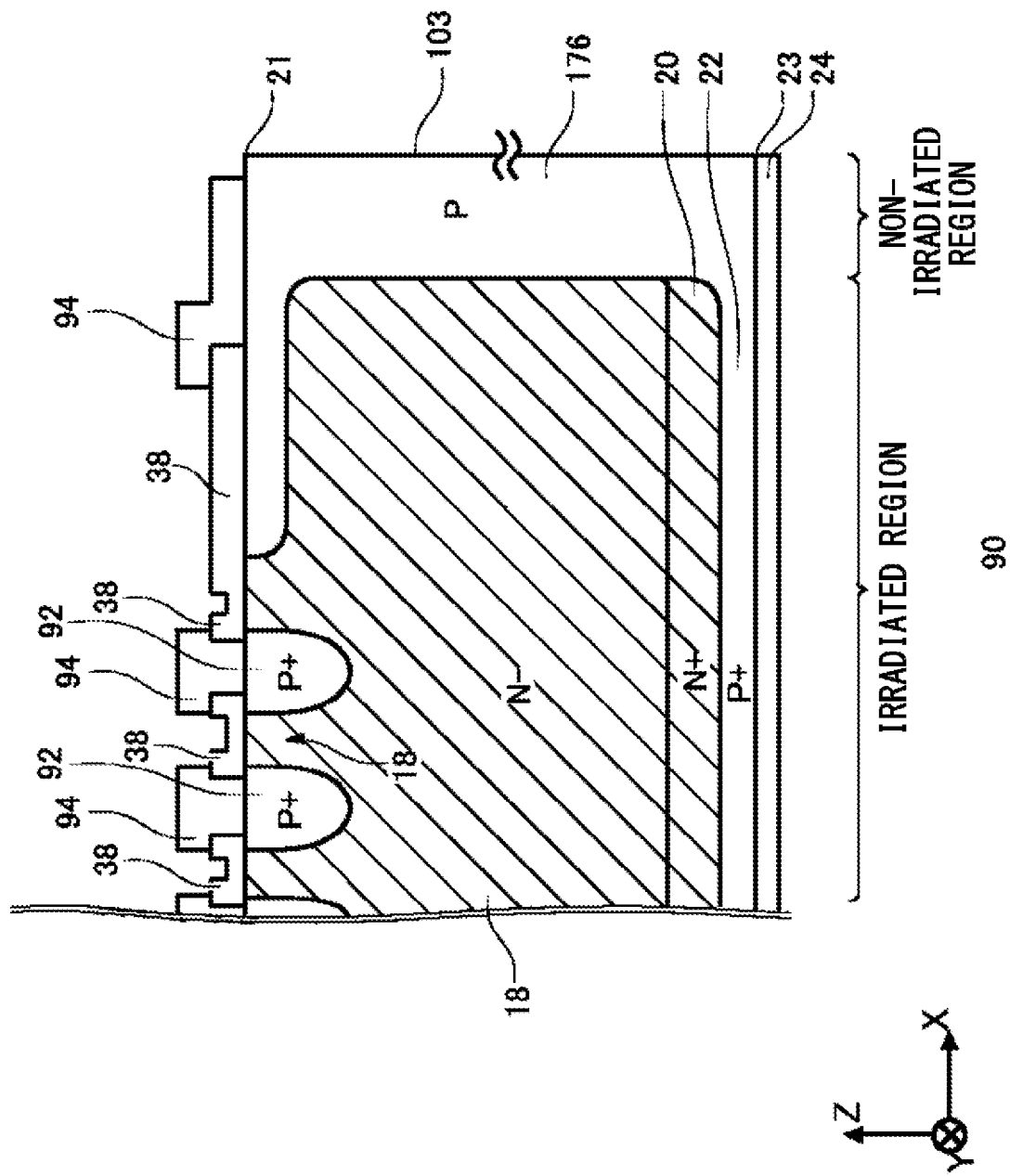
FIG. 15 illustrates one example of a cross section of an edge termination structure portion 90 in the vicinity of an edge side 102 of the semiconductor substrate 10.

FIG. 15 illustrates one example of the cross section of the edge termination structure portion 90 in the vicinity of the edge side 102 of the semiconductor substrate 10. The edge termination structure portion 90 in this example includes a P-type termination region 176 instead of the channel stopper 174. The other structures are the same as the example shown in FIG. 14.

The termination region 176 is formed throughout the entire side wall 103 of the semiconductor substrate 10 on the edge side 102. That is, on the side wall 103 of the semiconductor substrate 10, only the termination region 176 is exposed, and the N-type region is not exposed. Since the side wall 103 of the semiconductor substrate 10 is a region the wafer has been diced, there is a vacancy-type defect in a high concentration. Therefore, if a PN junction exists on the side wall 103 of the semiconductor substrate 10 and a depletion layer is generated, the leakage current will increase. By providing the termination region 176, the leakage current due to a vacancy-type defect on the side wall 103 of the semiconductor substrate 10 can suppressed.

The semiconductor device 100 in this example has, in a top view, an irradiated region where the N-type region 120 is provided by donor irradiation, and a non-irradiated region where the P-type region of the P-type substrate remains without donor irradiation. In the example in FIG. 15, the region provided by the termination region 176 is a non-irradiated region, and the region other than the termination region 176 is an irradiated region. This enables a P-type region, such as the termination region 176, to be provided easily. The N-type region 120 (such as the drift region 18) in this example is provided in a range that is not in contact with the side wall 103.

FIG. 16 to FIG. 25 illustrate figures describing an example of a method to determine the preferred range of the bulk-acceptor concentration and the donor concentration in the N-type region 120. The example described in FIG. 16 to FIG. 25 may be applied to any example in FIG. 1 to FIG. 15. In this example, the bulk-acceptor concentration and the donor concentration are set so that even if the bulk-acceptor concentration has varied, the final donor concentration in the N-type region 120 will become a relatively stable concentration.

In this example, the specification value of the bulk-acceptor concentration is referred to as $N_{A0}$, and the actual bulk-acceptor concentration is referred to as $N_{Are}$. The specification value of the bulk-acceptor concentration is a specification value specified by the semiconductor wafer manufacturer. If there is a width of specification values, the median value of the specification values may be used. The bulk-acceptor concentration is given by $N_{Are}=1/q\mu\rho$ for a resistivity $\rho$ determined by the bulk-acceptor concentration of the bulk acceptor such as boron. q is the elementary charge, and $\mu$ is the mobility of a hole in the semiconductor substrate 10.

The concentration of the hydrogen donor (VOH defect) is referred to as $N_H$. The hydrogen donor concentration $N_H$ can be precisely controlled by the concentration of a hydrogen ion implanted into the semiconductor substrate 10 or the like. On the other hand, the variation of the bulk-acceptor concentration $N_{Are}$ is relatively large. Therefore, the variation of the hydrogen donor concentration $N_H$ is small to a negligible degree compared to the variation of the bulk-acceptor concentration. In this example, the variation of the hydrogen donor concentration $N_H$ is referred to as 0.

The target value of the final donor concentration of the N-type region 120 is referred to as $N_{F0}$. Also, actually obtained final donor concentration of the N-type region 120 is referred to as $N_{Fre}$. All the concentrations mentioned above are a concentration per unit volume (/cm³). Also, these concentrations may use the concentration at the center position, or may use the average value in the depth direction of the N-type region 120.

The final target value $N_{F0}$ of the donor concentration is given by the following expression, since it is the difference between the hydrogen donor concentration $N_H$ and the specification value $N_{A0}$ of the bulk-acceptor concentration.

$$N_{F0}=N_H-N_{A0} \quad \text{[Expression 1]}$$

On the other hand, since the actual donor concentration $N_{Fre}$ is the difference between the hydrogen donor concentration $N_H$ and the actual bulk-acceptor concentration $N_{Are}$, it is given by the following expression.

$$N_{Fre}=N_H-N_{Are} \quad \text{[Expression 2]}$$

The parameter κ is defined by the following expression.

$$\kappa=N_{Are}/N_{A0} \quad \text{[Expression 3]}$$

The parameter κ is the ratio of the actual bulk-acceptor concentration $N_{Are}$ to the specification value $N_{A0}$, and it is indicated that the further away from 1, the more the actual bulk-acceptor concentration $N_{Are}$ deviates from the specification value $N_{A0}$. Note that κ is referred to as the ratio of the actual bulk-acceptor concentration $N_{Are}$ to the specification value $N_{A0}$, so 0<κ.

The parameter θ is defined by the following expression.

$$\theta=N_{Fre}/N_{F0} \quad \text{[Expression 4]}$$

The parameter θ is the ratio of the actual donor concentration $N_{Fre}$ to the target value $N_{F0}$, and it is indicated that the further away from 1, the more the actual donor concentration $N_{Fre}$ deviates from the target value $N_{F0}$. That is, if θ is sufficiently close to 1, the actual donor concentration $N_{Fre}$ is almost independent of κ, even when the actual bulk-acceptor concentration $N_{Are}$ deviates by a factor of κ from the specification value $N_{A0}$, indicating that the actual donor concentration $N_{Fre}$ is approximately identical to the target value $N_{F0}$. Note that θ is referred to as the ratio of the actual donor concentration $N_{Fre}$ to the target value $N_{F0}$, so 0<θ.

Herein, in the case of semiconductor substrate being doped with an N-type dopant, the resistivity variation of a silicon wafer manufactured by the FZ method, where the variation of the bulk-donor concentration $N_{F0}$ is relatively small, is generally as follows. Neutron irradiation FZ wafer±8% (ratio: 0.92 to 1.08); Gas-doped FZ wafer±12% (ratio: 0.88 to 1.12). Using these variations as a reference, for example, if θ is from 0.85 to 1.15, the variation in the final donor concentration $N_{Fre}$ becomes the same degree as the bulk-donor concentration of the silicon wafer in the FZ method mentioned above. In the present specification, as one example, the allowable value of θ is from 0.85 to 1.15.

The actual donor concentration $N_{Fre}$ is affected by the variation ($\kappa$) of the actual bulk-acceptor concentration $N_{Are}$. On the other hand, the variation of the hydrogen donor concentration $N_H$ can be regarded as approximately 0 compared to the variation of bulk-acceptor concentration $N_{Are}$. Therefore, by reducing the specification value $N_{A0}$ of the bulk-acceptor concentration with respect to the target value $N_{F0}$ of the donor concentration, it is possible to reduce the ratio of components that vary in the donor concentration $N_{Fre}$.

The parameter $\alpha'$ is defined by the following expression.

$$N_{A0} = \alpha' N_{F0} \quad \text{[Expression 5]}$$

However, $\alpha'$ is the ratio of $N_{A0}$ to $N_{F0}$, so $0 < \alpha'$. Also, if the specification value $N_{A0}$ of the bulk-acceptor concentration is equal to or greater than the hydrogen donor concentration $N_H$, the donor concentration $N_{Fre}$ becomes negative and the N-type region 120 becomes the P type. Therefore, the specification value $N_{A0}$ of the bulk-acceptor concentration is smaller than the donor concentration $N_H$.

On the other hand, the specification value $N_{A0}$ of the bulk-acceptor concentration may not be smaller than the target value $N_{F0}$ of the donor concentration. However, if the specification value $N_{A0}$ for the bulk-acceptor concentration is greater than the target value $N_{F0}$ of the donor concentration, the specification value $N_{A0}$ for the bulk-acceptor concentration becomes close to the hydrogen donor concentration $N_H$. In this case, the actual donor concentration $N_{Fre}$ will be strongly affected by the actual bulk-acceptor concentration $N_{Are}$, and the variation of $N_{Fre}$ is easy to become large. Therefore, it is preferable to have $\alpha' < 1$.

The parameter $\alpha'$ is a parameter that means that the specification value $N_{A0}$ of the bulk-acceptor concentration only has $\alpha'$ set to be smaller with respect to the target value $N_{F0}$ of the donor concentration. It is considered how much smaller than 1 a value $\alpha'$ should be set as, to the extent that it is not equal to zero, so that $\theta$ is independent of $\kappa$ and sufficiently close to 1.

The parameter $\alpha$ is defined by the following expression.

$$\alpha = 1/\alpha' \quad \text{[Expression 6]}$$

From Expression 5 and Expression 6, the following expression can be obtained.

$$N_{A0} = N_{F0}/\alpha \quad \text{[Expression 7]}$$

Substituting Expression 7 into Expression 1, the following expression is obtained.

$$N_{F0} = N_H - N_{F0}/\alpha \quad \text{[Expression 8]}$$

that is, $$N_H = (1 + 1/\alpha) N_{F0}$$

Substituting Expression 8 into Expression 2 and Expression 3, the following expression is obtained.

$$N_{Fre} = (1 + 1/\alpha) N_{F0} - \kappa N_{A0} \quad \text{[Expression 9]}$$

Substituting Expression 9 into Expression 7, the following expression is obtained.

$$N_{Fre} = (1 + 1/\alpha) N_{F0} - \kappa(1/\alpha) N_{F0} \quad \text{[Expression 10]}$$
$$= (1 + 1/\alpha - \kappa/\alpha) N_{F0}$$

Substituting Expression 10 into Expression 4, the following expression is obtained.

$$\theta = 1 + 1/\alpha - \kappa/\alpha \quad \text{[Expression 11]}$$
$$= 1 - (\kappa - 1)/\alpha$$

From Expression 11 and Expression 6, the following expression is obtained.

$$\theta = 1 - \alpha'(\kappa - 1) \quad \text{[Expression 12]}$$

Figure 16:
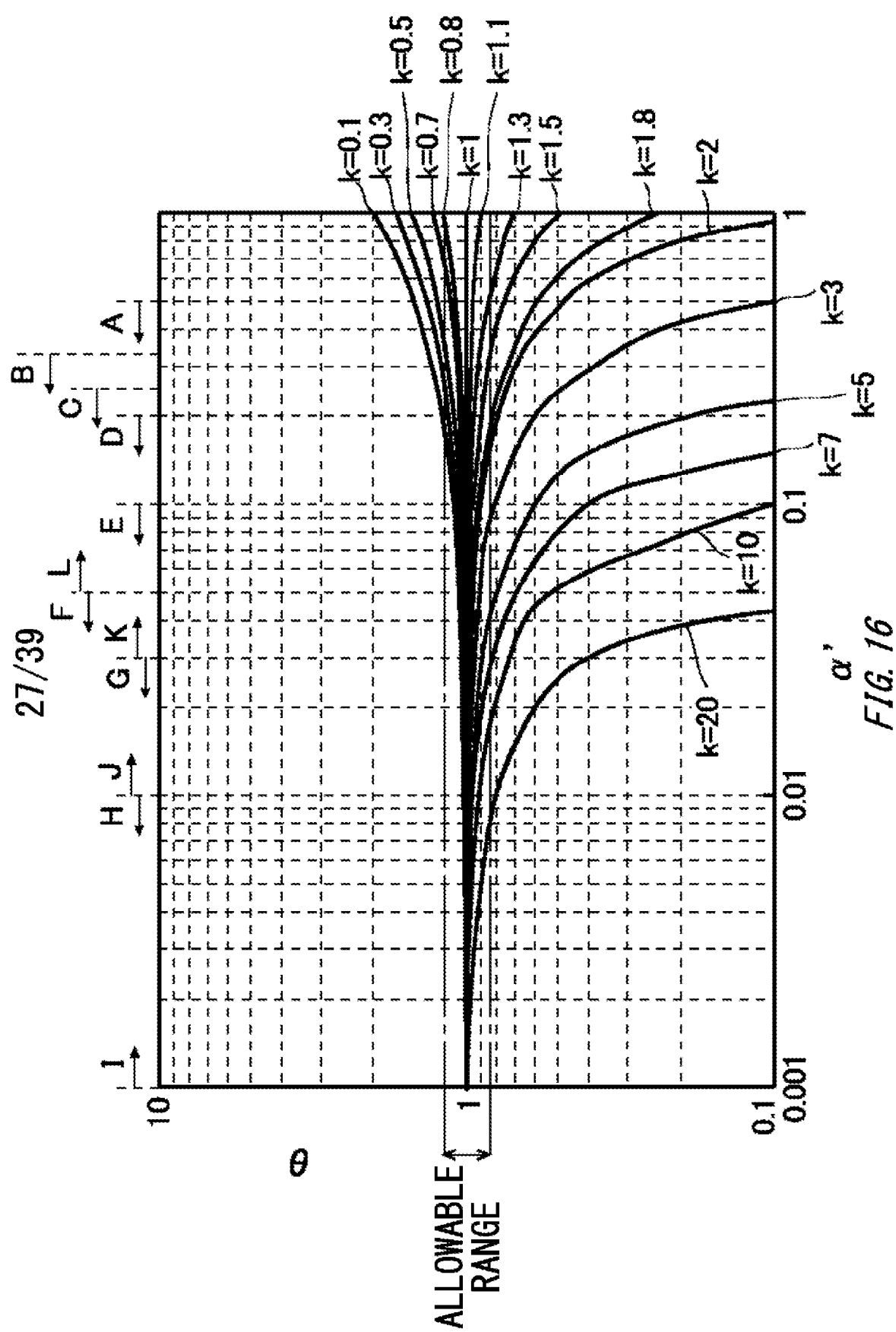
FIG. 16 illustrates a graph showing the relationship between $\alpha'$ and $\theta$ shown in Expression 12 for each $\kappa$.

FIG. 16 illustrates a graph showing the relationship between $\alpha'$ and $\theta$ shown in Expression 12 for each $\kappa$. As mentioned above, $\theta$ represents the ratio of the actual donor concentration $N_{Fre}$ to the target value $N_{F0}$, and $\kappa$ represents the ratio of the actual bulk-acceptor concentration $N_{Are}$ to the specification value $N_{A0}$. Also, the allowable value of $\theta$ is from 0.85 to 1.15. Also, in FIG. 16, each range of $\alpha'$, from range A to range L, is indicated by an arrow.

For example, the specification value $N_{A0}$ for the bulk-acceptor concentration is equal to or less than 0.5 times of the target value $N_{F0}$ of the donor concentration, that is, $\alpha'$ is referred to as equal to or less than 0.5 (range A as shown in FIG. 16). In this case, for example, even when $\kappa$ is 1.3, 0 is from 0.85 to 1.15, which is within the allowable range. That is, even if the actual bulk-acceptor concentration $N_{Are}$ is 30% higher when compared to the specification value $N_{A0}$, the actual donor concentration $N_{Fre}$ will be from 0.85 to 1.15 times of the target value $N_{F0}$. Also, even when $\kappa$ is 0.7, 0 is within the allowable range as long as $\alpha'$ is equal to or less than 0.5. As $\alpha'$ is brought closer to 0, $\theta$ converges to 1. For example, when $\kappa = 2$, $\theta$ is within the allowable range as long as $\alpha'$ is approximately 0.13 or less.

In order to make $\theta$ in the above allowable range, the following range A to range H, for example, can be considered as the preferred upper limit range of $\alpha'$.

(Range A)

$\alpha'$ is 0.5 or less. When $\alpha'$ is 0.5, $\theta$ is within the allowable range as long as $\kappa$ is within a range of 0.7 to 1.3. When the target value $N_{F0}$ of the donor concentration is $1 \times 10^{14}/\text{cm}^3$, and $\alpha'$ is 0.001, the specification value $N_{A0}$ of the bulk-acceptor concentration is $1 \times 10^{11}/\text{cm}^3$, equivalent to a specific resistivity of approximately 126000 $\Omega$cm.

(Range B)

$\alpha'$ is 0.333 or less. When $\alpha'$ is 0.333, $\theta$ is within the allowable range as long as $\kappa$ is within a range of 0.5 to 1.4. When the target value $N_{F0}$ of the donor concentration is $1 \times 10^{14}/\text{cm}^3$, and $\alpha'$ is 0.01, the specification value $N_{A0}$ of the bulk-acceptor concentration is $1 \times 10^{12}/\text{cm}^3$, equivalent to a specific resistivity of approximately 12600 $\Omega$cm.

(Range C)

$\alpha'$ is 0.25 or less. When $\alpha'$ is 0.25, $\theta$ is within the allowable range as long as $\kappa$ is within a range of 0.3 to 1.6. When the target value $N_{F0}$ of the donor concentration is $1 \times 10^{14}/\text{cm}^3$, and $\alpha'$ is 0.03, the specification value $N_{A0}$ of the bulk-acceptor concentration is $3 \times 10^{12}/\text{cm}^3$, equivalent to a specific resistivity of approximately 4210 $\Omega$cm.

(Range D)

$\alpha'$ is 0.2 or less. When $\alpha'$ is 0.2, $\theta$ is within the allowable range as long as $\kappa$ is within a range of 0.1 to 1.8. When the target value $N_{F0}$ of the donor concentration is $1 \times 10^{14}/\text{cm}^3$, and $\alpha'$ is 0.1, the specification value $N_{A0}$ of the bulk-acceptor concentration is $1 \times 10^{13}/\text{cm}^3$, equivalent to a specific resistivity of approximately 1260 $\Omega$cm.

(Range E)

$\alpha'$ is 0.1 or less. When $\alpha'$ is 0.1, $\theta$ is within the allowable range as long as $\kappa$ is 2.5 or less with respect to the lower limit value 0.85 of the allowable range of $\theta$. Also, even when κ is 0.1, θ is well within the allowable range with respect to the upper limit value 1.15 of the allowable range of θ.
(Range F)
α' is 0.05 or less. When α' is 0.05, θ is within the allowable range as long as κ is 4 or less with respect to the lower limit value 0.85 of the allowable range of θ. Also, even when κ is 0.1, θ is well within the allowable range with respect to the upper limit value 1.15 of the allowable range of θ.
(Range G)
α' is 0.03 or less. When α' is 0.03, θ is within the allowable range as long as κ is 6 or less with respect to the lower limit value 0.85 of the allowable range of θ. Also, even when κ is 0.1, θ is well within the allowable range with respect to the upper limit value 1.15 of the allowable range of θ.
(Range H)
α' is 0.01 or less. When α' is 0.01, θ is well within the allowable range as long as κ is 10 or less with respect to the lower limit value 0.85 of the allowable range of θ. Also, even when κ is 0.1, θ is well within the allowable range with respect to the upper limit value 1.15 of the allowable range of θ.

As α' is brought closer to 0, θ converges to 1. Therefore, α' should be a value greater than 0. The lower limit of α' may be in the following range I to range L.
(Range I)
α' is 0.001 or more. When the target value $N_{F0}$ of the donor concentration is $1 \times 10^{14}/cm^3$, and α' is 0.001, the specification value $N_{A0}$ of the bulk-acceptor concentration is $1 \times 10^{11}/cm^3$, equivalent to a specific resistivity of approximately 126000 Ωcm.
(Range J)
α' is 0.01 or more. When the target value $N_{F0}$ of the donor concentration is $1 \times 10^{14}/cm^3$, and α' is 0.01, the specification value $N_{A0}$ of the bulk-acceptor concentration is $1 \times 10^{12}/cm^3$, equivalent to a specific resistivity of approximately 12600 Ωcm.
(Range K)
α' is 0.03 or more. When the target value $N_{F0}$ of the donor concentration is $1 \times 10^{14}/cm^3$, and α' is 0.03, the specification value $N_{A0}$ of the bulk-acceptor concentration is $3 \times 10^{12}/cm^3$, equivalent to a specific resistivity of approximately 4210 Ωcm.
(Range L)
α' is 0.05 or more. When the target value $N_{F0}$ of the donor concentration is $1 \times 10^{14}/cm^3$, and α' is 0.05, the specification value $N_{A0}$ of the bulk-acceptor concentration is $5 \times 10^{12}/cm^3$, equivalent to a specific resistivity of approximately 2530 Ωcm.

As one example, the actual donor concentration $N_{Fre}$ corresponds to the donor concentration of the drift region 18. According to the donor concentration of the drift region 18, the breakdown voltage of the semiconductor device 100 is determined. Therefore, according to the rated voltage of the semiconductor device 100, the preferred range of the donor concentration $N_{Fre}$ of the drift region 18 is determined. According to the donor concentration $N_{Fre}$, the range of the bulk-acceptor concentration $N_{Are}$ that can make the donor concentration $N_{Fre}$ stable is determined.

Figure 17:
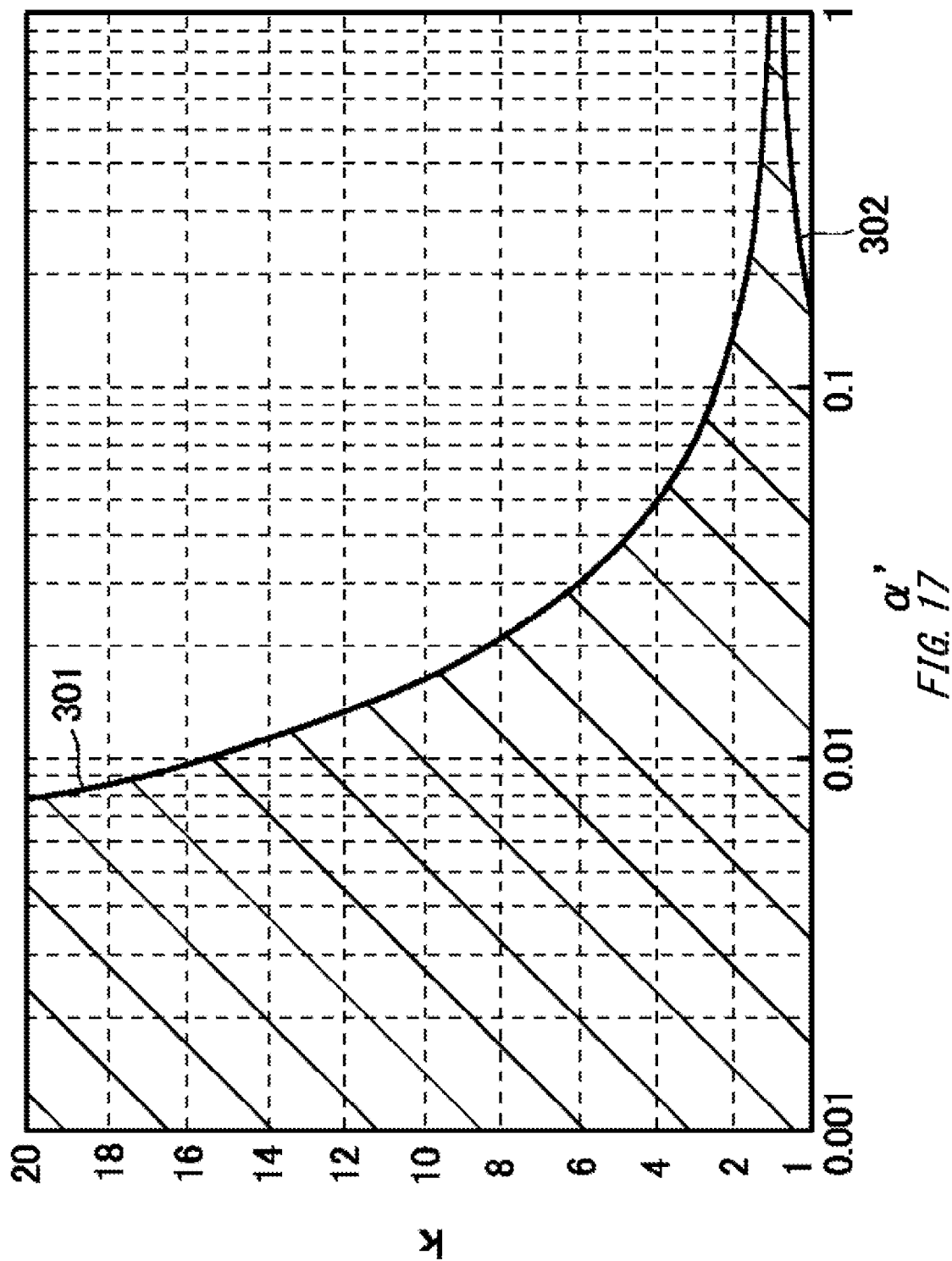
FIG. 17 illustrates a figure describing one example of a preferred range of the parameter $\kappa$.

FIG. 17 illustrates a figure describing one example of a preferred range of the parameter κ. As mentioned above, the parameter κ is a ratio of the actual bulk-acceptor concentration $N_{Are}$ to the specification value $N_{A0}$. As described in FIG. 16, the deviation ratio of the actual donor concentration $N_{Fre}$ with respect to the target value $N_{F0}$ of the final donor concentration is set to make $θ_0$ within a predetermined allowable range. In the example in FIG. 16, the allowable range $θ_0$ is 15% (that is, from −15% to 15%). The upper limit value of the deviation ratio θ is 1.15, and the lower limit value of the deviation ratio θ is 0.85.

By setting the ratio κ of the error of the actual value $N_{Are}$ to the specification value $N_{A0}$ of the bulk-acceptor concentration to a predetermined allowable range, the deviation ratio θ can be suppressed within the allowable range $θ_0$ for a relatively wide range of α'. In order to set an allowable range for the parameter κ, Expression 12 is transformed using the deviation ratio θ and α' to become Expression 13A.

$$κ=(1−θ)/α'+1 \qquad \text{[Expression 13A]}$$

In Expression 13A, the deviation ratio θ in this example is the upper limit value (1.15 in this example) or the lower limit value (0.85 in this example).

Alternatively, Expression 12 may be transformed to Expression 13B using the allowable range $θ_0$.

$$κ=−θ_0/α'+1 \qquad \text{[Expression 13B]}$$

In Expression 13B, the allowable range $θ_0$ in this example is 15% (that is, from −15% to 15%). The upper limit value of the deviation ratio θ is 1.15, and the lower limit value of the deviation ratio θ is 0.85. The reason why the sign of $θ_0$ is set to − in Expression 13B is to correspond to the upper limit value and the lower limit value of the deviation ratio θ in Expression 13A and the upper limit value and the lower limit value of the allowable range $θ_0$ in Expression 13B, respectively.

If the allowable range of $θ_0$ is ±15% of the target value $N_{F0}$ of the donor concentration, the following expression is obtained for the upper limit value 1.15 and the lower limit value 0.85, respectively.

$$κ=−0.15/α'+1 (θ=1.15) \qquad \text{[Expression 13C]}$$

$$κ=0.15/α'+1 (θ=0.85) \qquad \text{[Expression 13D]}$$

From Expression 13C and Expression 13D, the range that κ should take for α' is the range shown by the hatching of diagonal lines in FIG. 17. In FIG. 17, the curve 301 corresponds to Expression 13D, and the curve 302 corresponds to the Expression 13C. That is, when α' is no more than 1, the allowable range of κ if the range of Expression 13D or less (that is, the curve 301 or less), and Expression 13C or more (that is, the curve 302 or more). In FIG. 17, the ranges where α' is less than 0.001 and the ranges where κ is greater than 20 are omitted, but even in these ranges, the region between the curve 301 and the curve 302 is an allowable range for κ. Note that the allowable range of $θ_0$ may be ±10%, ±7%, ±5%, or ±3%. On the other hand, if the variation in the breakdown voltage of the semiconductor device 100 is more allowable, the allowable range of $θ_0$ may be ±30% or ±20%.

Note that from the semiconductor device 100 after manufacturing, the actual bulk-acceptor concentration $N_{Are}$ and the actual donor concentration $N_{Fre}$ can be measured. The bulk-acceptor concentration $N_{Are}$ may use the acceptor concentration at the center position in the depth direction of the N-type region 120, or it may use the minimum value of the acceptor concentration in the semiconductor substrate 10. Also, the donor concentration $N_{Fre}$ may use the donor concentration at the center position in the depth direction of the N-type region 120, or it may use the average value of the donor concentration in the N-type region 120.

In the semiconductor device 100, it may be assumed that κ=1 (that is, the difference between the specification value $N_{A0}$ of the bulk-acceptor concentration and the actual bulk-acceptor concentration $N_{Are}$ is 0), and it may be set that $N_{Are}=N_{A0}$. Also, it may be assumed that $\theta=1$ (that is, the difference between the target value $N_{F0}$ of the donor concentration and the actual donor concentration $N_{Fre}$ is 0), and it may be set that $N_{F0}=N_{Fre}$. In this way, $\alpha'$ can be calculated from Expression 5 using $N_{Are}$ and $N_{Fre}$. If $\alpha'=N_{Are}/N_{Fre}$ is 0.5 or less, it may be determined that the effect of the variation in bulk-acceptor concentration can be sufficiently reduced to minimize the variation in donor concentration $N_{Fre}$. $\alpha'=N_{Are}/N_{Fre}$ may be any range as shown in range A to range J.

Also, if the target value $N_{F0}$ of the donor concentration and the specification value $N_{A0}$ of the bulk-acceptor concentration can be determined from the manufacturing conditions and so on, the parameters $\kappa$ and $\theta$ can be calculated from Expression 3 and Expression 4. In this way, the parameter $\alpha'$ can be calculated further accurately. Note that the hydrogen donor concentration $N_H$ can be calculated from Expression 1 using these values.

In this example, since the variation in hydrogen donor concentration $N_H$ is small to a negligible degree compared to the variation in bulk-acceptor concentration, the variation in hydrogen donor concentration $N_H$ has been set to 0. On the other hand, the variation of the hydrogen donor concentration $N_H$ may be taken as a parameter $\omega$ with a finite value. The parameter $\omega$ in this case is defined as the ratio of the actual hydrogen donor concentration $N_{Hre}$ to the target value $N_{H0}$ of the hydrogen donor concentration, as shown in the following expression.

$$\omega = N_{HRe}/N_{H0} \quad \text{[Expression 14]}$$

Variation 0 in hydrogen donor concentration $N_H$ means that the parameter $\omega$ in Expression 14 is 1. When using the parameter $\omega$, Expression 8 becomes $$N_{H0}=(1+1/\alpha)N_{F0} \quad \text{[Expression 8B]}$$

and Expression 9 becomes $$N_{Fre}=\omega(1+1/\alpha)N_{F0}-\kappa N_{A0} \quad \text{[Expression 9B]}$$

and Expression 10 becomes $$N_{Fre} = \omega(1 + 1/\alpha)N_{F0} - \kappa(1/\alpha)N_{F0}$$
$$= \{\omega(1 + 1/\alpha - \kappa/\alpha)N_{F0}$$

Substituting Expression 10B into Expression 4, the following expression can be obtained.

$$\theta = \omega + \omega/\alpha - \kappa/\alpha \quad \text{[Expression 11B]}$$
$$= \omega - (\kappa - \omega)/\alpha$$

The following expression can be obtained from Expression 6 and Expression 11.

$$\theta=\omega-\alpha'(\kappa-\omega) \quad \text{[Expression 12B]}$$

Since the parameter $\omega$ is the ratio of the actual hydrogen donor concentration $N_{Hre}$ to the target value $N_{H0}$ of the hydrogen donor concentration, so $0<\omega$. The parameter $\omega$ is sufficiently close enough to 1. This is because the hydrogen donor concentration is formed by the diffusion of hydrogen through ion implantation and heat treatment, and because the ion implantation and the heat treatment are process means with small variation.

In Expression 12B, when the parameter $\alpha'$ is brought close to 0, the parameter $\theta$ converges to $\omega$. When the parameter $\omega$ is set to 0.9 and $\alpha'$ is close to 0, $\theta$ converges to $\omega=0.9$ from Expression 12B. On the other hand, when the parameter $\omega$ is set to 1.1 and $\alpha'$ is close to 0, $\theta$ converges to $\omega=1.1$ from Expression 12B. The parameter $\omega$ may be from 0.9 to 1.1, or may be from 0.95 to 1.05, as an example. Since the parameter $\omega$ is close enough to 1 as described above, Expression 12 with $\omega=1$ may be used in Expression 12B.

Further, Expression 12B is transformed using the specific $\theta_0$ and $\alpha'$ to become Expression 15.

$$\kappa=(1-\theta_0/\omega)(\omega/\alpha')+\omega \quad \text{[Expression 15]}$$

If the parameter $\omega$ is set to 1 in Expression 15, then Expression 15 becomes the same as Expression 13.

Figure 18:
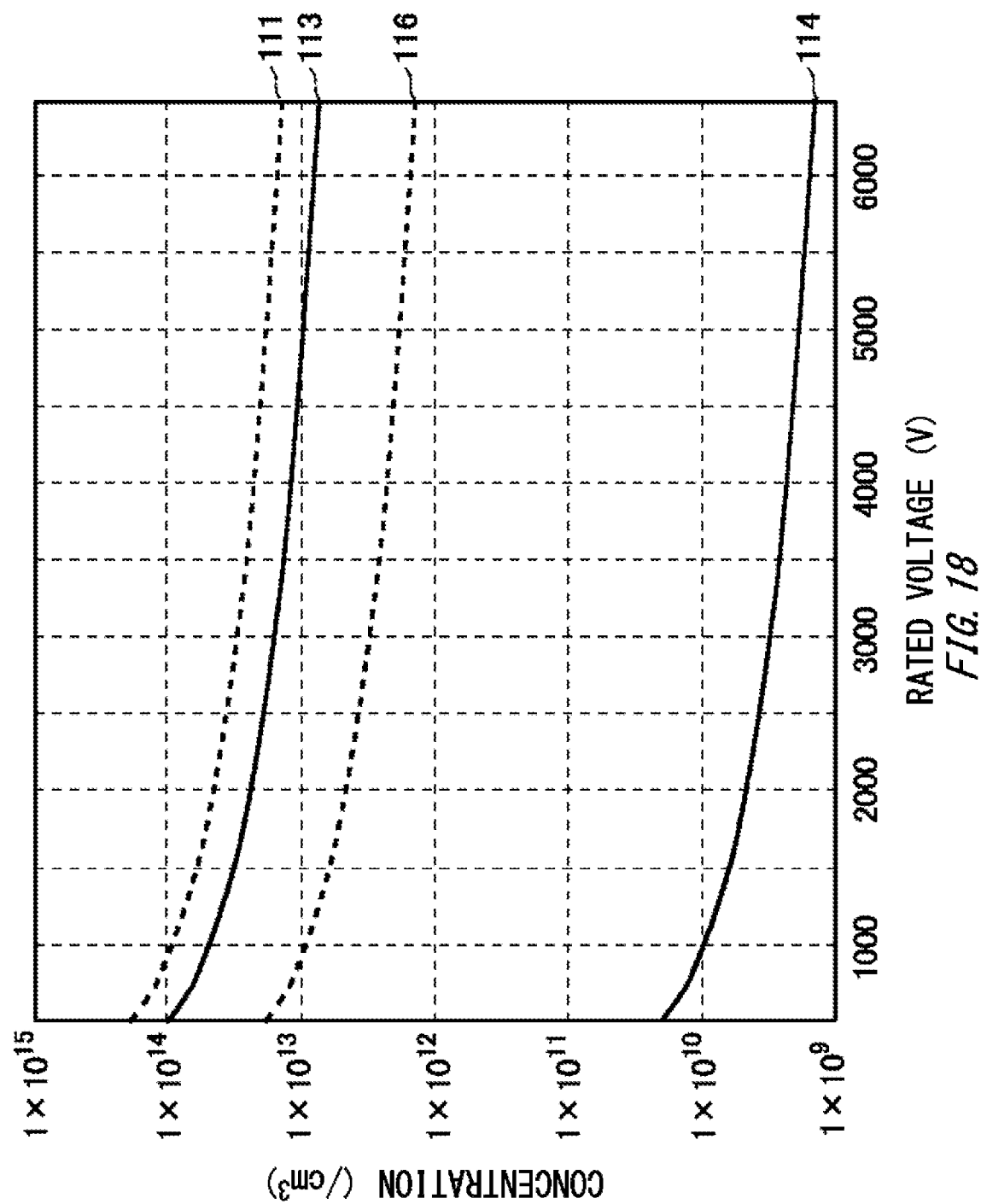
FIG. 18 illustrates one example of a preferred range of the bulk-acceptor concentration $N_{Are}$.

FIG. 18 illustrates one example of a preferred range of the bulk-acceptor concentration $N_{Are}$. In this example, the donor concentration $N_{Fre}$ (/cm$^3$) at the center position in the depth direction of the semiconductor substrate 10 is from $(9.20245\times10^{15})/x$ to $(9.20245\times10^{16})/x$. Herein, x is the rated voltage (V). The donor concentration $N_{Fre}$ (/cm$^3$) has been determined with reference to the doping concentration of the drift region in a general semiconductor substrate formed by the FZ method, but it may also be determined with reference to the doping concentration of the drift region in a semiconductor substrate formed by the MCZ method. In FIG. 18, the upper limit 111 and lower limit 116 of the preferred range of the donor concentration $N_{Fre}$(/cm$^3$) are shown by dashed lines.

In FIG. 18, the upper limit 113 and the lower limit 114 of the preferred range of bulk-acceptor concentration $N_{Are}$ when $\alpha'$ is from 0.001 to 0.5 are shown by solid lines. The upper limit 113 of the bulk-acceptor concentration $N_{Are}$ is a value multiplying the upper limit 111 of the donor concentration $N_{Fre}$ (/cm$^3$) by the upper limit value of $\alpha'$ (0.5). The lower limit 114 of the bulk-acceptor concentration $N_{Are}$ is a value multiplying the lower limit 116 of the donor concentration $N_{Fre}$ (/cm$^3$) by the lower limit value of $\alpha'$ (0.001). The upper limit 113 and the lower limit 114 of the bulk-acceptor concentration $N_{Are}$ are as follows. Note that the unit of the upper limit 113 and the lower limit 114 in each example is (/cm$^3$). As mentioned above, x is the rated voltage (V).

Figure 19:
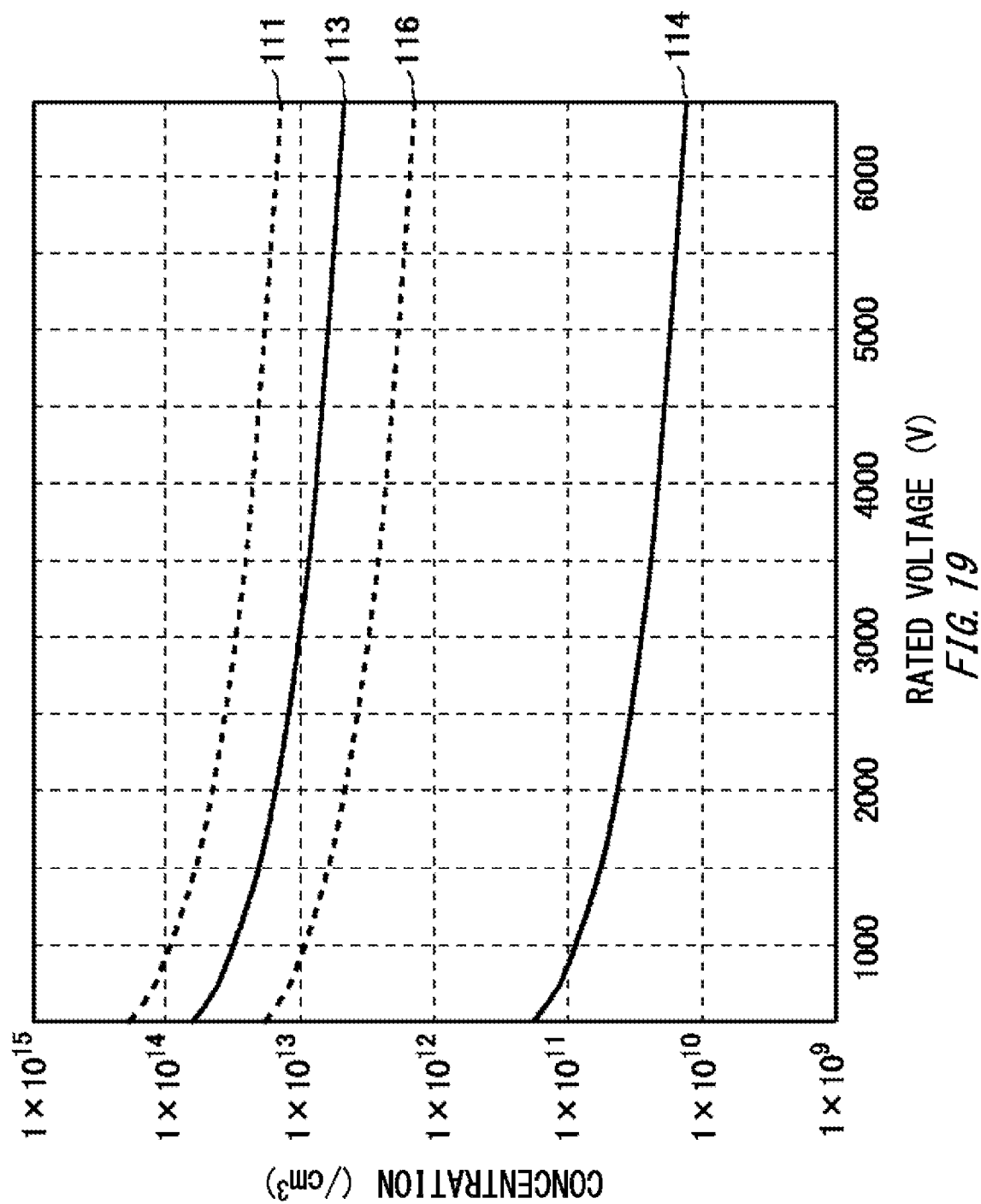
FIG. 19 illustrates one example of a preferred range of the bulk-acceptor concentration $N_{Are}$ when $\alpha'$ is from 0.01 to 0.333.

Lower limit 114: $(9.20245\times10^{12}/x)$
Upper limit 113: $(4.60123\times10^{16}/x)$ FIG. 19 illustrates one example of a preferred range of the bulk-acceptor concentration $N_{Are}$ when $\alpha'$ is from 0.01 to 0.333. Note that the upper limit 111 and the lower limit 116 of the donor concentration $N_{Fre}$ (/cm$^3$) is the same as the example in FIG. 18. The upper limit 113 of the bulk-acceptor concentration $N_{Are}$ is a value multiplying the upper limit 111 of the donor concentration $N_{Fre}$ (/cm$^3$) by the upper limit value of $\alpha'$ (0.333). The lower limit 114 of the bulk-acceptor concentration $N_{Are}$ is a value multiplying the lower limit 116 of the donor concentration $N_{Fre}$ (/cm$^3$) by the lower limit value of $\alpha'$ (0.01). The upper limit 113 and the lower limit 114 of the bulk-acceptor concentration $N_{Are}$ are as follows.

Figure 20:
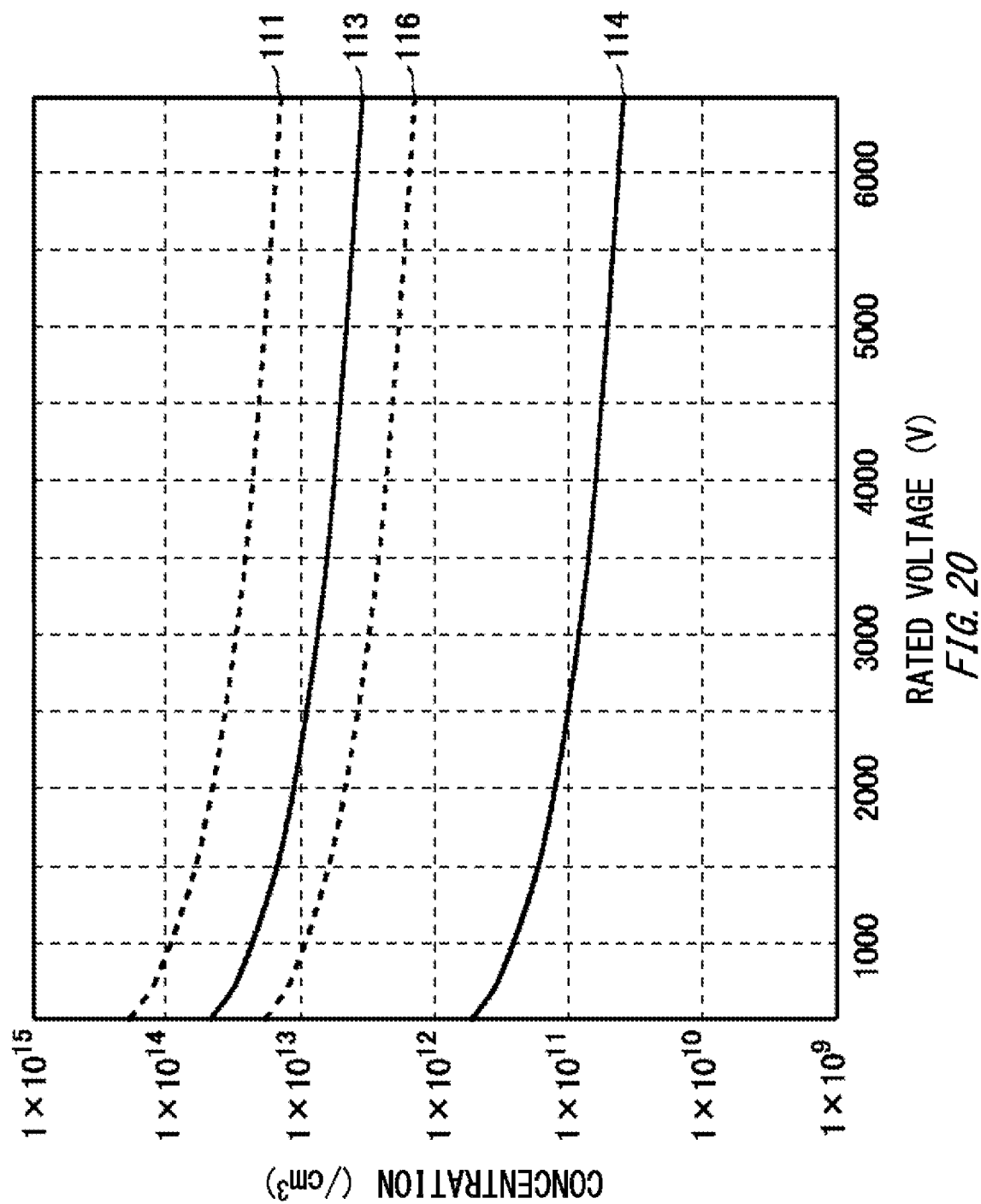
FIG. 20 illustrates one example of a preferred range of the bulk-acceptor concentration $N_{Are}$ when $\alpha'$ is from 0.03 to 0.25.

Lower limit 114: $(9.20245\times10^{13}/x)$
Upper limit 113: $(3.06442\times10^{16}/x)$ FIG. 20 illustrates one example of a preferred range of the bulk-acceptor concentration $N_{Are}$ when $\alpha'$ is from 0.03 to 0.25. Note that the upper limit 111 and the lower limit 116 of the donor concentration $N_{Fre}$ (/cm$^3$) is the same as the example in FIG. 18. The upper limit 113 of the bulk-acceptor concentration $N_{Are}$ is a value multiplying the upper limit 111 of the donor concentration $N_{Fre}$ (/cm$^3$) by the upper limit value of $\alpha'$ (0.25). The lower limit 114 of the bulk-acceptor concentration $N_{Are}$ is a value multiplying the lower limit 116 of the donor concentration $N_{Fre}$ (/cm³) by the lower limit value of α' (0.03). The upper limit 113 and the lower limit 114 of the bulk-acceptor concentration $N_{Are}$ are as follows.
  Lower limit 114: (2.76074×10¹⁴/x)
  Upper limit 113: (2.30061×10¹⁶/x)

Figure 21:
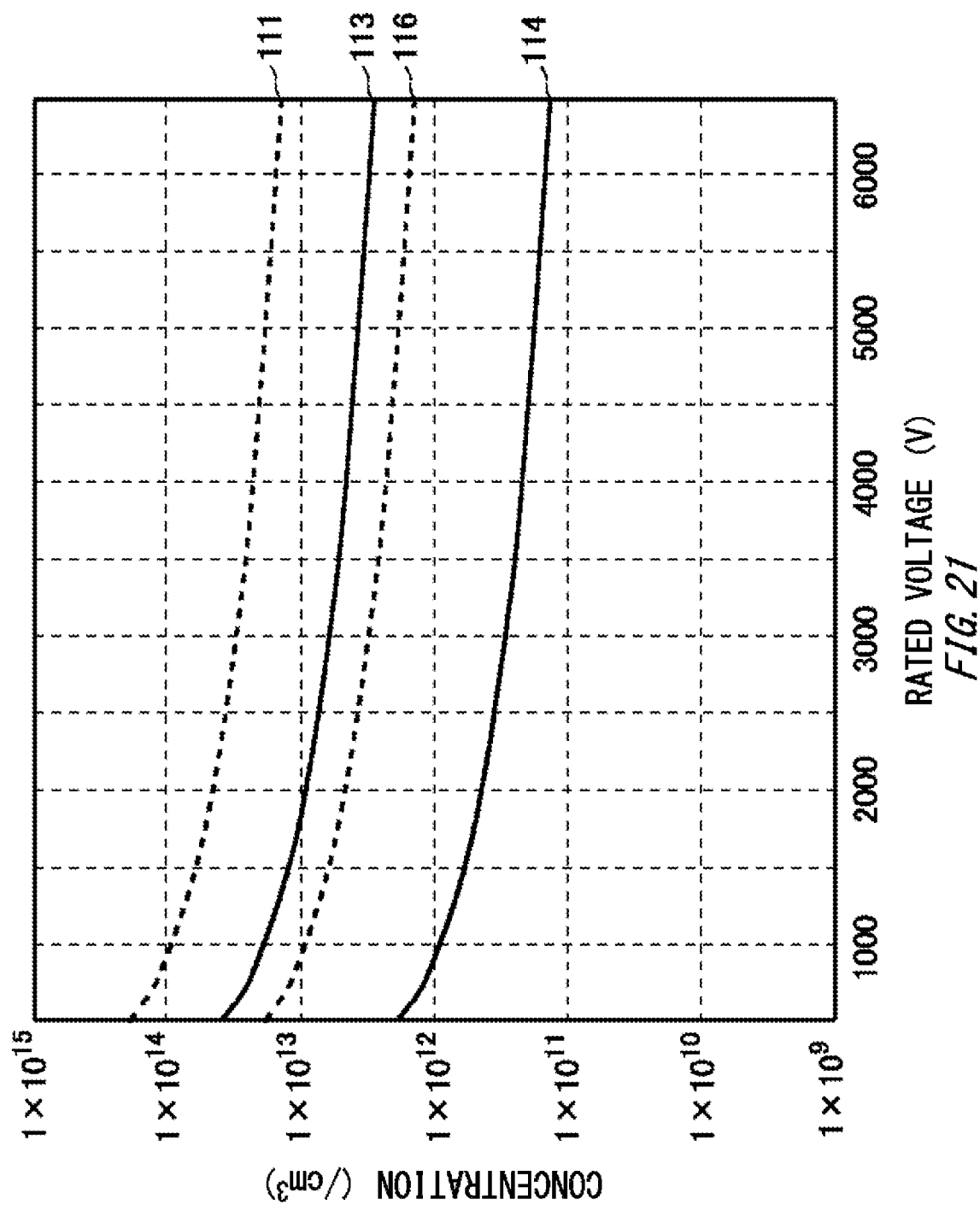
FIG. 21 illustrates one example of a preferred range of the bulk-acceptor concentration $N_{Are}$ when $\alpha'$ is from 0.1 to 0.2.

FIG. 21 illustrates one example of a preferred range of the bulk-acceptor concentration $N_{Are}$, when α' is from 0.1 to 0.2. Note that the upper limit 111 and the lower limit 116 of the donor concentration $N_{Fre}$ (/cm³) is the same as the example in FIG. 18. The upper limit 113 of the bulk-acceptor concentration $N_{Are}$ is a value multiplying the upper limit 111 of the donor concentration $N_{Fre}$ (/cm³) by the upper limit value of α' (0.2). The lower limit 114 of the bulk-acceptor concentration $N_{Are}$ is a value multiplying the lower limit 116 of the donor concentration $N_{Fre}$ (/cm³) by the lower limit value of α' (0.1). The upper limit 113 and the lower limit 114 of the bulk-acceptor concentration $N_{Are}$ are as follows.
  Lower limit 114: (9.20245×10¹⁴/x)
  Upper limit 113: (1.84049×10¹⁶/x)

Figure 22:
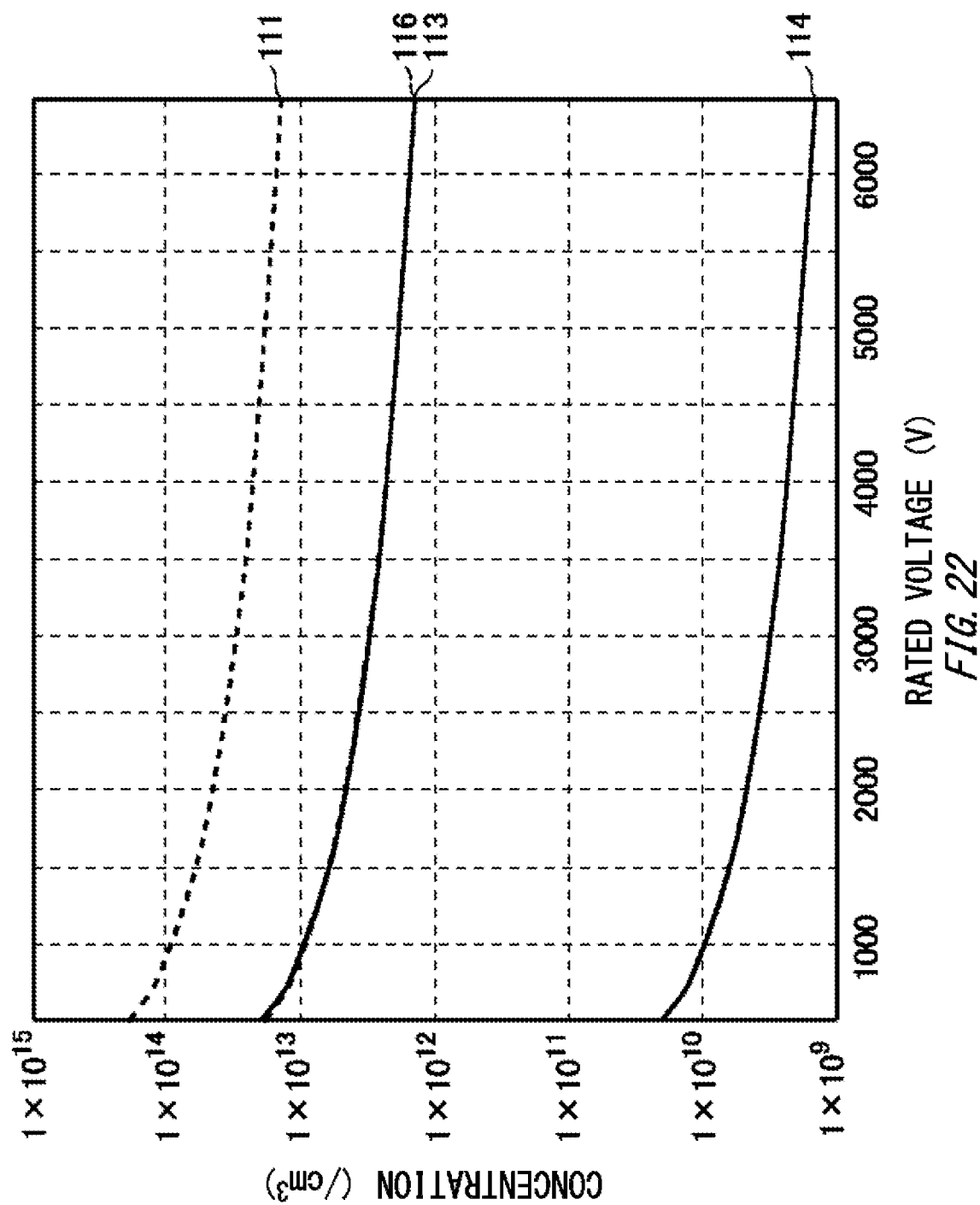
FIG. 22 illustrates one example of a preferred range of the bulk-acceptor concentration $N_{Are}$ when $\alpha'$ is from 0.001 to 0.1.

FIG. 22 illustrates one example of a preferred range of the bulk-acceptor concentration $N_{Are}$, when α' is from 0.001 to 0.1. Note that the upper limit 111 and the lower limit 116 of the donor concentration $N_{Fre}$ (/cm³) is the same as the example in FIG. 18. The upper limit 113 of the bulk-acceptor concentration $N_{Are}$ is a value multiplying the upper limit 111 of the donor concentration $N_{Fre}$ (/cm³) by the upper limit value of α' (0.1). The lower limit 114 of the bulk-acceptor concentration $N_{Are}$ is a value multiplying the lower limit 116 of the donor concentration $N_{Fre}$ (/cm³) by the lower limit value of α' (0.001). The upper limit 113 and the lower limit 114 of the bulk-acceptor concentration $N_{Are}$ are as follows.
  Lower limit 114: (9.20245×10¹²/x)
  Upper limit 113: (9.20245×10¹⁵/x)

Figure 23:
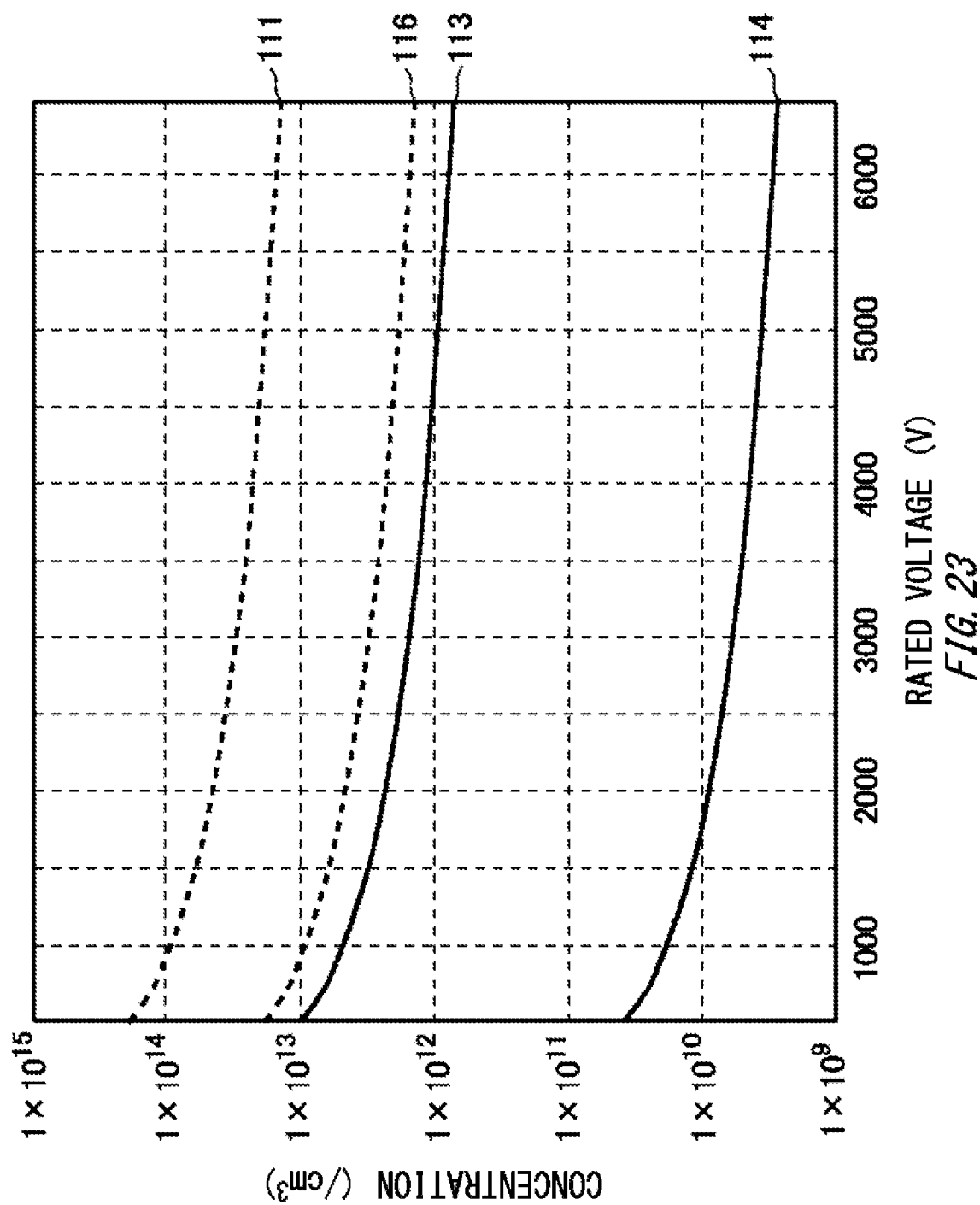
FIG. 23 illustrates one example of a preferred range of the bulk-acceptor concentration $N_{Are}$ when $\alpha'$ is from 0.002 to 0.05.

FIG. 23 illustrates one example of a preferred range of the bulk-acceptor concentration $N_{Are}$, when α' is from 0.002 to 0.05. Note that the upper limit 111 and the lower limit 116 of the donor concentration $N_{Fre}$ (/cm³) is the same as the example in FIG. 18. The upper limit 113 of the bulk-acceptor concentration $N_{Are}$ is a value multiplying the upper limit 111 of the donor concentration $N_{Fre}$ (/cm³) by the upper limit value of α' (0.05). The lower limit 114 of the bulk-acceptor concentration $N_{Are}$ is a value multiplying the lower limit 116 of the donor concentration $N_{Fre}$ (/cm³) by the lower limit value of α' (0.002). The upper limit 113 and the lower limit 114 of the bulk-acceptor concentration $N_{Are}$ are as follows.
  Lower limit 114: (1.84049×10¹³/x)
  Upper limit 113: (4.60123×10¹⁵/x)

Figure 24:
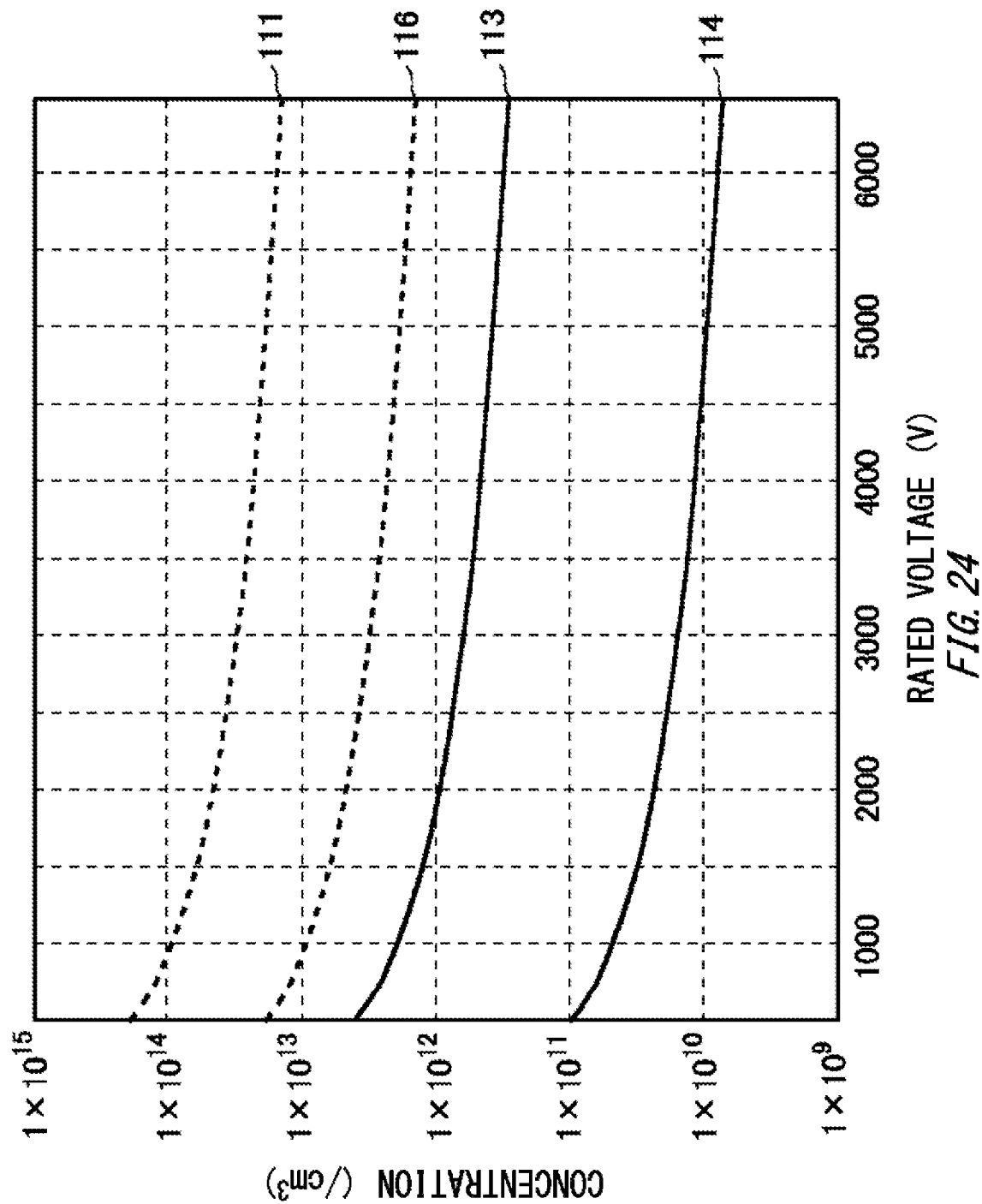
FIG. 24 illustrates one example of a preferred range of the bulk-acceptor concentration $N_{Are}$ when $\alpha'$ is from 0.005 to 0.02.

FIG. 24 illustrates one example of a preferred range of the bulk-acceptor concentration $N_{Are}$, when α' is from 0.005 to 0.02. Note that the upper limit 111 and the lower limit 116 of the donor concentration $N_{Fre}$ (/cm³) is the same as the example in FIG. 18. The upper limit 113 of the bulk-acceptor concentration $N_{Are}$ is a value multiplying the upper limit 111 of the donor concentration $N_{Fre}$ (/cm³) by the upper limit value of α' (0.02). The lower limit 114 of the bulk-acceptor concentration $N_{Are}$ is a value multiplying the lower limit 116 of the donor concentration $N_{Fre}$ (/cm³) by the lower limit value of α' (0.005). The upper limit 113 and the lower limit 114 of the bulk-acceptor concentration $N_{Are}$ are as follows.
  Lower limit 114: (4.60123×10¹³/x)
  Upper limit 113: (1.84049×10¹⁵/x)

Figure 25:
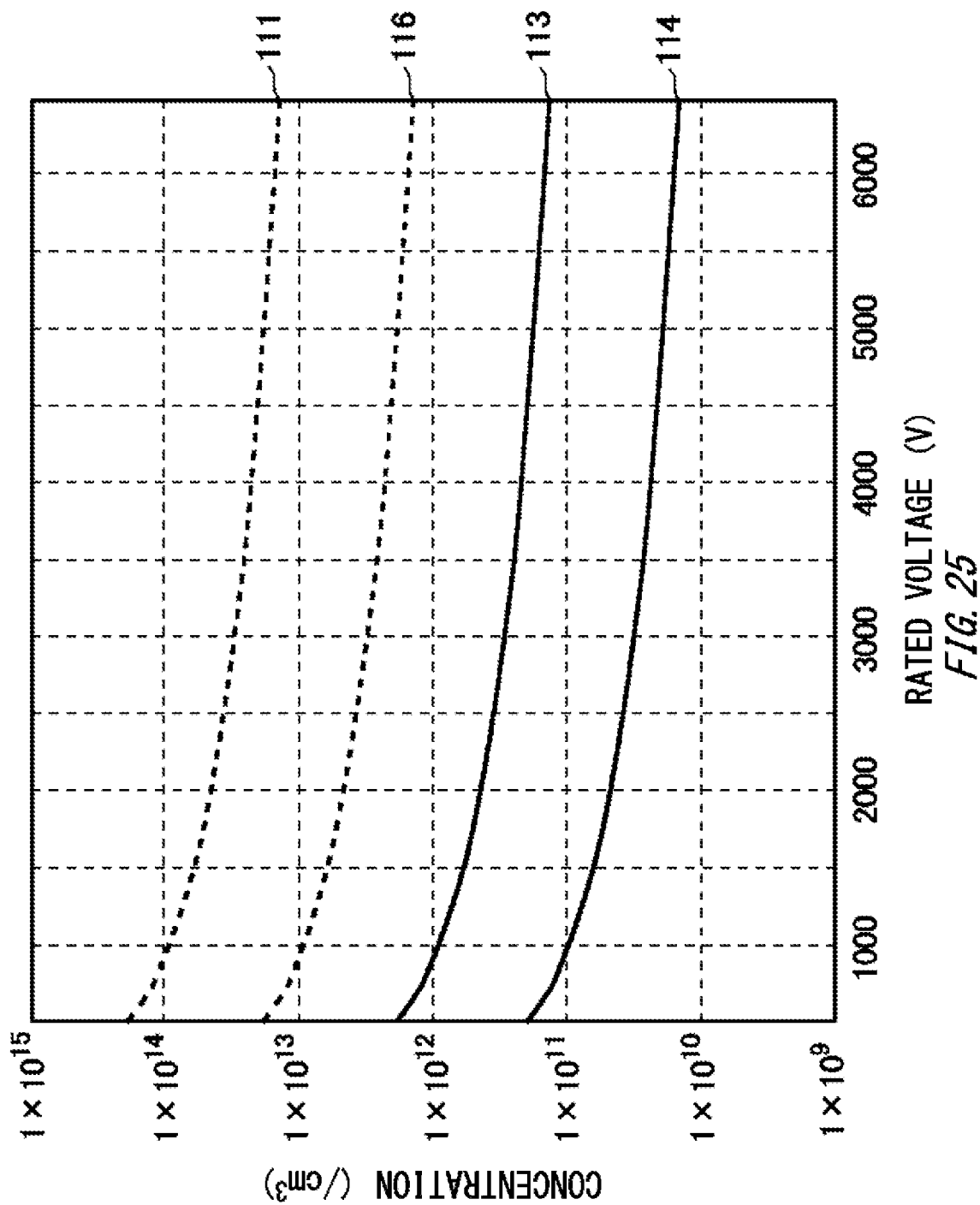
FIG. 25 illustrates one example of a preferred range of the bulk-acceptor concentration $N_{Are}$ when $\alpha'$ is $0.01 \pm 0.002$.

FIG. 25 illustrates one example of a preferred range of the bulk-acceptor concentration $N_{Are}$, when α' is 0.01±0.002. Note that the upper limit 111 and the lower limit 116 of the donor concentration $N_{Fre}$ (/cm³) is the same as the example in FIG. 18. The upper limit 113 of the bulk-acceptor concentration $N_{Are}$ is a value multiplying the upper limit 111 of the donor concentration $N_{Fre}$ (/cm³) by the upper limit value of α' (0.01). The lower limit 114 of the bulk-acceptor concentration $N_{Are}$ is a value multiplying the lower limit 116 of the donor concentration $N_{Fre}$ (/cm³) by the lower limit value of α' (0.005). The upper limit 113 and the lower limit 114 of the bulk-acceptor concentration $N_{Are}$ are as follows.
  Lower limit 114: (9.20245×10¹³/x)
  Upper limit 113: (9.20245×10¹⁴/x)

Note that the upper limit 113 and the lower limit 114 in each range may have a width of ±20%.

As shown in FIG. 18 to FIG. 25, by setting the bulk-acceptor concentration $N_{Are}$ to a concentration between the upper limit 113 and the lower limit 114 in each example, e, which represents the variation in the final donor concentration $N_{Fre}$, can be suppressed within an allowable range. Note that the lower limit 114 curve may be smaller than the intrinsic carrier concentration. Herein, the intrinsic carrier concentration is 1.45×10¹⁰/cm³ at room temperature (for example, 300 K). If the value of the lower limit 114 curve is smaller than the intrinsic carrier concentration, the lower limit 114 may be replaced by the intrinsic carrier concentration.

Figure 26:
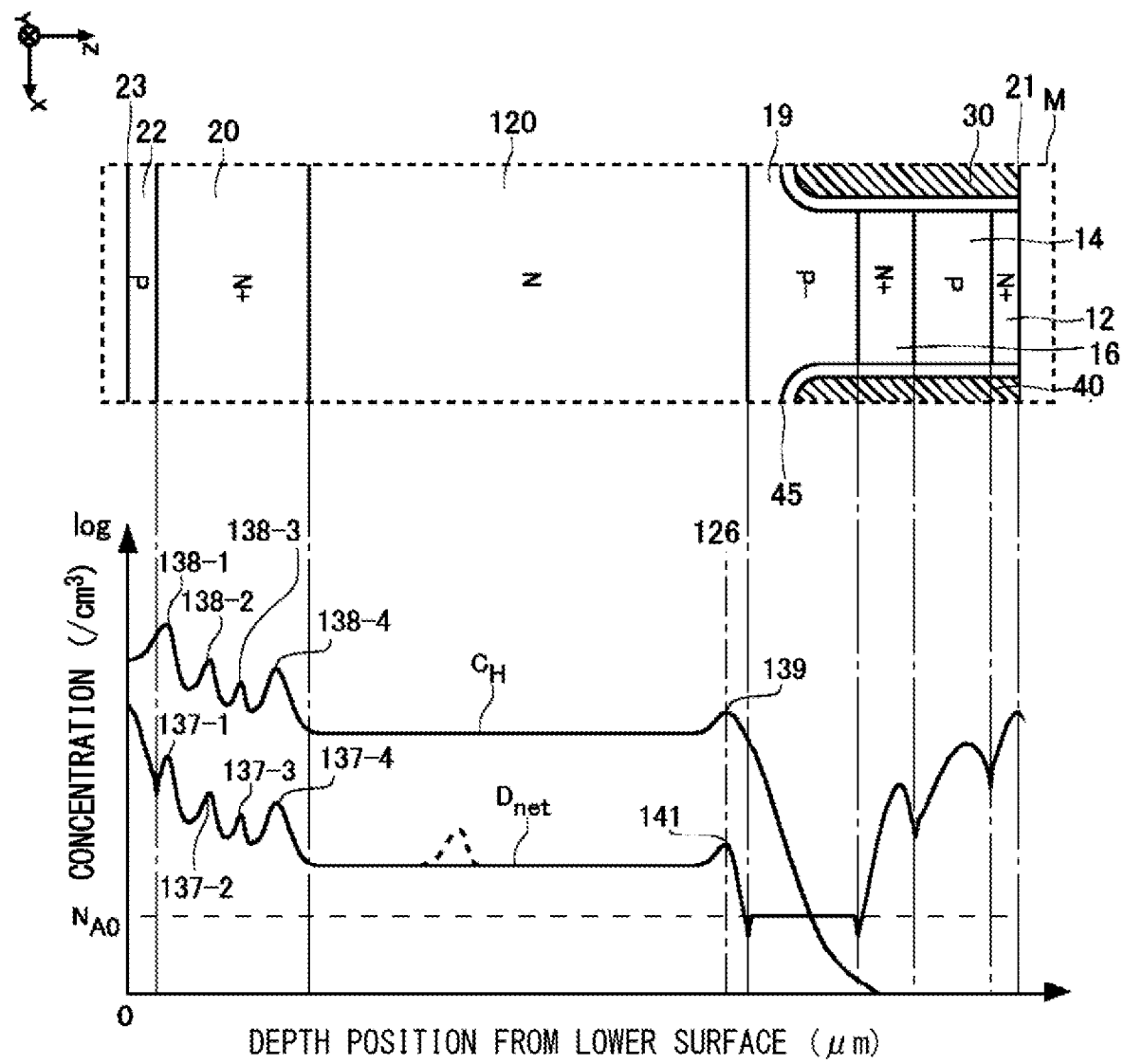
FIG. 26 illustrates another exemplary structure of the region M in FIG. 7.

FIG. 26 illustrates another exemplary structure of the region M in FIG. 7. The region M includes one mesa portion 60 of the transistor portion 70 and a region that overlaps the mesa portion 60 in the Z axis direction. In FIG. 26, the distribution of the hydrogen chemical concentration $C_H$ and the distribution of the net-doping concentration $D_{net}$ in the Z axis direction of the region M are shown together. In the upper side structural figure and the lower side distribution figure in FIG. 26, the corresponding positions in the Z axis direction are indicated by single dotted lines.

In this example, a hydrogen ion is implanted at the implantation position 126 from the lower surface 23 of the semiconductor substrate 10. The hydrogen chemical concentration $C_H$ may be distributed from the lower surface 23 to the region on the upper surface 21 side of the semiconductor substrate 10. That is, the hydrogen chemical concentration $C_H$ may be distributed up to the upper surface 21 side above the center of the Z axis direction of the semiconductor substrate 10.

In the semiconductor substrate 10, the net-doping concentration $D_{net}$ may have a same P-type region 19 as the bulk-acceptor concentration $N_{A0}$. The P-type region 19 may be arranged between the N-type region 120 and the upper surface 21 of the semiconductor substrate 10. The P-type region 19 in this example is in contact with the upper end of the N-type region 120. Also, the P-type region 19 may be in contact with the lower end of the accumulation region 16, or the lower end of the base region 14. The hydrogen chemical concentration $C_H$ on the lower surface 23 side below the P-type region 19 may be greater than the bulk-acceptor concentration $N_{A0}$. The hydrogen chemical concentration $C_H$ on the lower surface 23 side below the P-type region 19 may be 50% or more of the hydrogen chemical concentration $C_H$ at the implantation position 126. The implantation position 126 is arranged on the lower surface 23 side below the P-type region 19.

At the implantation position 126, the hydrogen chemical concentration $C_H$ has a peak 139. The peak 139 may be in contact with the P-type region 19. The peak 139 being in contact with the P-type region 19 refers to that the lower end of the P-type region 19 is arranged in the depth range where the hydrogen chemical concentration $C_H$ goes from the vertex of the peak 139 to the bulk-acceptor concentration $N_{A0}$. Also, the hydrogen chemical concentration $C_H$ may have the same number of the peak 138 as the carrier concentration peak 137 in the buffer region 20. The peak 138 may be provided at the same depth position as the carrier concentration peak 137. The carrier concentration $D_{net}$ may have a carrier concentration peak 141 at the same depth position as the peak 139. If the vertex of the other peak is arranged within the full width at half maximum of one peak, the two peaks may be set to be provided at the same depth position.

The hydrogen chemical concentration $C_H$ may attenuate in the P-type region 19 toward the upper surface 21. The hydrogen chemical concentration $C_H$ may attenuate in the region above the P-type region 19 toward the upper surface 21. In the example in FIG. 26, the hydrogen chemical concentration $C_H$ attenuates in a part of the region of the accumulation region 16 toward the upper surface 21.

The lower end 45 of the gate trench portion 40 may be arranged in the P-type region 19. That is, the lower end 45 of the gate trench portion 40 may be in contact with the P-type region 19. The lower end of the dummy trench portion 30 may be arranged in the P-type region 19. The semiconductor device 100 may be in contact with the lower end 45 of the gate trench portion 40, and may have a P-type region in a higher concentration than the bulk-acceptor concentration $N_{A0}$. In this way, avalanche breakdown in the vicinity of the lower end 45 of the gate trench portion 40 can be suppressed. The P-type region may be provided at the lower end of the dummy trench portion 30.

Note that as shown by the dashed lines, the carrier concentration $D_{net}$ may have a local peak in the N-type region. The peak is a peak different from the carrier concentration peak 137 of the buffer region 20, and the carrier concentration peak 141 at the implantation position 126.

Figure 27:
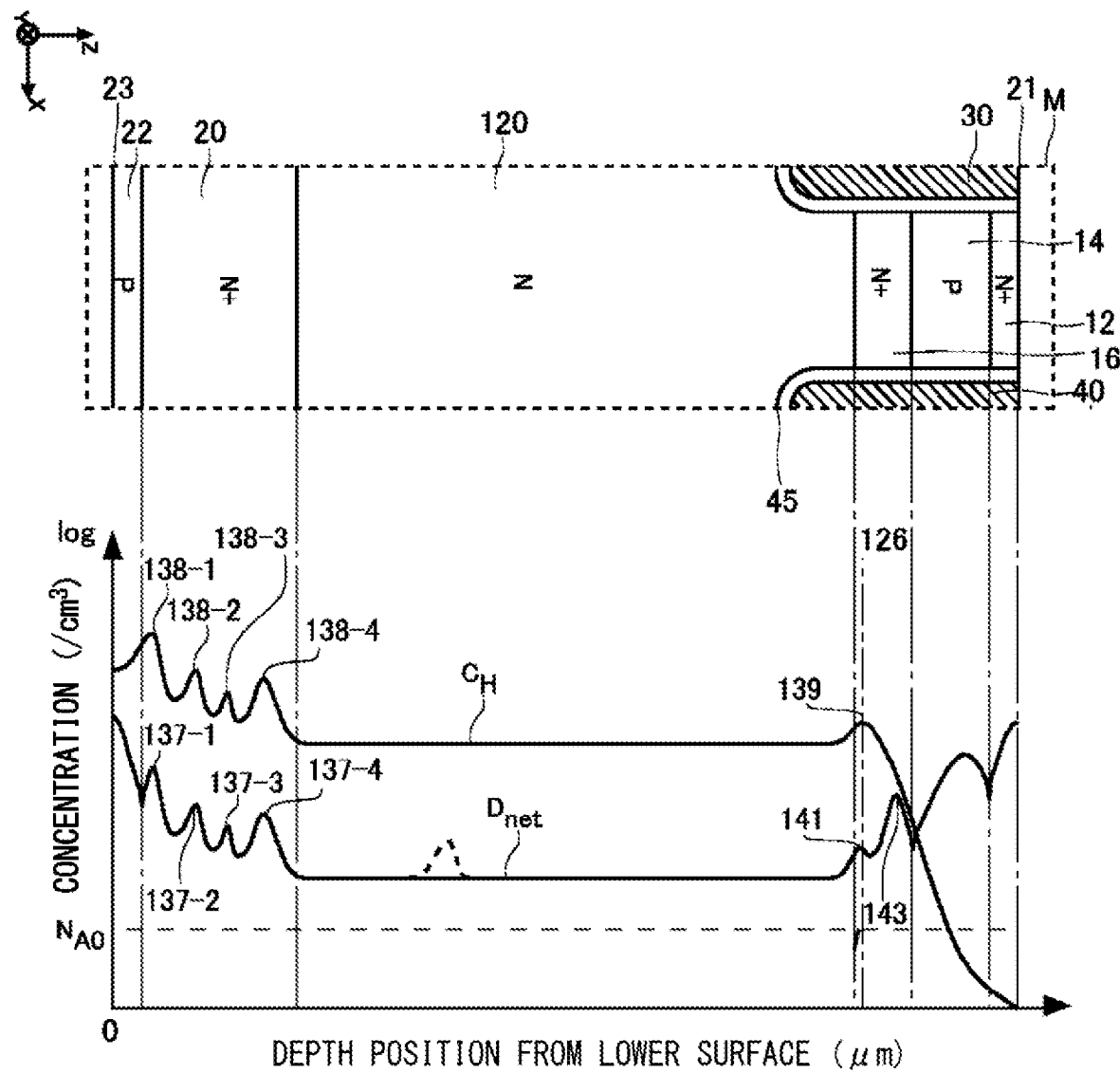
FIG. 27 illustrates another exemplary structure of the region M.

FIG. 27 illustrates another exemplary structure of the region M. This example is different from the example in FIG. 26 in the depth position of the implantation position 126. The structure and formula that are not particularly described in FIG. 27 are the same as the example in FIG. 26.

The implantation position 126 in this example is provided in accumulation region 16. The implantation position 126 may be provided in the base region 14, or may be provided in the emitter region 12. The implantation position 126 may be provided on the upper surface 21 side below the lower end 45 of the gate trench portion 40.

The hydrogen chemical concentration $C_H$ may be distributed from the lower surface 23 to the region on the upper surface 21 side of the semiconductor substrate 10. That is, the hydrogen chemical concentration $C_H$ may be distributed up to the upper surface 21 side above the center of the Z axis direction of the semiconductor substrate 10. The hydrogen chemical concentration $C_H$ may be distributed up to the upper surface 21 of the semiconductor substrate 10. That is, hydrogen may be distributed throughout the semiconductor substrate 10.

In the entire region M in this example, the net-doping concentration $D_{net}$ is greater than the bulk-acceptor concentration $N_{A0}$. That is, the region M in this example has no P-type region 19. At the implantation position 126, the hydrogen chemical concentration $C_H$ has a peak 139. The peak 139 in this example is arranged in the accumulation region 16. The peak 139 may be arranged in the base region 14, or may be arranged in the emitter region 12. The carrier concentration $D_{net}$ may have a carrier concentration peak 141 at the same depth position as the peak 139.

The carrier concentration $D_{net}$ may have at least one carrier concentration peak 143 formed by implanting phosphorus in the accumulation region 16. That is, the accumulation region 16 may have at least one carrier concentration peak 143 formed of phosphorus, and a carrier concentration peak 141 formed of hydrogen donor. The carrier concentration peak 141 may be arranged below the carrier concentration peak 143.

The hydrogen chemical concentration $C_H$ attenuates toward the upper surface 21 on the upper surface 21 side above the implantation position 126. The hydrogen chemical concentration $C_H$ may attenuate toward the upper surface 21 in at least a part of the region of the accumulation region 16. The hydrogen chemical concentration $C_H$ may attenuate toward the upper surface 21 in at least a part of the region of the base region 14. The hydrogen chemical concentration $C_H$ may attenuate toward the upper surface 21 in at least a part of the region of the emitter region 12.

The lower end 45 of the gate trench portion 40 may be arranged in the N-type region 120. That is, the lower end 45 of the gate trench portion 40 may be in contact with the N-type region 120. The lower end of the dummy trench portion 30 may be arranged in the N-type region 120.

Figure 28:
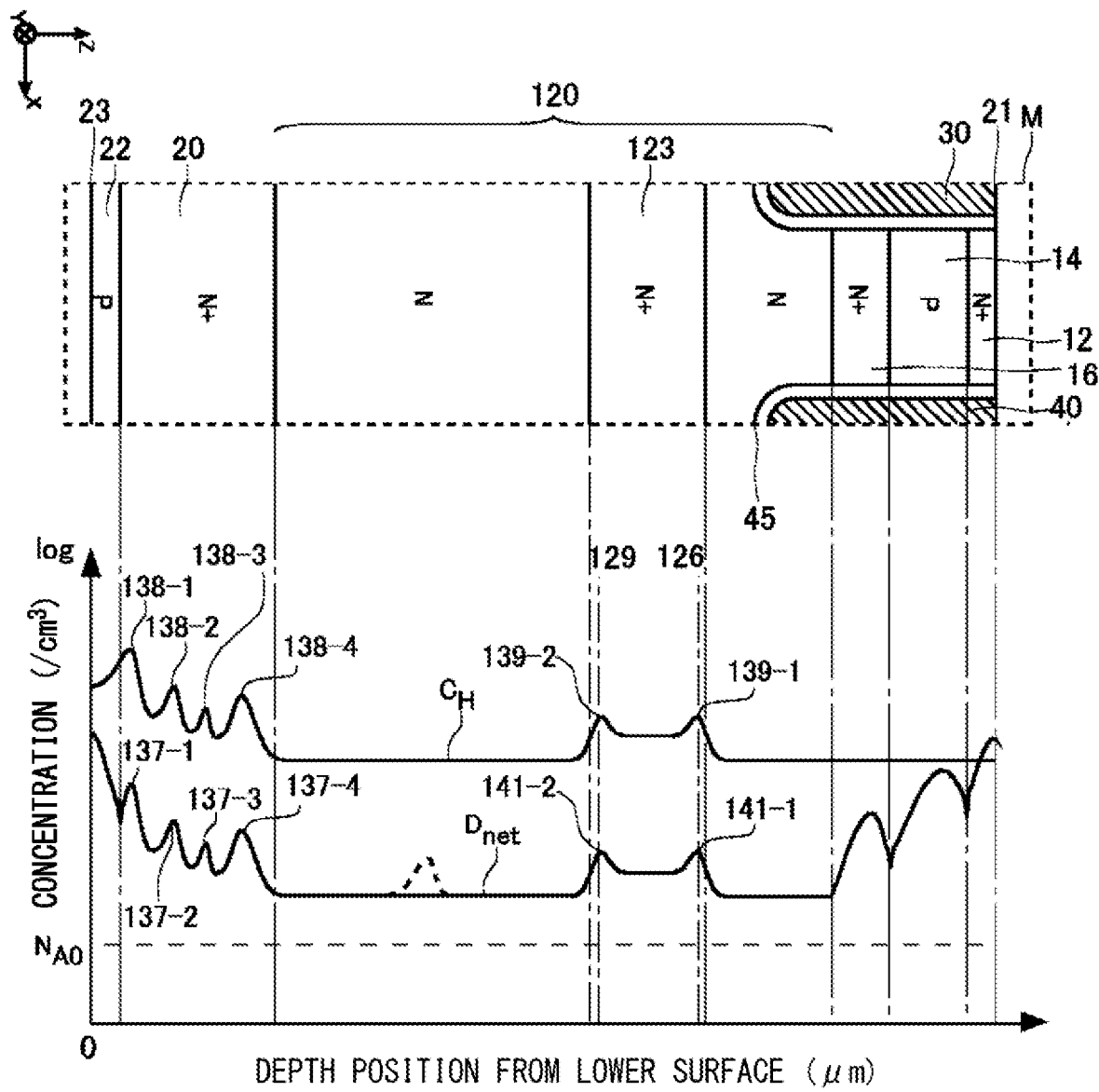
FIG. 28 illustrates another exemplary structure of the region M.

FIG. 28 illustrates another exemplary structure of the region M. This example is different from the example in FIG. 26 or FIG. 27 in a point of implanting a hydrogen ion at the implantation position 129 from the upper surface 21 of the semiconductor substrate 10. The structure and formula that are not particularly described in FIG. 28 are the same as the example in FIG. 26 or FIG. 27.

The implantation position 129 is arranged on the lower surface 23 side below the implantation position 126. The distance in the Z axis direction of the implantation position 129 and the implantation position 126 may be ¼ or less, or may be ¹⁄₁₀ or less of the thickness of the semiconductor substrate 10. The implantation position 126 and the implantation position 129 in this example are arranged between the upper end of the buffer region 20 and the lower end 45 of the gate trench portion 40.

In this example, since the implantation position 129 from the upper surface 21 is arranged below the implantation position 126 from the lower surface 23, hydrogen is distributed throughout the semiconductor substrate 10. Also, the pass-through region of a hydrogen ion implanted from the upper surface 21 and the pass-through region of a hydrogen ion implanted from the lower surface 23 are overlapped between the implantation position 126 and the implantation position 129. Therefore, the hydrogen chemical concentration $C_H$ between the implantation position 126 and the implantation position 129 may be higher than the hydrogen chemical concentration $C_H$ of the region on the upper surface 21 side above the implantation position 126 and on the lower surface 23 side below the implantation position 129.

In the entire region M in this example, the net-doping concentration $D_{net}$ is greater than the bulk-acceptor concentration $N_{A0}$. That is, the region M in this example has no P-type region 19. The hydrogen chemical concentration $C_H$ has a peak 139-1 at the implantation position 126, and has a peak 139-2 at the implantation position 129. The carrier concentration $D_{net}$ may have a carrier concentration peak 141-1 at the same depth position as the peak 139-1, and may have a carrier concentration peak 141-2 at the same depth position as the peak 139-2.

In this example, in a region other than the region where a dopant has been locally implanted (for example, an emitter region 12, a base region 14, a contact region 15, an accumulation region 16, a well region 11, a buffer region 20, a collector region 22, a cathode region 82, a guard ring 92 and a channel stopper 174), an N-type region 120 is formed.

Among the N-type region 120, a high concentration region 123 may be provided, which has a higher concentration than the N-type region 120 below the carrier concentration peak 141-2 and the N-type region 120 above the carrier concentration peak 141-1, in a region between the carrier concentration peak 141-1 and the carrier concentration peak 141-2.

In this example, the hydrogen chemical concentration $C_H$ and the net-doping concentration $D_{net}$ respectively have two peaks in the N-type region 120. In another example, the hydrogen chemical concentration $C_H$ and the net-doping concentration $D_{net}$ may also respectively have one peak in the N-type region 120. For example, when the implantation position 126 and the implantation position 129 are coincident or close to each other, the peak 139-1 and the peak 139-2 are overlapped, and one peak may be formed. Similarly, the carrier concentration peak 141-1 and the carrier concentration peak 141-2 are overlapped, and one peak may be formed. Also, at least one of the hydrogen chemical concentration $C_H$ and the net-doping concentration $D_{net}$ may have 3 or more peaks.

The lower end 45 of the gate trench portion 40 may be arranged above the implantation position 126. The lower end 45 of the gate trench portion 40 in this example is arranged in the N-type region 120. That is, the lower end 45 of the gate trench portion 40 is in contact with the N-type region 120. The lower end of the dummy trench portion 30 may be arranged in the N-type region 120.

According to the semiconductor device 100 described in FIG. 1 to FIG. 28, since an N-type semiconductor substrate 10 is generated from the P-type substrate 110, the manufacturing cost can be reduced. For example, a semiconductor device 100 can be manufactured by using a large diameter wafer with a diameter of 300 mm or more, which is used for an integrated circuit. Also, the manufacturing method of the semiconductor ingot may be any of the float zone (FZ) method, the Czochralski (CZ) method, the magnetic field applied Chokralski (MCZ) method or other methods.

While the embodiments of the present invention have been described, the technical scope of the invention is not limited to the above described embodiments. It is apparent to persons skilled in the art that various alterations or improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate; 11: well region; 12: emitter region; 14: base region; 15: contact region; 16: accumulation region; 18: drift region; 19: P-type region; 20: buffer region; 21: upper surface; 22: collector region; 23: lower surface; 24: collector electrode; 25: lower surface; 29: linear portion; 30: dummy trench portion; 31: edge portion; 32: dummy insulating film; 34: dummy conductive portion; 38: interlayer dielectric film; 39: linear portion; 40: gate trench portion; 41: edge portion; 42: gate insulating film; 44: gate conductive portion; 50: gate metal layer; 52: emitter electrode; 54: contact hole; 60, 61: mesa portion; 70: transistor portion; 80: diode portion; 81: extension region; 82: cathode region; 90: edge termination structure portion; 92: guard ring; 94: field plate; 100: semiconductor device; 102: edge side; 103: side wall; 110: P-type substrate; 112: gate pad; 111, 113: upper limit; 114, 116: lower limit; 120: N-type region; 122: center position; 123: high concentration region; 125, 126: implantation position; 127: implantation position; 128: pass-through region; 129: implantation position; 130: outer circumferential gate runner; 131: active region side gate runner; 137, 141, 143: carrier concentration peak; 138, 139: peak; 140: upper surface structure; 142: lower surface structure; 144: depth position; 160: active portion; 174: channel stopper; 176: termination region; 191: implantation position; 214: linear approximation distribution; 216: belt-shaped range; 301, 302: curve.

What is claimed is:

1. A semiconductor device, comprising:
a semiconductor substrate having an upper surface, a lower surface, and a center position equidistant from the upper surface and the lower surface in a depth direction of the semiconductor substrate, wherein
one or more N-type regions with an N-type conductivity are provided in the semiconductor substrate such that at least one N-type region among the one or more N-type regions includes the center position of the semiconductor substrate,
an entire portion of the semiconductor substrate includes a bulk-acceptor having a bulk-acceptor concentration,
a carrier concentration in all of the one or more N-type regions is higher than the bulk-acceptor concentration,
the semiconductor device includes a hydrogen chemical concentration peak in a distribution of a hydrogen chemical concentration, and
the carrier concentration includes a carrier concentration peak at a same position in the depth direction as the hydrogen chemical concentration peak.

2. The semiconductor device according to claim 1, wherein
the semiconductor substrate comprises:
an active region where at least one of a transistor portion and a diode portion is formed; and
an edge termination structure portion where a plurality of guard rings with P-type conductivity are formed, which are provided to enclose the active region in a top view of the semiconductor substrate, wherein
the one or more N-type regions provided between two guard rings among the plurality of guard rings include the bulk-acceptor with a concentration of 0.001 times or more, but less than 0.9 times of the carrier concentration.

3. The semiconductor device according to claim 1, wherein
the one or more N-type regions are provided in a range not in contact with a side wall of the semiconductor substrate.

4. The semiconductor device according to claim 1, wherein
in the one or more N-type regions, a ratio $N_A/N_F$ of the bulk-acceptor concentration $N_A$ to a donor concentration $N_F$ is 0.5 or less.

5. The semiconductor device according to claim 1, wherein in the one or more N-type regions, a ratio κ of an actual bulk-acceptor concentration $N_{Are}$ to a specification value $N_{A0}$ of the bulk-acceptor concentration is set as κ=$N_{Are}/N_{A0}$, a ratio θ of an actual donor concentration $N_{Fre}$ to a target value $N_{F0}$ of a final donor concentration is set as θ=$N_{Fre}/N_{F0}$, an upper limit value of the θ is set as $θ_+$, a lower limit value of the θ is set as $θ_-$, the $θ_+$ is 1.15, and the $θ_-$ is 0.85, and the ratio κ and the upper limit value $θ_+$ and the lower limit value $θ_-$ of the θ satisfy a following expression, $$(1-θ_+)/α'+1 \leq κ \leq (1-θ_-)/α'+1$$

wherein α'=$N_{A0}/N_{F0}$, $N_{F0}$ is a target value of a donor concentration of the one or more N-type regions.

6. The semiconductor device according to claim 1, wherein
the semiconductor substrate comprises:
a trench portion provided on the upper surface; and
a P-type region in contact with a lower end of the trench portion.

7. The semiconductor device according to claim 1, wherein
the one or more N-type regions comprise:
a concentration peak of a hydrogen chemical concentration; and
a region where another concentration peak of the hydrogen chemical concentration is not provided over a range of 40% or more of a thickness of the semiconductor substrate, in a direction toward the center position of the semiconductor substrate from the concentration peak.

8. The semiconductor device according to claim 1, comprising a plurality of concentration peaks of a hydrogen chemical concentration, wherein
the plurality of concentration peaks include:
a first doping peak, which is arranged on an upper surface side of the semiconductor substrate, closest to the center position of the semiconductor substrate; and
a second doping peak, which is arranged on a lower surface side of the semiconductor substrate, closest to the center position of the semiconductor substrate, wherein
a distance in the depth direction between the first doping peak and the second doping peak is 40% or more of a thickness of the semiconductor substrate.

9. The semiconductor device according to claim 1, comprising:
a concentration peak of a helium chemical concentration arranged on an upper surface side of the semiconductor substrate; and
one or more concentration peaks of a hydrogen chemical concentration arranged on a lower surface side of the semiconductor substrate rather than the concentration peak of the helium chemical concentration, wherein
a distance in the depth direction between a concentration peak, among the one or more concentration peaks of the hydrogen chemical concentration, closest to the concentration peak of the helium chemical concentration and the concentration peak of the helium chemical concentration is 40% or more of a thickness of the semiconductor substrate.

10. The semiconductor device according to claim 1, comprising:
a density peak of a vacancy-type defect arranged on an upper surface side of the semiconductor substrate, wherein
another density peak of the vacancy-type defect is not provided over a range of 40% or more of a thickness of the semiconductor substrate, in a direction toward a lower surface side of the semiconductor substrate from the density peak.

11. The semiconductor device according to claim 1, wherein
in the one or more N-type regions, a region with the carrier concentration being a constant concentration is provided over a range of 20% or more of a thickness of the semiconductor substrate.

12. The semiconductor device according to claim 1, wherein
in the one or more N-type regions, a donor concentration is distributed within a belt-shaped range with a concentration width of 17%, in a predetermined region of thickness of 30% or more of a thickness of the semiconductor substrate.

13. The semiconductor device according to claim 1, wherein
sulfur or selenium is distributed throughout the one or more N-type regions.

14. The semiconductor device according to claim 1, wherein
the bulk-acceptor concentration is 0.001 times or more of the carrier concentration at the center position of the semiconductor substrate.

15. The semiconductor device according to claim 1, wherein
the semiconductor substrate includes one or more P-type regions with a P-type conductivity, and
a carrier concentration in all of the one or more P-type regions is higher than the bulk-acceptor concentration.

16. The semiconductor device according to claim 1, wherein
a portion of the one or more N-type regions is exposed at an end face connecting the upper surface and the lower surface of the semiconductor substrate.

17. A semiconductor device, comprising:
a semiconductor substrate having an upper surface, a lower surface, and a center position equidistant from the upper surface and the lower surface in a depth direction of the semiconductor substrate, wherein
the semiconductor substrate includes a bulk-acceptor having a bulk-acceptor concentration,
the semiconductor substrate comprises:
a plurality of trench portions provided on the upper surface;
a plurality of mesa portions each provided between two adjacent trench portions among the plurality of trench portions; and
an overlapping region including (i) one mesa portion of the plurality of mesa portions and (ii) a region overlapping with the one mesa portion in the depth direction and located below the one mesa portion and to the lower surface of the semiconductor substrate, and
a donor concentration and an acceptor concentration are higher than the bulk-acceptor concentration in an entire portion of the overlapping region.

18. The semiconductor device according to claim 17, wherein a hydrogen donor is included through the overlapping region from the lower surface into the one mesa portion.

19. The semiconductor device according to claim 18, wherein
in the depth direction, a hydrogen chemical concentration of the hydrogen donor includes a peak above lower ends of the two adjacent trench portions between which the one mesa portion is provided.

20. The semiconductor device according to claim 19, wherein
in the depth direction, a carrier concentration includes a first peak at a same depth position as the peak of the hydrogen chemical concentration.

21. The semiconductor device according to claim 20, wherein
the carrier concentration includes a second peak above the first peak in the depth direction.

22. The semiconductor device according to claim 18, wherein
the semiconductor substrate includes a buffer region provided on a lower surface side of the semiconductor substrate, the buffer region including a plurality of peaks in a hydrogen chemical concentration of the hydrogen donor, and
in the depth direction, the hydrogen chemical concentration includes two peaks provided below lower ends of the two adjacent trench portions between which the one mesa portions is provided and above an upper end of the buffer region.

23. The semiconductor device according to claim 22, wherein
a distance between the two peaks in the depth direction is ¼ or less of a thickness of the semiconductor substrate.

24. The semiconductor device according to claim 22, wherein
the hydrogen chemical concentration between the two peaks is larger than the hydrogen chemical concentration between the upper end of the buffer region and the two peaks and the hydrogen chemical concentration between the lower ends of the two adjacent trench portions and the two peaks.

25. The semiconductor device according to claim 22, wherein
a carrier concentration includes two peaks at same positions as the two peaks of the hydrogen chemical concentration in the depth direction.

26. The semiconductor device according to claim 25, wherein
the carrier concentration between the two peaks is larger than the carrier concentration between the upper end of the buffer region and the two peaks and the carrier concentration between the lower ends of the two adjacent trench portions and the two peaks.

27. The semiconductor device according to claim 17, wherein the bulk-acceptor concentration is 0.001 times or more of a carrier concentration in the overlapping region.

28. The semiconductor device according to claim 17, wherein
the semiconductor substrate includes one or more P-type regions with a P-type conductivity, and
a carrier concentration in all of the one or more P-type regions is higher than the bulk-acceptor concentration.

29. A semiconductor device, comprising:
a semiconductor substrate having an upper surface, a lower surface, and a center position equidistant from the upper surface and the lower surface in a depth direction of the semiconductor substrate, wherein
one or more N-type regions with an N-type conductivity are provided in the semiconductor substrate such that at least one N-type region among the one or more N-type regions includes the center position of the semiconductor substrate,
an entire portion of the semiconductor substrate includes a bulk-acceptor having a bulk-acceptor concentration,
a carrier concentration in all of the one or more N-type regions is higher than the bulk-acceptor concentration,
the semiconductor substrate includes one or more P-type regions with a P-type conductivity, and
a carrier concentration in all of the one or more P-type regions is higher than the bulk-acceptor concentration.

* * * * *